(12) United States Patent
Warn et al.

(10) Patent No.: US 10,268,948 B2
(45) Date of Patent: Apr. 23, 2019

(54) DATA DRIVEN CLASSIFICATION AND TROUBLESHOOTING SYSTEM AND METHOD USING ASSOCIATIVE MEMORY AND A MACHINE LEARNING ALGORITHM TO IMPROVE THE ACCURACY AND PERFORMANCE OF THE ASSOCIATIVE MEMORY

(71) Applicant: The Boeing Company, Chicago, IL (US)

(72) Inventors: Brian Warn, Seattle, WA (US); Jaime A. Flores, Auburn, WA (US); Kyle M. Nakamoto, Bellevue, WA (US); Danielle C. Young, Bear, DE (US); Fredwilliam Esguerra, Aston, PA (US); William G. Arnold, Jacksonville, FL (US)

(73) Assignee: The Boeing Company, Chicago, IL (US)

( * ) Notice: Subject to any disclaimer, the term of this patent is extended or adjusted under 35 U.S.C. 154(b) by 904 days.

(21) Appl. No.: 14/807,877

(22) Filed: Jul. 23, 2015

(65) Prior Publication Data
US 2017/0024662 A1 Jan. 26, 2017

(51) Int. Cl.
*G06N 3/04* (2006.01)
*G11C 15/00* (2006.01)
*G06F 12/0802* (2016.01)

(52) U.S. Cl.
CPC ....... *G06N 3/0445* (2013.01); *G06F 12/0802* (2013.01); *G06F 2207/4804* (2013.01); *G11C 15/00* (2013.01)

(58) Field of Classification Search
None
See application file for complete search history.

(56) References Cited

U.S. PATENT DOCUMENTS 5,131,055 A * 7/1992 Chao ................. G06K 9/745
359/107
5,253,328 A * 10/1993 Hartman ............. G06F 11/1064
365/49.1

(Continued)

FOREIGN PATENT DOCUMENTS

JP 2016157496 A * 9/2016

*Primary Examiner* — Li B. Zhen
*Assistant Examiner* — Benjamin J Buss

(57) ABSTRACT

There is provided a computer implemented data driven classification and troubleshooting system and method. The system has an interface application enabled to receive data. The system has an associative memory software in communication with the interface application via an API. The associative memory software has an associative memory and a machine learning algorithm. The system has one or more individual areas, within the associative memory, requiring one or more troubleshooting actions to improve accuracy of the individual areas. The system has at least one troubleshooting tool enabled by the interface application. The at least one troubleshooting tool enables or performs the troubleshooting actions. The system has a quality rating metric (QRM) that measures a strength and an assurance that one or more predictions of the associative memory are correct. The one or more troubleshooting actions results in improving the accuracy and the performance of the associative memory.

31 Claims, 12 Drawing Sheets

(56) References Cited

U.S. PATENT DOCUMENTS

| | | | | |
|---|---|---|---|---|
| 5,257,389 | A * | 10/1993 | Liu | G06K 9/6202 345/418 |
| 5,305,389 | A * | 4/1994 | Palmer | G06F 12/0862 382/100 |
| 5,848,074 | A * | 12/1998 | Maeno | G01R 31/31854 714/720 |
| 6,219,748 | B1 * | 4/2001 | Srinivasan | G11C 15/00 365/49.17 |
| 6,618,281 | B1 * | 9/2003 | Gordon | G06F 11/1064 365/189.07 |
| 6,904,408 | B1 * | 6/2005 | McCarthy | A61B 5/6815 705/2 |
| 7,254,753 | B2 * | 8/2007 | Loughmiller | G11C 15/04 714/703 |
| 7,561,972 | B1 * | 7/2009 | Welch | C12N 15/67 435/15 |
| 7,804,455 | B2 * | 9/2010 | Lee | H01Q 1/2216 340/572.7 |
| 7,840,455 | B1 * | 11/2010 | Venkatasubramanian | G06Q 40/12 705/30 |
| 8,352,488 | B2 | 1/2013 | Fleming et al. | |
| 8,527,695 | B2 | 9/2013 | Nakamoto et al. | |
| 8,838,490 | B2 | 9/2014 | Quadracci et al. | |
| 8,843,347 | B2 | 9/2014 | Safa-Bakhsh et al. | |
| 8,886,657 | B2 | 11/2014 | Warn | |
| 8,909,609 | B2 | 12/2014 | Fleming et al. | |
| 8,935,282 | B2 | 1/2015 | Whelan et al. | |
| 2002/0032689 | A1 * | 3/2002 | Abbott, III | G06F 17/30017 |
| 2003/0028705 | A1 * | 2/2003 | Arima | G06N 3/02 711/100 |
| 2004/0193789 | A1 * | 9/2004 | Rudolf | G06K 9/6247 711/108 |
| 2006/0080498 | A1 * | 4/2006 | Shoham | G06F 11/1064 711/108 |
| 2007/0055679 | A1 * | 3/2007 | Yoshida | G06F 17/2247 |
| 2008/0140991 | A1 * | 6/2008 | Pandya | G06F 17/30979 712/37 |
| 2009/0083207 | A1 * | 3/2009 | Aparicio, IV | G06N 3/0445 706/46 |
| 2010/0205212 | A1 * | 8/2010 | Quadracci | G06F 17/30539 707/776 |
| 2010/0287124 | A1 * | 11/2010 | Nugent | G06N 3/063 706/12 |
| 2010/0306145 | A1 * | 12/2010 | Knoblauch | G06N 3/08 706/27 |
| 2010/0312735 | A1 * | 12/2010 | Knoblauch | G06N 3/0445 706/25 |
| 2012/0143742 | A1 * | 6/2012 | Doherty | G06Q 40/04 705/37 |
| 2013/0212042 | A1 * | 8/2013 | Rosenberg | G06Q 40/06 705/36 R |
| 2015/0294217 | A1 * | 10/2015 | Aparicio, IV | G06N 3/049 706/26 |

* cited by examiner

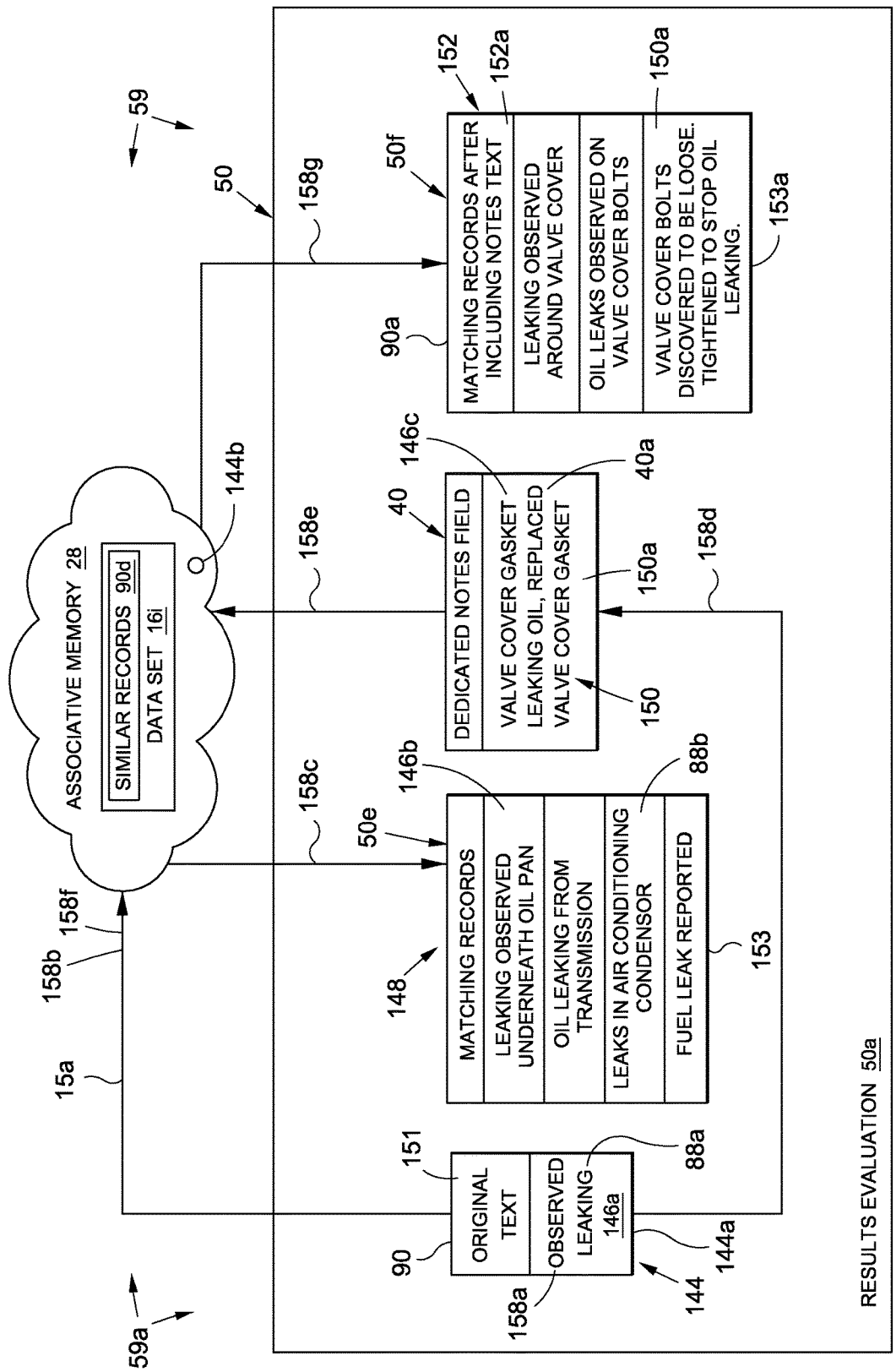

DATA DRIVEN CLASSIFICATION AND TROUBLESHOOTING SYSTEM AND METHOD USING ASSOCIATIVE MEMORY AND A MACHINE LEARNING ALGORITHM TO IMPROVE THE ACCURACY AND PERFORMANCE OF THE ASSOCIATIVE MEMORY

BACKGROUND

1) Field of the Disclosure

The disclosure relates generally to machine learning data classification systems and methods, and more particularly, to a computer implemented data driven classification system and method having systems and methods for troubleshooting an associative memory.

2) Description of Related Art

Data driven classification or management systems, such as machine learning systems, may use associative memory systems or approaches using artificial intelligence, neural networks, fuzzy logic, and/or other suitable technologies capable of forming associations between pieces of data and then retrieving different pieces of data based on the associations. The different pieces of data in the associative memory may come from various data sources.

Associative memory systems or approaches used in data driven classification and data management systems may be used to manipulate data for use in downstream systems to provide information that may be used in making technical data or industry decisions. The accuracy and performance of the associative memory are important for providing better, more accurate data results to such downstream systems. To address accuracy and performance related problems that occur within the associative memory, or to simply improve accuracy and performance of the associative memory, it is desirable to have efficient, reliable, and low cost troubleshooting systems and methods to effectively identify, evaluate and/or correct such accuracy and performance related problems within the associative memory, and to improve the accuracy and performance of the associative memory.

Text based data sets, such as records, stored within an associative memory system of a data driven classification or management system may require additional data-related work by analysts, or other system-support personnel, to address underlying accuracy-related problems. Identifying such text based data sets requiring accuracy-related attention that are stored among the large amount of data contained in the associative memory system may be challenging.

Known associative memory troubleshooting systems and methods to identify text based data sets or records within an associative memory exist. Such known troubleshooting systems and methods may employ combinations of statistical methods, keyword-based groupings, and intensive manual analysis of individual records. However, such known troubleshooting systems and methods may require many hours of labor to perform, which may result in increased labor costs and increased work time. In addition, identifying records of below-threshold accuracy using such known troubleshooting systems and methods may require an extensive amount of effort from teams of analysts, which may also result in increased labor costs.

Thus, it would be advantageous to have an efficient and low cost data driven classification and troubleshooting system and method that provide useful insight to enable and guide analysts, or other system-support personnel, to easily and quickly identify specific areas within the associative memory system of text based data sets, such as records, requiring accuracy-related attention, in order to improve the accuracy of such text based data sets, and in turn, to improve the accuracy of the associative memory system.

Similarly, individual classifications stored within an associative memory system of a data driven classification or management system may require additional work by analysts, or other system-support personnel, to address underlying accuracy-related problems. Identifying such individual classifications requiring accuracy-related attention that are stored among the large number of classifications contained in the associative memory system may prove challenging.

Known associative memory troubleshooting systems and methods to identify classifications within an associative memory exist. Such known troubleshooting systems and methods may include reporting of overall classification error rates. However, such reporting of overall classification error rates may not be useful for identifying individual classifications within the associative memory. Moreover, known troubleshooting systems and methods may employ combinations of statistical methods, keyword-based groupings, and intensive manual analysis of individual records. However, such known troubleshooting systems and methods may require many hours of labor to perform, which may result in increased labor costs and increased work time.

Thus, it would be advantageous to have an efficient and low cost data driven classification and troubleshooting system and method that does not simply report overall classification error rates, and that provide useful insight to enable and guide analysts, or other system-support personnel, to easily and quickly identify individual classifications within the associative memory system requiring accuracy-related attention, in order to improve the accuracy of such individual classifications, and in turn, to improve the accuracy of the associative memory system.

Moreover, there may be a challenge of knowing where in the associative memory system to look to repair or remedy problems that contribute to an underperforming data driven classification or management system and an underperforming associative memory, where the associative memory system is used as a data source to the underperforming system. Typically, analysts, or other system-support personnel, may only be able to observe that individual results are not producing good similarity matches, but may not be able to get a system-level view of the associative memory system to pinpoint root causes for poor matches or mismatches. In addition, because the associative memory system is used as the only data source, no method exists to directly query with common computer programming languages, such as standard SQL (Structured Query Language), that may be used if a relational database was the only data source.

Analysts, or other system-support personnel, that use an associative memory system may gain some level of insight into an underperforming memory by examining individual records. From a given individual record, the associative memory system may present other results in descending order of similarity relevance. The analyst, or other system-support personnel, must look at those results and then determine which associative memory categories and values are producing good similarity matches and which are producing bad matches. The process may be a labor-intensive one and may not provide an adequate way to obtain a global view of contributions by all categories and values across the associative memory system.

Thus, it would be advantageous to have a quick and efficient data driven classification and troubleshooting system and method that provide a system-level view of the associative memory system to pinpoint root causes for poor matches or mismatches of data, and that provide a means for data from the associative memory system to be queried by common computer programming languages, such as standard SQL (Structured Query Language).

Further, an associative memory system of a data driven classification or management system may contain a previously created domain vocabulary consisting of canonical designations and their corresponding variants that are specific to a domain (i.e., given sphere of knowledge or activity) and that have been generated from free text data or other data sources. Such free text data may need to be "cleaned" and/or normalized into a domain vocabulary that enables downstream systems that utilize free text data to generate more effective results.

Adequately capturing the domain vocabulary greatly improves the ability of associative memory queries to find all respective groupings of similar records that exist across the entire associative memory data set. An optimized domain vocabulary that maximizes such query ability of the associative memory system is desirable.

Thus, it would be advantageous to have a data driven classification and troubleshooting system and method that identify how well a domain vocabulary matches across an associative memory's data set, in order to assess whether the domain vocabulary needs improvement or optimization.

In addition, an associative memory system of a data driven classification or management system may have source records that are missing key information. An associative memory system generates results based upon the amount of detail present in a source record. If a source record is sparse, in that minimal information is present to utilize for comparison against other records in a data set, then results returned by the associative memory system may not be well correlated. The more information the source record has, the better correlated will be the results returned by the associative memory system.

Thus, it would be advantageous to have a data driven classification and troubleshooting system and method that provide additional or clarifying information to a sparse source record to enable the associative memory system to produce relevant and highly-correlated similarity matches from the rest of the records in a data set.

Further, an associative memory system of a data driven classification or management system may typically use predictive models to provide predicted information regarding future behavior or outcomes. The predicted information is only as effective as its quality and correctness. A quality rating metric may be calculated to measure the accuracy of a given prediction.

Known associative memory troubleshooting systems and methods exist for computing a quality rating metric. One such known system and method for computing a quality rating metric includes an associative memory system using a nearest neighbor algorithm that only uses the proportion of similar or nearest neighbors as the quality rating metric. However, such known system and method for computing the quality rating metric does not measure the absolute similarity between the object to be categorized and the similar or nearest neighbors. This may be inaccurate because it does not take into consideration how similar the object to be categorized is to its similar or nearest neighbors.

Thus, it would be advantageous to have a data driven classification and troubleshooting system and method that provide an associative memory system using a nearest neighbor algorithm that calculates a quality rating metric based on an absolute similarity between an object to be categorized and its proportion of nearest neighbors.

Accordingly, there is a need in the art for a data driven classification and troubleshooting system and method that have improved accuracy and performance, are reliable and efficient, and that provide advantages over known systems and methods.

SUMMARY

Example implementations of this disclosure provide a data driven classification and troubleshooting system and method that have improved accuracy and performance, and are reliable and efficient. As discussed in the below detailed description, embodiments of the data driven classification and troubleshooting system and method may provide significant advantages over existing systems and methods.

In one embodiment there is provided a computer implemented data driven classification and troubleshooting system. The computer implemented data driven classification and troubleshooting system comprises an interface application enabled to receive data. The computer implemented data driven classification and troubleshooting system further comprises an associative memory software in communication with the interface application, via an application programming interface (API). The associative memory software comprises an associative memory and a machine learning algorithm.

The computer implemented data driven classification and troubleshooting system further comprises one or more individual areas, within the associative memory, requiring one or more troubleshooting actions to improve accuracy of the one or more individual areas. The computer implemented data driven classification and troubleshooting system further comprises at least one troubleshooting tool enabled by the interface application and in communication with the associative memory, via the application programming interface (API). The at least one troubleshooting tool enables or performs the one or more troubleshooting actions.

The computer implemented data driven classification and troubleshooting system further comprises a quality rating metric that measures a strength and an assurance that one or more predictions of the associative memory are correct. The one or more troubleshooting actions enabled or performed by the at least one troubleshooting tool on the one or more individual areas results in improving the accuracy and performance of the associative memory.

In another embodiment there is provided a computer implemented data driven classification and troubleshooting system. The computer implemented data driven classification and troubleshooting system comprises a computer system having one or more computers coupled to and enabling operation of an interface application and an associative memory software in communication with the interface application, via an application programming interface (API). The interface application is enabled to receive data, and the associative memory software comprises an associative memory and a machine learning algorithm.

The computer implemented data driven classification and troubleshooting system further comprises one or more individual areas within the associative memory, requiring one or more troubleshooting actions to improve the accuracy of the one or more individual areas. The computer implemented data driven classification and troubleshooting system further comprises a quality rating metric that measures a strength and an assurance that one or more predictions of the associative memory are correct. The quality rating metric is equal to a neighbor proportion multiplied by an absolute similarity between an object to be classified and its nearest neighbors, and is computed with a quality rating metric computation using a nearest neighbor algorithm to make a data driven classification categorization.

The computer implemented data driven classification and troubleshooting system further comprises a plurality of troubleshooting tools each enabled by the interface application and in communication with the associative memory, via the application programming interface (API). The plurality of troubleshooting tools enable or perform the one or more troubleshooting actions. The plurality of troubleshooting tools comprise a rating and similarity based troubleshooting tool configured to report the one or more individual areas as a records report having a records breakdown by one or more QRM (quality rating metric) range values each having a corresponding accuracy percentage (%) and a corresponding record count, configured to identify the one or more QRM range values including QRM range values corresponding to a below-threshold accuracy percentage (%), configured to identify one or more QRM range values to troubleshoot, and configured to provide through use of the associative memory an ability to recognize similar records to bulk edit collections of the similar records.

The plurality of troubleshooting tools further comprise a classification mismatch troubleshooting tool configured to report the one or more individual areas as a records report having a records breakdown demarcated by high error counts in the individual classifications, comparing an entered classification to the associative memory generated classification, by values and quantity of corresponding record counts, configured to identify how many system records fall into a classification comparison grouping, and configured to provide an ability to target combinations of mismatches between the entered classification and the associative memory generated classification.

The plurality of troubleshooting tools further comprise a category based troubleshooting tool configured to report the one or more individual areas as a notional data set, configured to generate one or more buckets of data from the notional data set, and configured to make the one or more buckets of data available in a database configured to be queried by standard SQL (Structured Query Language) queries.

The plurality of troubleshooting tools further comprise a domain vocabulary troubleshooting tool configured to enable viewing of associative memories in an associative memory cluster, configured to report referenced source records in a records breakdown, configured to identify additional relevant source code texts, configured to expand the domain vocabulary, and configured to enable an enhanced clustering of associative memories based on the additional relevant source code texts.

The plurality of troubleshooting tools further comprise a knowledge sharing and disambiguation tool configured to report a records report of highly-correlated results based on an enhanced source record comprising a sparse source record with original text enhanced with a notes text of additional information or clarifying information added to a dedicated notes field in a record.

In another embodiment there is provided a method for improving accuracy and performance of an associative memory. The method comprises the step of providing a computer implemented data driven classification and troubleshooting system. The computer implemented data driven classification and troubleshooting system comprises an interface application in communication with an associative memory software, via an application programming interface (API), operating on one or more computers. The associative memory software has an associative memory and a machine learning algorithm.

The method further comprises the step of using at least one troubleshooting tool to identify one or more individual areas within the associative memory requiring one or more troubleshooting actions, to improve accuracy of the one or more individual areas. The at least one troubleshooting tool is enabled by the interface application and in communication with the associative memory, via the application programming interface.

The method further comprises the step of using the associative memory to derive information and generate results for the one or more individual areas, for use by the at least one troubleshooting tool. The method further comprises the step of using the at least one troubleshooting tool to perform the one or more troubleshooting actions on the one or more individual areas, or to enable the computer implemented data driven classification and troubleshooting system to perform the one or more troubleshooting actions on the one or more individual areas, in order to improve the accuracy and the performance of the associative memory.

The method further comprises the step of using a nearest neighbor algorithm to calculate a quality rating metric (QRM) that measures a strength and an assurance that one or more predictions of the associative memory are correct.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 7A is a diagrammatic representation of a schematic diagram showing an exemplary embodiment of a knowledge sharing and disambiguation tool and process that may be included and used in one or more embodiments of the computer implemented data driven classification and troubleshooting system of the disclosure;

The figures shown in this disclosure represent various aspects of the embodiments presented, and only differences will be discussed in detail.

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and fully convey the scope of the disclosure to those skilled in the art.

Figure 1:
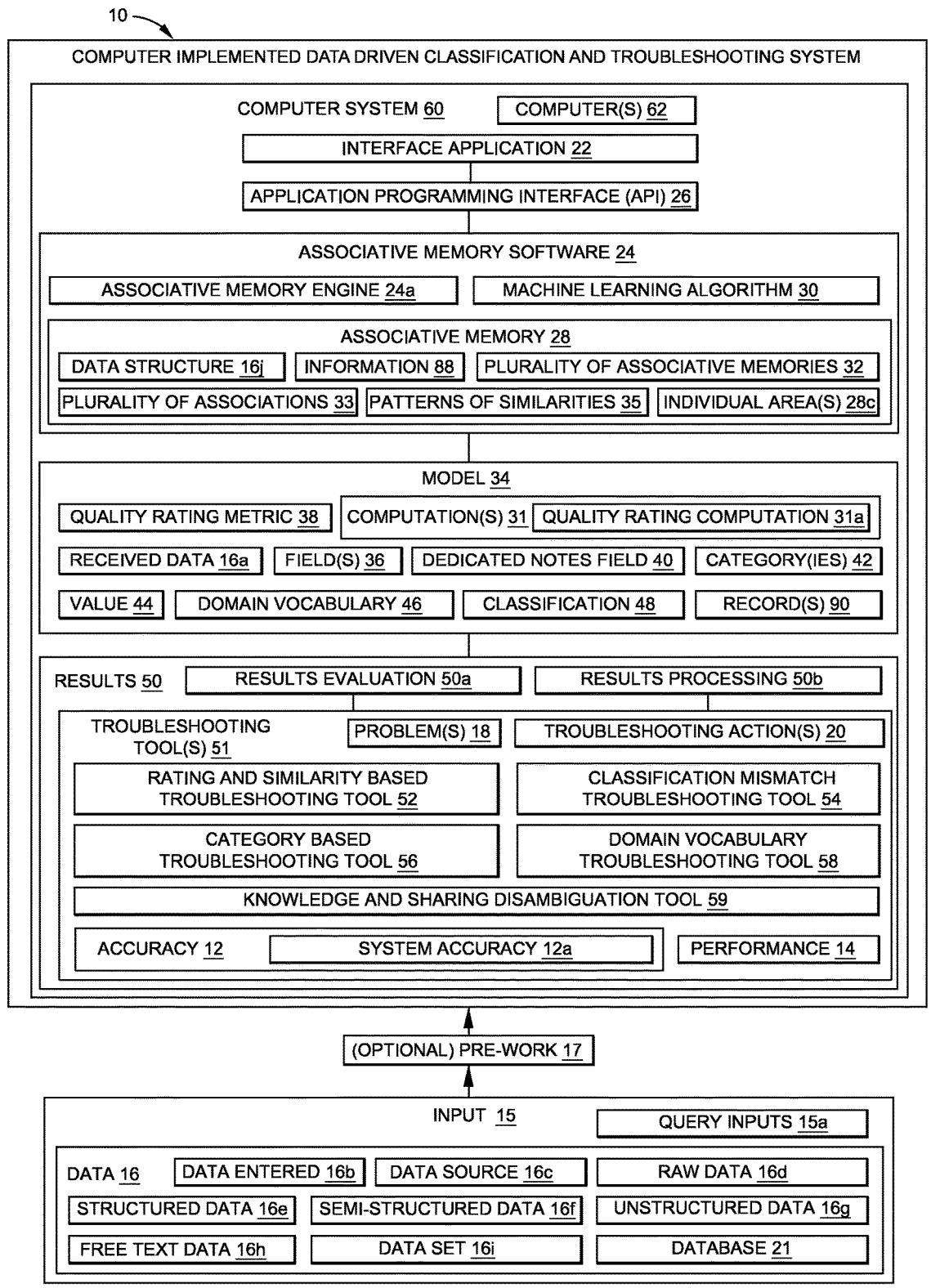
FIG. 1 is an illustration of a functional block diagram showing an exemplary embodiment of a computer implemented data driven classification and troubleshooting system of the disclosure.

Now referring to the Figures, FIG. 1 is an illustration of a functional block diagram showing an exemplary embodiment of a computer implemented data driven classification and troubleshooting system 10 of the disclosure. As shown in FIG. 1, in one embodiment there is provided the computer implemented data driven classification and troubleshooting system 10 for troubleshooting an associative memory 28 and preferably improving accuracy 12 and performance 14 of the associative memory 28 used in the computer implemented data driven classification and troubleshooting system 10. The computer implemented data driven classification and troubleshooting system 10 (see FIG. 1) has the capability of identifying one or more individual areas 28c (see FIG. 1), such as specific subject areas within the associative memory 28 (see FIG. 1), which require additional data-related work in order to improve the accuracy 12 (see FIG. 1) and performance 14 (see FIG. 1) of the associative memory 28 (see FIG. 1).

As shown in FIG. 1, data 16 (see FIG. 1) is preferably input into the computer implemented data driven classification and troubleshooting system 10, and once the data 16 is input, the data 16 is referred to herein as received data 16a or data entered 16b. The data 16 (see FIG. 1) preferably comprises input 15 (see FIG. 1), such as query inputs 15a (see FIG. 1), as received data 16a (see FIG. 1) into the computer implemented data driven classification and troubleshooting system 10 (see FIG. 1). The data 16 (see FIG. 1) may be input manually by a user or an analyst, may be input automatically by one or more separate automated systems, automated computer programs, or automated devices, or may be input via another suitable program or system. The data 16 (see FIG. 1) is preferably input manually first by the user or automatically by the one or more separate automated systems, and then analyzed by the analyst. However, the data 16 (see FIG. 1) may also be input automatically via another suitable automated program or system. The one or more separate systems may comprise a rule-based system or process, for example, an email system, or another suitable system.

The data 16 (see FIG. 1) may be obtained from a data source 16c (see FIG. 1) that provides a source of the data 16 (see FIG. 1). The data source 16c (see FIG. 1) may comprise one or more databases 21 (see FIG. 1), a computer file, a table, a spreadsheet, a report, a slide presentation, a data stream, or other suitable data sources, of primarily digitized data. The one or more databases 21 (see FIG. 1) may comprise database programs, database engines, desktop databases, server databases, standard SQL (Structured Query Language) databases, or other suitable databases or directories. Examples of databases 21 (see FIG. 1) that may be used in the computer implemented data driven classification and troubleshooting system 10 (see FIG. 1) may include a records database or a parts management database, such as an aircraft parts management database.

As shown in FIG. 1, the data 16 may comprise at least one of raw data 16d, structured data 16e, semi-structured data 16f, unstructured data 16g, free text data 16h, or another suitable type of data 16. Raw data 16d (see FIG. 1) comprises data that has not been subjected to processing or any other manipulation. Structured data 16e (see FIG. 1) comprises data 16 (see FIG. 1) that resides in a fixed field within a record or a computer file, for example, data contained in spreadsheets. Semi-structured data 16f (see FIG. 1) comprises a type of structured data 16e (see FIG. 1) where the data 16 (see FIG. 1) does not have a rigid structure, for example, with semi-structured data 16f (see FIG. 1), tags, or other types of markers may be used to identify certain elements within the data. Unstructured data 16g (see FIG. 1) comprises data 16 (see FIG. 1) that is not organized in a predefined manner, such as in a database 21 (see FIG. 1) or some other type of data structure, for example, documents, word processing documents, journals, books, records, images, files, audio, video, web pages, metadata, blog entries, and other data in an unstructured form, Free text data 16h (see FIG. 1) comprises alphanumeric data that is unstructured and in a free form, for example, the body of an email message.

The data 16 (see FIG. 1) is preferably collected and analyzed to create information 88 (see FIG. 1) suitable for making decisions, such as technical data decisions 182 (see FIG. 8) or industry decisions. Data 16 (see FIG. 1) may be distinguished from knowledge, which is derived from extensive amounts of experience dealing with information on a subject. The data 16 (see FIG. 1) may be collected and organized in a specific way and referred to as a data set 16i (see FIG. 1).

As shown in FIG. 1, input 15, for example, in the form of query inputs 15a, or data 16 may optionally undergo pre-work 17. In pre-work 17 (see FIG. 1), the data 16 (see FIG. 1) may be categorized, classified, investigated, or otherwise manipulated or studied. After the data 16 undergoes pre-work 17 (see FIG. 1), if pre-work 17 (see FIG. 1) is performed on the data 16 (see FIG. 1), the data 16 that has undergone pre-work 17 (see FIG. 1) may then be input into the computer implemented data driven classification and troubleshooting system 10 (see FIG. 1). Alternatively, the input 15 (see FIG. 1) of data 16 (see FIG. 1) may be input directly into the computer implemented data driven classification and troubleshooting system 10 (see FIG. 1) without undergoing pre-work 17.

As shown in FIG. 1, the computer implemented data driven classification and troubleshooting system 10 further comprises an interface application 22 enabled to receive the data 16, such as in the form of received data 16*a* or data entered 16*b*, where the interface application 22 is preferably operable via a computer system 60 having one or more computers 62. The interface application 22 (see FIG. 1) preferably comprises a computer software program or program code configured for use in the computer implemented data driven classification and troubleshooting system 10 (see FIG. 1). The interface application 22 (see FIG. 1) may comprise hardware, software instructions, one or more algorithms, or a combination thereof. When executed by a computer 62 (see FIGS. 1, 2) in a computer system 60 (see FIG. 1, 2), the interface application 22 (see FIG. 1) is configured to operably receive the input 15 (see FIG. 1) of data 16 (see FIG. 1), such as in the form of received data 16*a* (see FIG. 1) or data entered 16*b* (see FIG. 1).

The interface application 22 (see FIG. 1) may comprise one or more of a graphical user interface (GUI) that allows interaction with the computer implemented data driven classification and troubleshooting system 10 (see FIG. 1) through graphical icons and visual indicators, a menu-driven interface, a command line interface, an alphanumeric keyboard and mouse, a touch screen, a voice recognition system, or any other system for entering the input 15 (see FIG. 1) into the computer 62 (see FIG. 1) of the computer implemented data driven classification and troubleshooting system 10 (see FIG. 1).

As shown in FIG. 1, the computer implemented data driven classification and troubleshooting system 10 further comprises an associative memory software 24, and that may also be referred to as an associative memory engine 24*a*, in communication with the interface application 22, via an application programming interface (API) 26. The associative memory software 24 (see FIG. 1) may use the application programming interface (API) 26 (see FIG. 1), or another suitable interface connection, to connect to the interface application 22 (see FIG. 1). An example of the application programming interface (API) 26 (see FIG. 1) that may be used may include a JAVA application programming interface (API) computer program obtained from Oracle America, Inc. of Redwood Shores, Calif. (JAVA is a registered trademark of Oracle America, Inc. of Redwood Shores, Calif.) However, other suitable application programming interfaces may also be used.

As shown in FIG. 1, the associative memory software 24 comprises or incorporates an associative memory 28 and a machine learning algorithm 30. The associative memory 28 (see FIG. 1) is enabled to store a plurality of associative memories 32 (see FIG. 1), and identify a plurality of associations 33 (see FIG. 1), such as patterns of similarities 35 (see FIG. 1), in or across the received data 16*a* (see FIG. 1) or data entered 16*b* (see FIG. 1). The associative memory software 24 (see FIG. 1) with its associative memory 28 (see FIG. 1) is of a nonparametric type.

As used herein, "associative memory" means a collection of data 16 (see FIG. 1) organized into a data structure 16*j* (see FIG. 1), such that a plurality of associations 33 (see FIG. 1) are created based upon the underlying system configuration between one element of data 16 (see FIG. 1) and hundreds, thousands, or more other elements of data 16 (see FIG. 1) present in the data structure 16*j* (see FIG. 1), and architected to rapidly return large amounts of data 16 (see FIG. 1) for review, for example, review by a user, an analyst, one or more separate automated systems, automated computer programs, automated devices, or another suitable separate system or program. The interface application 22 (see FIG. 1) preferably resides above the associative memory 28 (see FIG. 1) enabling review and analysis of a large volume of results 50 (see FIG. 1) returned by the associative memory 28 (see FIG. 1).

The associative memory 28 (see FIG. 1) may be built using data 16 (see FIG. 1) or information 88 (see FIG. 1) stored in or from any number of data sources 16*c* (see FIG. 1) and databases 21 (see FIG. 1). In particular, the associative memory 28 (see FIG. 1) is configured to ingest the data 16 (see FIG. 1) stored in these various data sources 16*c* (see FIG. 1) and databases 21 (see FIG. 1). As used herein, the term "ingest" means an associative memory 28 (see FIG. 1) incorporating new data 16 (see FIG. 1) into existing data, i.e., received data 16*a* (see FIG. 1), present in the associative memory 28 (see FIG. 1) and then forming the plurality of associations 33 (see FIG. 1) within the newly ingested data and/or between the newly ingested data and the previously ingested data, and the term "ingest" can also include reincorporating the previously ingested data in order to form new relationships among the previously ingested data.

As shown in FIG. 1, the computer implemented data driven classification and troubleshooting system 10 further comprises one or more individual areas 28*c*, within the associative memory 28. The one or more individual areas 28*c* (see FIG. 1) preferably comprise at least one of a plurality of effects 98 (see FIG. 3) associated with a cause 99 (see FIG. 3); records 90 (see FIG. 3) with one or more QRM (quality rating metric) range values 94 (see FIG. 3), including QRM range values 94 (see FIG. 3) corresponding to a below-threshold accuracy percentage (%) 92*a* (see FIG. 3); individual classifications 48*c* (see FIG. 4) demarcated by high error counts 109 (see FIG. 4); a plurality of categories 42 (see FIGS. 5A-5B) and values 44 (see FIGS. 5A-5B) that have been previously categorized; a plurality of associative memory clusters 28*b* (see FIG. 6); a domain vocabulary 46 (see FIG. 6); a sparse source record 144*a* (see FIGS. 7A-7B), or another suitable specific or individual area 28*c* (see FIG. 1) within the associative memory 28 (see FIG. 1).

An example of an associative memory software 24 (see FIG. 1) that may be used in embodiments of the computer implemented data driven classification and troubleshooting system 10 (see FIG. 1) and method 200 (see FIG. 9) disclosed herein may include SAFFRON associative memory software program obtained from Saffron Technology, Inc. of Cary, N.C. However, any type of computer software, computer program, or program code that has processes for analyzing data and using memory models and/or associative memory to come to conclusions or results may be implemented in accordance with the illustrative embodiments.

The computer implemented data driven classification and troubleshooting system 10 (see FIG. 1) with its associative memory 28 (see FIG. 1) is an interactive, machine learning, artificial intelligence system. The artificial intelligence implemented in the associative memory 28 (see FIG. 1) of the computer implemented data driven classification and troubleshooting system 10 (see FIG. 1) may include a process having iterative development or learning, such as computational intelligence, for example, neural networks, fuzzy logic systems, and evolutionary computation systems.

As shown in FIG. 1, the computer implemented data driven classification and troubleshooting system 10 further comprises a model 34 that may be learned or trained using the associative memory software 24. The model 34 (see FIG. 1) may be configured to categorize one or more fields 36 (see FIG. 1) or values 44 (see FIG. 1) of the received data 16a (see FIG. 1) or data entered 16b (see FIG. 1), or may be configured to analyze the received data 16a (see FIG. 1) or data entered 16b (see FIG. 1). The model 34 (see FIG. 1) may further be configured to learn a category 42 (see FIG. 1) and a classification 48 (see FIG. 1) of received data 16a (see FIG. 1) or data entered 16b (see FIG. 1). The model 34 (see FIG. 1) may further be configured to analyze the received data 16a (see FIG. 1) or data entered 16b (see FIG. 1).

As shown in FIG. 1, the model 34 may further include a dedicated notes field 40, discussed in further detail below. The model 34 (see FIG. 1) may further include a domain vocabulary 46 (see FIG. 1). The computer implemented data driven classification and troubleshooting system 10 (see FIG. 1) further includes one or more record(s) 90 that may be displayed.

As shown in FIG. 1, the computer implemented data driven classification and troubleshooting system 10 further comprises a quality rating metric (QRM) 38. The quality rating metric 38 (see FIGS. 1, 8) preferably measures a strength 174a (see FIG. 8) and an assurance 174b (see FIG. 8) that one or more predictions 172 (see FIG. 8) of the associative memory 28 (see FIG. 8) are correct.

As shown in FIG. 1, the computer implemented data driven classification and troubleshooting system 10 may further comprise one or more computations 31 (see FIG. 1) for computing various methodologies or functions that may be used in the computer implemented data driven classification and troubleshooting system 10 (see FIG. 1). For example, the computations 31 (see FIG. 1) may comprise a quality rating metric (QRM) computation 31a (see FIG. 1), discussed in further detail below, for computing the quality rating metric (QRM) 38 (see FIG. 1) that may be used in the computer implemented data driven classification and troubleshooting system 10 (see FIG. 1).

As shown in FIG. 1, the computer implemented data driven classification and troubleshooting system 10 further comprises results 50 comprising results evaluation 50a and results processing 50b. As further shown in FIG. 1, the computer implemented data driven classification and troubleshooting system 10 further comprises at least one troubleshooting tool 51 enabled by the interface application 22 and in communication with the associative memory 28, via the application programming interface (API) 26. The at least one or one or more troubleshooting tools 51 (see FIG. 1) may comprise a rating and similarity based troubleshooting tool 52 (see FIG. 1), discussed in more detail below; a classification mismatch troubleshooting tool 54 (see FIG. 1), discussed in more detail below; a category based troubleshooting tool 56 (see FIG. 1), discussed in more detail below; a domain vocabulary troubleshooting tool 58 (see FIG. 1), discussed in more detail below; and a knowledge sharing and disambiguation tool 59 (see FIG. 1), discussed in more detail below.

As shown in FIG. 1, the at least one or one or more troubleshooting tools 51 are preferably configured to perform, or enable the computer implemented data driven classification and troubleshooting system 10 to perform, one or more troubleshooting actions 20 to identify, address, and/or solve one or more problems 18 relating to accuracy 12, such as system accuracy 12a, and performance 14 of the associative memory 28. For example, the one or more individual areas 28c (see FIG. 1) within the associative memory 28 (see FIG. 1) may require one or more troubleshooting action(s) 20 (see FIG. 1) to address one or more problem(s) 18 (see FIG. 1) relating to accuracy 12 (see FIG. 1) of the one or more individual area(s) 28c (see FIG. 1).

The one or more troubleshooting actions 20 (see FIG. 1) performed, or enabling the computer implemented data driven classification and troubleshooting system 10 (see FIG. 1) to be performed, by the at least one troubleshooting tool 51 (see FIG. 1) on the one or more individual areas 28c (see FIG. 1) preferably results in improving the accuracy 12 (see FIG. 1) and the performance 14 (see FIG. 1) of the associative memory 28 (see FIG. 1). The one or more troubleshooting actions 20 (see FIG. 1) may include, but are not limited to, reviewing, capturing, identifying, evaluating, analyzing, assigning, processing, sorting, rating, ranking, classifying, categorizing, comparing, signaling, correcting, revising, changing, updating, refining, clustering, batch classifying, bucketing, adding information, clarifying information, sharing knowledge, disambiguating, or another suitable troubleshooting action 20 (see FIG. 1).

Figure 3:
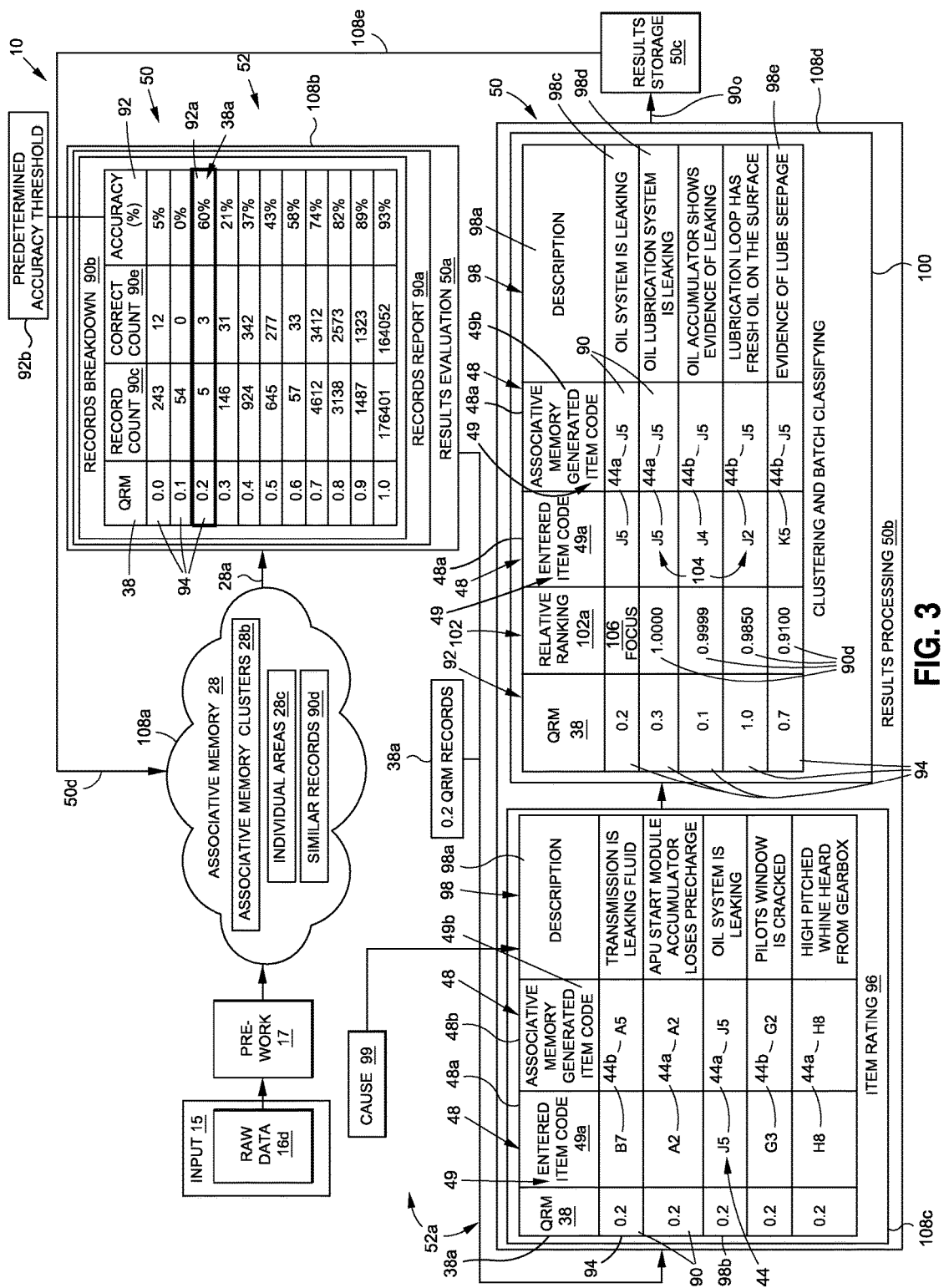
FIG. 3 is a diagrammatic representation of a schematic diagram showing an exemplary embodiment of a rating and similarity based troubleshooting tool and process that may be included and used in one or more embodiments of the computer implemented data driven classification and troubleshooting system of the disclosure.

After the results 50 (see FIG. 1) are evaluated and processed, the results 50 (see FIG. 1) may be output from the computer implemented data driven classification and troubleshooting system 10 (see FIG. 1) into a results storage 50c (see FIG. 3). The results 50 (see FIG. 1) in the results storage 50c (see FIG. 3) may be run through the associative memory 28 (see FIG. 1) again, as necessary. Data 16 (see FIG. 1) that has been refined, corrected, improved, or otherwise enhanced, may be used in one or more downstream system(s) 139 (see FIG. 5A) or other suitable systems.

Figure 2:
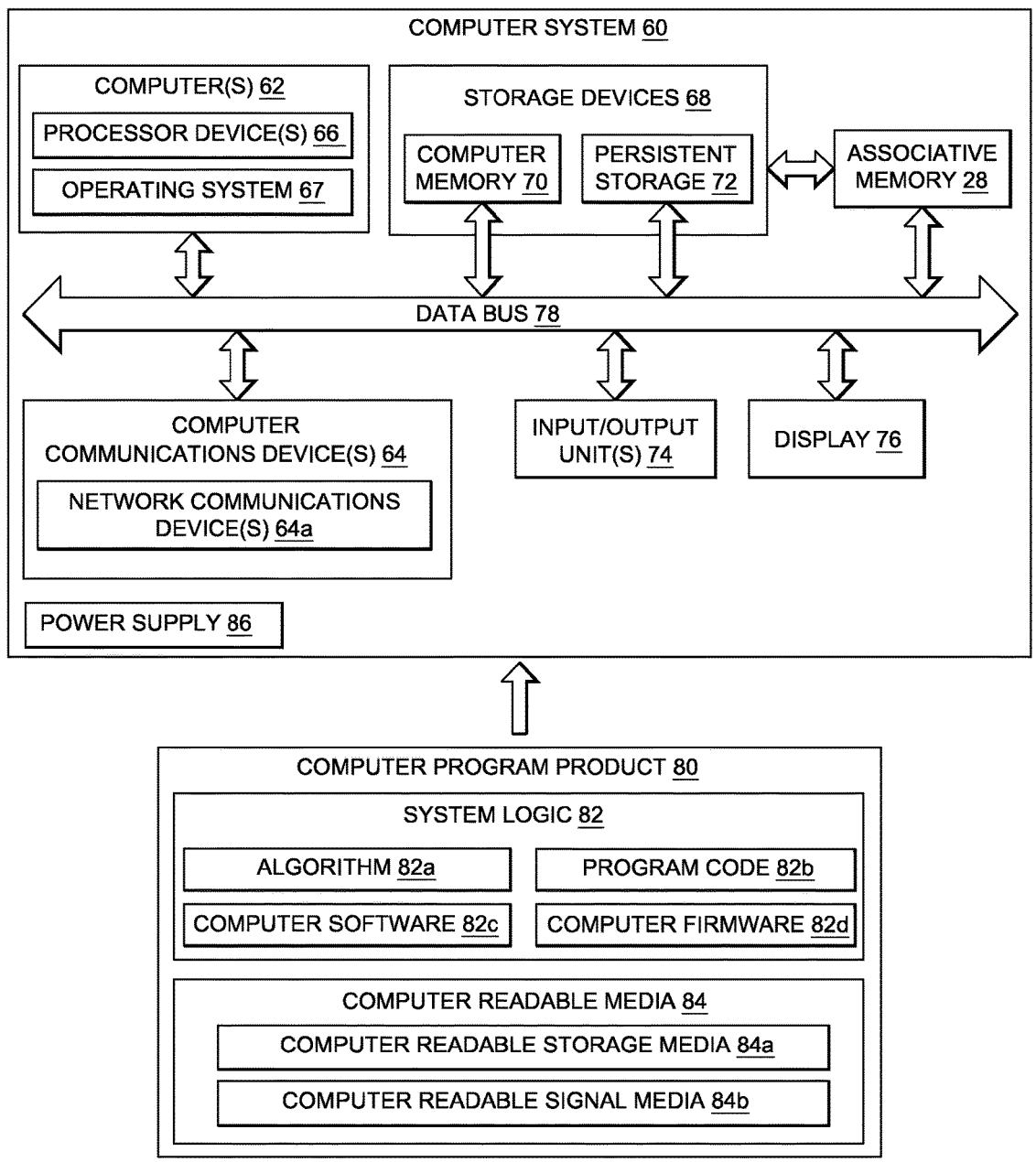
FIG. 2 is an illustration of a functional block diagram showing an exemplary embodiment of a computer system that may be included and used in one or more embodiments of the computer implemented data driven classification and troubleshooting system of the disclosure.

Referring now to FIG. 2, the computer system 60 of the computer implemented data driven classification and troubleshooting system 10 (see FIG. 1) is shown in more detail. FIG. 2 is an illustration of a functional block diagram of an exemplary embodiment of the computer system 60 that may be included and used in one or more embodiments of the computer implemented data driven classification and troubleshooting system 10 of the disclosure. As shown in FIG. 2, the computer system 60 comprises one or more computers 62, which may include one or more processor device(s) 66 and an operating system 67. The computer system 60 (see FIG. 2) may be used to implement the one or more computer(s) 62 (see FIG. 2).

The one or more computer(s) 62 (see FIG. 2) or one or more processor device(s) 66 (see FIG. 2) may be configured to control one or more functions of one or more elements of the interface application 22 (see FIG. 1) through computer program instructions, such as computer software 82c (see FIG. 2) stored on a computer memory 70 (see FIG. 2), accessible to the one or more computer(s) 62 (see FIG. 2), or one or more processor device(s) 66 (see FIG. 2).

As shown in FIG. 2, the computer system 60 may further comprise one or more computer communications device(s) 64, such as one or more networking communications device(s) 64a, for linking the computer implemented data driven classification and troubleshooting system 10 (see FIG. 1), for example, to one or more separate systems. The one or more networking communications device(s) 64a (see FIG. 2) may comprise network links between various computers and devices connected together within a network data processing system via wire connections, wireless communication links, fiber optic cables, or other suitable network connections, and that may connect to a network, a server, the Internet, or another system or device.

The one or more computer communications device(s) 64 (see FIG. 2) may be configured to provide for communications in accordance with any of a number of wired or wireless communication standards. The one or more computer(s) 62 (see FIG. 2) or one or more processor device(s) 66 (see FIG. 2) may also be configured to facilitate communications via the one or more computer communications device(s) 64 (see FIG. 2) by, for example, controlling hardware included within the one or more computer communications device(s) 64 (see FIG. 2). The one or more computer communications device(s) 64 (see FIG. 2) may include, for example, one or more antennas, a transmitter, a receiver, a transceiver and/or supporting hardware, including, for example, a processor for enabling communications.

As shown in FIG. 2, the computer system 60 further comprises storage devices 68, such as computer memory 70 and persistent storage 72. The computer memory 70 (see FIG. 2) may comprise one or more of a random access memory (RAM), including dynamic and/or static RAM, on-chip or off-chip cache memory, or other suitable computer memory 70 (see FIG. 2). The persistent storage 72 (see FIG. 2) may comprise one or more of a flash memory, a hard drive, Read-Only Memory (ROM), magnetic storage devices such as hard disks, floppy disk drives, and rewritable magnetic tape, rewritable optical disk drives and/or media, non-volatile random access memory (NVRAM), or other suitable persistent storage 72 (see FIG. 2).

As shown in FIG. 2, the computer system 60 further comprises one or more input/output unit(s) 74, a display 76, a data bus 78, and a power supply 86. The one or more input/output unit(s) 74 (see FIG. 2) provide for the input and output of data 16 (see FIG. 1) with other devices connected to the computer system 60 (see FIG. 2), such as, the computer interfaces, for example, the interface application 22 (see FIG. 1). The one or more input/output unit(s) 74 (see FIG. 2) may comprise such devices as a keyboard, a mouse, a joystick, or other input/output devices. For example, the one or more input/output unit(s) 74 (see FIG. 2) may provide a connection for user input though a keyboard and mouse, or may send output to a printer or other device.

The display 76 (see FIG. 2) provides the means to display data 16 (see FIG. 1) or information 88 (see FIG. 1) to a user, an analyst, one or more separate automated systems, automated computer programs, automated apparatuses, or automated devices, or another suitable separate system, program, or device. As shown in FIG. 2, the data bus 78 provides communications between the one or more computer(s) 62, the computer memory 70, the persistent storage 72, the one or more computer communications device(s) 64, the one or more input/output unit(s) 74, and the display 76. The power supply 86 (see FIG. 2) of the computer system 60 (see FIG. 2) may comprise batteries, electricity, or other power supply elements.

As shown in FIG. 2, a computer program product 80 is preferably used in the computer system 60. The computer program product 80 (see FIG. 2) comprises a system logic 82 (see FIG. 2). As shown in FIG. 2, the system logic 82 may comprise an algorithm 82a, a program code 82b, a computer software 82c, a computer firmware 82d, or another suitable system logic 82. As shown in FIG. 2, the computer program product 80 may comprise a computer readable medium 84. The computer readable medium 84 (see FIG. 2) may comprise a computer readable storage media 84a (see FIG. 2), a computer readable signal media 84b (see FIG. 2), or another suitable computer readable medium 84 (see FIG. 2).

The system logic 82 (see FIG. 2), such as the algorithm 82a (see FIG. 2), the program code 82b (see FIG. 2), the computer software 82c (see FIG. 2), the computer firmware 82d (see FIG. 2), or another suitable system logic 82 (see FIG. 2), may be stored in and retrieved from the computer readable storage media 84a (see FIG. 2) and loaded into the one or more computer(s) 62 (see FIG. 2), the one or more processor device(s) 66, or other programmable device, to configure and direct the one or more computer(s) 62, the one or more processor device(s) 66, or other programmable device to execute operations to be performed on or by the one or more computer(s) 62, the one or more processor device(s) 66, or other programmable device, and to function in a particular way to generate a particular apparatus or article of manufacture. Execution of the system logic 82 (see FIG. 2), such as the algorithm 82a (see FIG. 2), the program code 82b (see FIG. 2), the computer software 82c (see FIG. 2), the computer firmware 82d (see FIG. 2), or another suitable system logic 82 (see FIG. 2), may produce a computer-implemented system, process or method, such that the system logic 82 (see FIG. 2), such as the algorithm 82a (see FIG. 2), the program code 82b (see FIG. 2), the computer software 82c (see FIG. 2), the computer firmware 82d (see FIG. 2), or another suitable system logic 82 (see FIG. 2), executed by the one or more computer(s) 62 (see FIG. 2), one or more processor device(s) 66 (see FIG. 2), or other programmable device, provide operations for implementing the functions disclosed herein.

Referring now to FIG. 3, the computer implemented data driven classification and troubleshooting system 10 preferably comprises a rating and similarity based troubleshooting tool 52 and process 52a for implementing the rating and similarity based troubleshooting tool 52. FIG. 3 is a diagrammatic representation of a schematic diagram showing an exemplary embodiment of the rating and similarity based troubleshooting tool 52 and process 52a that may be included and used in one or more embodiments of the computer implemented data driven classification and troubleshooting system 10 of the disclosure.

The rating and similarity based troubleshooting tool 52 (see FIG. 3) and process 52a (see FIG. 3) have the capability to guide analysts and other system-support personnel to individual areas 28c (see FIG. 3), such as specific subject areas, within the associative memory 28 (see FIG. 3), which require additional data-related work, in order to improve the system accuracy 12a (see FIG. 1). As used herein, "system accuracy" means how close associative memory generated classifications 48b (see FIG. 3) of records 90 (see FIG. 3) in the computer implemented data driven classification and troubleshooting system 10 (see FIGS. 1, 3) are as compared to entered classifications 48a (see FIG. 3), which are correct classifications, of the records 90 (see FIGS. 1, 3) in the computer implemented data driven classification and troubleshooting system 10 (see FIGS. 1, 3).

The rating and similarity based troubleshooting tool 52 (see FIG. 3) and process 52a (see FIG. 3) may comprise a computer software program or code, or another suitable program or set of instructions. The rating and similarity based troubleshooting tool 52 (see FIG. 3) and process 52a (see FIG. 3) may also comprise other suitable computer program instructions, such as embodied in computer software 82c (see FIG. 2) stored on the computer memory 70 (see FIG. 2) and accessible to the one or more computer(s) 62 (see FIG. 2) or the one or more processor device(s) 66 (see FIG. 2). The rating and similarity based troubleshooting tool 52 (see FIG. 3) is in communication with the interface application 22 (see FIG. 1) and is coupled to the associative memory 28 (see FIG. 1) of the associative memory software 24 (see FIG. 1). The process 52a (see FIG. 3) may be an automated process, may be a manual process, or a combination thereof.

The rating and similarity based troubleshooting tool 52 (see FIG. 3) and process 52a (see FIG. 3) is coupled to the associative memory 28 (see FIG. 3) and is configured to perform using the input 15 (see FIG. 3) of raw data 16d (see FIG. 3) into the associative memory 28 (see FIG. 3). The rating and similarity based troubleshooting tool 52 (see FIG. 3) and process 52a (see FIG. 3) may be used by an analyst, a user, one or more separate automated systems, such as an automated computer program, system, device or apparatus, or may be automated via another suitable automated program or system.

As shown in FIG. 3, input 15, such as raw data 16d, that is entered may require pre-work 17 before running it through the associative memory 28. The raw data 16d (see FIG. 3) may be categorized, classified, investigated, or otherwise manipulated or studied in pre-work 17 (see FIG. 3). The associative memory 28 (see FIG. 3) includes individual areas 28c (see FIG. 3) requiring attention and additional data-related work, such as performed by an analyst, to address underlying problems 18 (see FIG. 1) relating to accuracy 12 (see FIG. 1).

The rating and similarity based troubleshooting tool 52 (see FIG. 3) and process 52a (see FIG. 3) enable the analyst or user to know where to go in the associative memory 28 (see FIG. 3) to improve the accuracy 12 (see FIG. 1) of the associative memory 28 (see FIG. 3) and the system accuracy 12a (see FIG. 1) of the computer implemented data driven classification and troubleshooting system 10 (see FIGS. 1, 3).

As shown in FIG. 3, the process 52a comprises step 108a of capturing and identifying in the associative memory 28 the individual areas 28c requiring attention and additional data-related work. The individual areas 28c (see FIG. 3) may comprise a plurality of effects 98 (see FIG. 3) associated with a cause 99 (see FIG. 3). An example of a cause 99 (see FIG. 3) may comprise a system mechanical failure, such as a jet engine oil pump malfunctioning. An example of the plurality of effects 98 (see FIG. 3) may comprise results of the system mechanical failure, such as an oil leak outside of the jet engine, a grinding sound from the jet engine, a vibration of a jet engine housing, and a non-functioning of the jet engine.

As further shown in FIG. 3, associative memory output 28a generates results 50. The results 50 (see FIG. 3) may undergo results evaluation 50a (see FIG. 3) and results processing 50b (see FIG. 3). As shown in FIG. 3, the rating and similarity based troubleshooting tool 52 and process 52a report, via displays of the interface application 22 (see FIG. 1) and/or the application programming interface (API) 26 (see FIG. 1), the individual areas 28c of the associative memory 28 requiring attention and additional data-related work in the form of a records report 90a having a records breakdown 90b by one or more QRM (quality rating metric) range values 94, each having a corresponding accuracy percentage (%) 92, a corresponding record count 90c, and a corresponding correct record count 90e.

FIG. 3 lists the QRM (quality rating metric) range values 94 ranging from 0.0 (i.e., 5% accuracy) to 1.0 (i.e., 93% accuracy), inclusive. As used herein, "accuracy percentage (%)" means a certainty assessment that the computer implemented data driven classification and troubleshooting system 10 (see FIGS. 1, 3) assigns to a classification 48 (see FIGS. 1, 3) it assigns to a given record 90 (see FIGS. 1, 3). The QRM (quality rating metric) 38 (see FIG. 3) is a metric to measure the quality of the records 90 (see FIG. 3) used by the associative memory 28 (see FIG. 3) to assign a QRM range value 44 (see FIG. 3). A high similarity of records 90 (see FIG. 3) or high amount of similar records 90d (see FIG. 3) and uniformity of "answers" may provide high QRM range values 94 (see FIG. 3), e.g., "1.0", "0.9", and the like. Low QRM range values 94 (see FIG. 3), e.g., "0.1", "0.2", and the like, may suggest the associative memory 28 (see FIG. 3) used records 90 (see FIG. 3) that were not as similar or that the associative memory 28 (see FIG. 3) had to choose amongst multiple "answers" in assigning the QRM range value(s) 94 (see FIG. 3).

As shown in FIG. 3, the process 52a further comprises step 108b of reviewing the records report 90a comprising the records breakdown 90b, identifying the record count 90c, correct record count 90e, and accuracy percentage (%) 92 for the quality rating metric (QRM) 38 having one or more QRM (quality rating metric) range values 94, and selecting a selected QRM group 38a for further investigation. In this case, as shown in FIG. 3, the selected QRM group 38a selected comprises records 90 with the QRM 38 having a QRM range value 94 of "0.2", a record count 90c of five (5) records, and a correct record count 90e of three (3) records. A predetermined accuracy threshold 92b (see FIG. 3) is preferably determined for the accuracy percentage (%) 92 (see FIG. 3). As used herein, "predetermined accuracy threshold" means a threshold below which an accuracy percentage falls, and which is determined to be unacceptable. For example, if the predetermined accuracy threshold 92b (see FIG. 3) is determined to be 70% (seventy percent), an accuracy percentage (%) 92 (see FIG. 3) of below 70% is considered a below-threshold accuracy percentage (%) 92a. As shown in FIG. 3, the accuracy percentage 92 of the selected QRM group 38a is 60% (sixty percent), which is a below-threshold accuracy percentage (%) 92a, when the predetermined accuracy threshold 92b (see FIG. 3) is 70%.

A technical data or industry model process requirement, such as used by an industry in making a technical data or industry decision, may require that the analyst or user focus attention on the below-threshold accuracy percentage (%) 92a (see FIG. 3) records 90. The rating and similarity based troubleshooting tool 52 (see FIG. 3) and process 52a (see FIG. 3) are preferably configured to identify the one or more QRM (quality rating metric) range values 94 (see FIG. 3), including QRM range values 94 (see FIG. 3) corresponding to the below-threshold accuracy percentage (%) 92a (see FIG. 3), and are configured to identify one or more QRM range values 94 (see FIG. 3) to troubleshoot.

The rating and similarity based troubleshooting tool 52 (see FIG. 3) and process 52a (see FIG. 3) further comprise an item rating 96 (see FIG. 3) in the results processing 50b (see FIG. 3). The item rating 96 (see FIG. 3) displays the five (5) records 90 of the selected QRM group 38a (see FIG. 3) having the QRM range value 94 of "0.2". The item rating 96 (see FIG. 3) further displays a classification 48 (see FIG. 3), such as an entered classification 48a (see FIG. 3), in the form of an item code 49 (see FIG. 3), such as an entered item code 49a (see FIG. 3), and further displays a plurality of effects 98 (see FIG. 3), such as in the form of a description 98a (see FIG. 3) for each record 90 (see FIG. 3).

Based on a technical data or industry model process requirement, the analyst may choose one effect 98b (see FIG. 3) for investigation. For example, as shown in FIG. 3, the third QRM range value 94 of "0.2" with an entered item code 49a having a value 44 of "J5" and a description 98a of "OIL SYSTEM IS LEAKING" is selected to be a focus record 106 for clustering and batch classifying 100. As shown in FIG. 3, the process 52a further comprises step 108c of investigating the item rating 96 within the classification 48, such as the item code 49, of the selected QRM group 38a. As shown in FIG. 3, the entered item code 49a and associative memory generated item code 49b may have matched values 44a (e.g., "A2" and "A2", "J5" and "J5", "H8" and "H8") or mismatched values 44b (e.g., "B7" and "A5", "G3" and "G2").

The rating and similarity based troubleshooting tool 52 (see FIG. 3) and process 52a (see FIG. 3) further comprise clustering and batch classifying 100 (see FIG. 3). As shown in FIG. 3, the clustering and batch classifying 100 table summarizes how the focus record 106 is compared against similar records 90d (e.g., "1.0000", "0.9999", "0.9850", "0.9100"), which may be sorted in a hierarchical relevance 102, such as in a relative ranking 102a. The relative ranking 102a (see FIG. 3) is a relative measure representing the best match for the focus record 106 (see FIG. 3) and preferably comes from the associative memory 28 (see FIG. 3). As further shown in FIG. 3, the clustering and batch classifying 100 table summarizes the entered classification 48a, such as the entered item code 49a, the associative memory generated classification 48b, such as the associative memory generated item code 49b, and the plurality of effects 98, such as description 98a. The clustering and batch classifying 100 table shown in FIG. 3 is exemplary, and for each QRM range value 94 (see FIG. 3) in the item rating 96 table that is selected, a specific and separate clustering and batch classifying 100 (see FIG. 3) table may be generated with a different selected focus record 106 (see FIG. 3) and comparisons of similar records 90d (see FIG. 3) listed below the selected focus record 106 (see FIG. 3), based on the QRM range value 94 selected.

As shown in FIG. 3, the process 52a comprises step 108d of clustering and batch classifying 100 similar records 90d in order to bulk edit collections of such similar records 90d. Step 108d (see FIG. 3) further includes identifying and capturing the relevance of each one of the plurality of effects 98 (see FIG. 3), by capturing the number of conditions 104 (see FIG. 3) that the one effect 98b (see FIG. 3) is directly associated to the cause 99 (see FIG. 3), and sorting the relevance of each one of the plurality of effects 98 (see FIG. 3) associated with the cause 99 (see FIG. 3), based on the number of conditions 104 (see FIG. 3) that the one effect 98b (see FIG. 3) is directly associated to the cause 99 (see FIG. 3) in the hierarchical relevance 102 (see FIG. 3). As shown in FIG. 3, a selected effect 98c of the focus record 106 is the first description or record 90, e.g., "OIL SYSTEM IS LEAKING", a most relevant effect 98d is the second description or record 90, e.g., "OIL LUBRICATION SYSTEM IS LEAKING", and a least relevant effect 98e is the last description or record 90, e.g., "EVIDENCE OF LUBE SEEPAGE".

Similar records 90d (see FIG. 3) are preferably used to generate the associative memory generated item code 49b (see FIG. 3) for a selected focus record 106 (see FIG. 3). A number of conditions 104 (see FIG. 3) that contribute to the associative memory generated item code 49b (see FIG. 3) for the collection of records 90 (see FIG. 3) may be noted, such as by the analyst, and may include, for example, the following conditions 104 (see FIG. 3): (1) the underlying associative memory 28 (see FIG. 3) provided in descending order a relative ranking 102a (see FIG. 3) relevance of the similar records 90d (see FIG. 3); (2) based on established technical data or industry model process requirements or rules for the types of maintenance-related problems the analyst works on, the records 90 (see FIG. 3), such as similar records 90d (see FIG. 3) of "0.2" and "0.3" should be notionally coded as a "J5" record; (3) for the focus record 106 (see FIG. 3), the entered item code 49a (see FIG. 3) and the associative memory generated item code 49b (see FIG. 3) (the latter being what the associative memory 28 (see FIG. 3) "thinks" the "OIL SYSTEM IS LEAKING" record should be) have matched values 44a (see FIG. 3) of "J5"; (4) the second record 90 (see FIG. 3), such as similar record 90d (see FIG. 3), with the "0.3" QRM range value 94 (see FIG. 3), with the "1.0000" relative ranking 102a (see FIG. 3), and with the entered item code 49a (see FIG. 3) and the associative memory generated item code 49b (see FIG. 3) having matched values 44a (see FIG. 3) of "J5", indicates the results or summary of a specific and separate clustering and batch classifying 100 table generated for the second record 90, and the associative memory generated item code 49b (see FIG. 3) for the second record 90 (see FIG. 3) shows the associative memory generated item code 49b (see FIG. 3) is "J5" because "J5" was a roll-up of similar records in the second record's 90 (see FIG. 3) specific and separate clustering and batch classifying 100 table; (5) the third through fifth records 90 (see FIG. 3), such as similar records 90d (see FIG. 3), with the respective "0.1", "1.0" and "0.7" QRM range values 94 (see FIG. 3), with the respective "0.9999", "0.9850", and "0.9100" relative rankings 102a (see FIG. 3), and with the entered item code 49a (see FIG. 3) and associative memory generated item code 49b (see FIG. 3) having respective mismatched values 44b (see FIG. 3) of "J4" and "J5", "J2" and "J5", and "K5" and "J5", indicate the results or summary of specific and separate clustering and batch classifying 100 tables generated for the third through fifth records 90 (see FIG. 3), and the associative memory generated item codes 49b (see FIG. 3) for the respective third through fifth records 90 show the respective associative memory generated item code 49b (see FIG. 3) for each is "J5" because "J5" was a roll-up of similar records in their respective specific and separate clustering and batch classifying 100 tables for the third through fifth records 90 (see FIG. 3).

For the third through fifth records, the associative memory's 28 (see FIG. 3) "suggestion" of "J5" is based upon its comparison with other similar records 90d (see FIG. 3) stored in the associative memory 28 (see FIG. 3). Each of the three (3) third through fifth records 90 (see FIG. 3) were previously scored using a technical data or industry model process requirement or rule-based process, as something other than the "J5" code identified by the associative memory 28 (see FIG. 3) in the associative memory generated item code 49b (see FIG. 3). If the analyst concurs with the associative memory's 28 (see FIG. 3) suggestion, the analyst may change the respective "J4", "J2", and "K5" mismatched values 44b (see FIG. 3) to the "J5" matched values 44a (see FIG. 3).

Step 108d (see FIG. 3) may further comprise updating, changing, and/or correcting the records 90 (see FIG. 3) having problems 18 (see FIG. 1) to obtain updated records 90o (see FIG. 3). After the updates, changes, and/or corrections to the records 90 (see FIG. 3) are made, the updates, changes, and/or corrections are committed in the updated records 90o (see FIG. 3) and may be stored in the results storage 50c (see FIG. 3).

After updates, changes, and/or corrections are made to any records 90 (see FIG. 3), the analyst preferably updates the associative memory 28 (see FIG. 3) with updated results 50d (see FIG. 3) of the updated records 90o (see FIG. 3). The associative memory's 28 (see FIG. 3) accuracy percentage (%) 92 (see FIG. 3) for the five (5) records 90 (see FIG. 3)

in the item rating 96 (see FIG. 3) table will then preferably increase, thereby reflecting the improvement to that portion of the associative memory 28 (see FIG. 3). The accuracy 12 (see FIG. 1) of the computer implemented data driven classification and troubleshooting system 10 (see FIG. 3) thus has a higher value.

As shown in FIG. 3, the process 52*a* further comprises step 108*e* of updating the associative memory 28 (see FIG. 3) with the updated results 50*d* (see FIG. 3) comprising the updated records 90*o* (see FIG. 3) that have been updated, changed, and/or corrected. The process 52*a* (see FIG. 3) may further include the step of the associative memory 28 (see FIG. 3) generating an output 28*a* (see FIG. 3) of a collection of the updated records 90*o* (FIG. 3), to provide improved consistency of scoring and improved accuracy 12*c* (see FIG. 5A) of the classified or scored records 90 (see FIG. 3).

Thus, where the at least one troubleshooting tool 51 (see FIG. 1) comprises a rating and similarity based troubleshooting tool 52 (see FIG. 3), the one or more individual areas 28*c* (see FIG. 3) preferably comprise the at least one of a plurality of effects 98 (see FIG. 3) associated with the cause 99 (see FIG. 3), and the records 90 (see FIG. 3) with a below-threshold accuracy percentage (%) 92*a* (see FIG. 3). The rating and similarity based troubleshooting tool 52 (see FIG. 3) is preferably configured to report the one or more individual areas 28*c* (see FIG. 3) as a records report 90*a* (see FIG. 3) having a records breakdown 90*b* (see FIG. 3) by the one or more QRM (quality rating metric) range values 94 (see FIG. 3), each having a corresponding accuracy percentage (%) 92 (see FIG. 3) and a corresponding record count 90*c* (see FIG. 3).

The rating and similarity based troubleshooting tool 52 (see FIG. 3) is preferably further configured to identify the one or more QRM range values 94 (see FIG. 3) including QRM range values 94 (see FIG. 3) corresponding to the below-threshold accuracy percentage (%) 92*a* (see FIG. 3), configured to identify one or more QRM range values 94 (see FIG. 3) to troubleshoot, and configured to provide through use of the associative memory 28 (see FIG. 3) an ability to recognize similar records 90*d* (see FIG. 3) to bulk edit collections of the similar records 90*d* (see FIG. 3). The ability to recognize similar records 90*d* (see FIG. 3) and to bulk edit collections of the similar records 90*d* (see FIG. 3) through use of the associative memory 28 (see FIG. 3) applies to QRM range values 94 (see FIG. 3) corresponding to the below-threshold accuracy percentage (%) 92*a* (see FIG. 3), as well as QRM range values 94 (see FIG. 3) corresponding to accuracy percentages 92 (see FIG. 3) above the predetermined accuracy threshold 92*b* (see FIG. 3).

The rating and similarity based troubleshooting tool 52 (see FIG. 3) enables the computer implemented data driven classification and troubleshooting system 10 (see FIG. 3) to perform the one or more troubleshooting actions 20 (see FIG. 1) comprising changing mismatched values 44*b* (see FIG. 3) to matched values 44*a* (see FIG. 3) in the records 90 (see FIG. 3) and updating the associative memory 28 (see FIG. 3) with updated results 50*d* (see FIG. 3) and updated records 90*o* (see FIG. 3) that are updated, changed, and/or corrected.

The rating and similarity based troubleshooting tool 52 (see FIG. 3) and process 52*a* (see FIG. 3) have the ability to address the system accuracy 12*a* (see FIG. 1) overall by easily and quickly identifying individual areas 28*c* (see FIG. 3) in the associative memory 28 (see FIG. 3), demarcated by QRM range values 94 (see FIG. 3) corresponding to the below-threshold accuracy percentage (%) 92*a* (see FIG. 3), as well as QRM range values 94 (see FIG. 3) corresponding to accuracy percentages 92 (see FIG. 3) above the predetermined accuracy threshold 92*b* (see FIG. 3), that require analyst intervention to address underlying problems 18 (see FIG. 1) relating to accuracy 12 (see FIG. 1). The rating and similarity based troubleshooting tool 52 (see FIG. 3) and process 52*a* (see FIG. 3) further identify how many records 90 (see FIG. 3) fall into a given QRM range value 94 (see FIG. 3), and provide the ability through the utilization of the associative memory 28 (see FIG. 3) to recognize similar records 90*d* (see FIG. 3) in order to bulk edit collections of such similar records 90*d* (see FIG. 3). Moreover, the rating and similarity based troubleshooting tool 52 (see FIG. 3) and process 52*a* (see FIG. 3) provide useful insight that alerts and enables analysts and other system-support personnel to easily and quickly know which specific records 90 (see FIG. 3) require accuracy-related attention.

Figure 4:
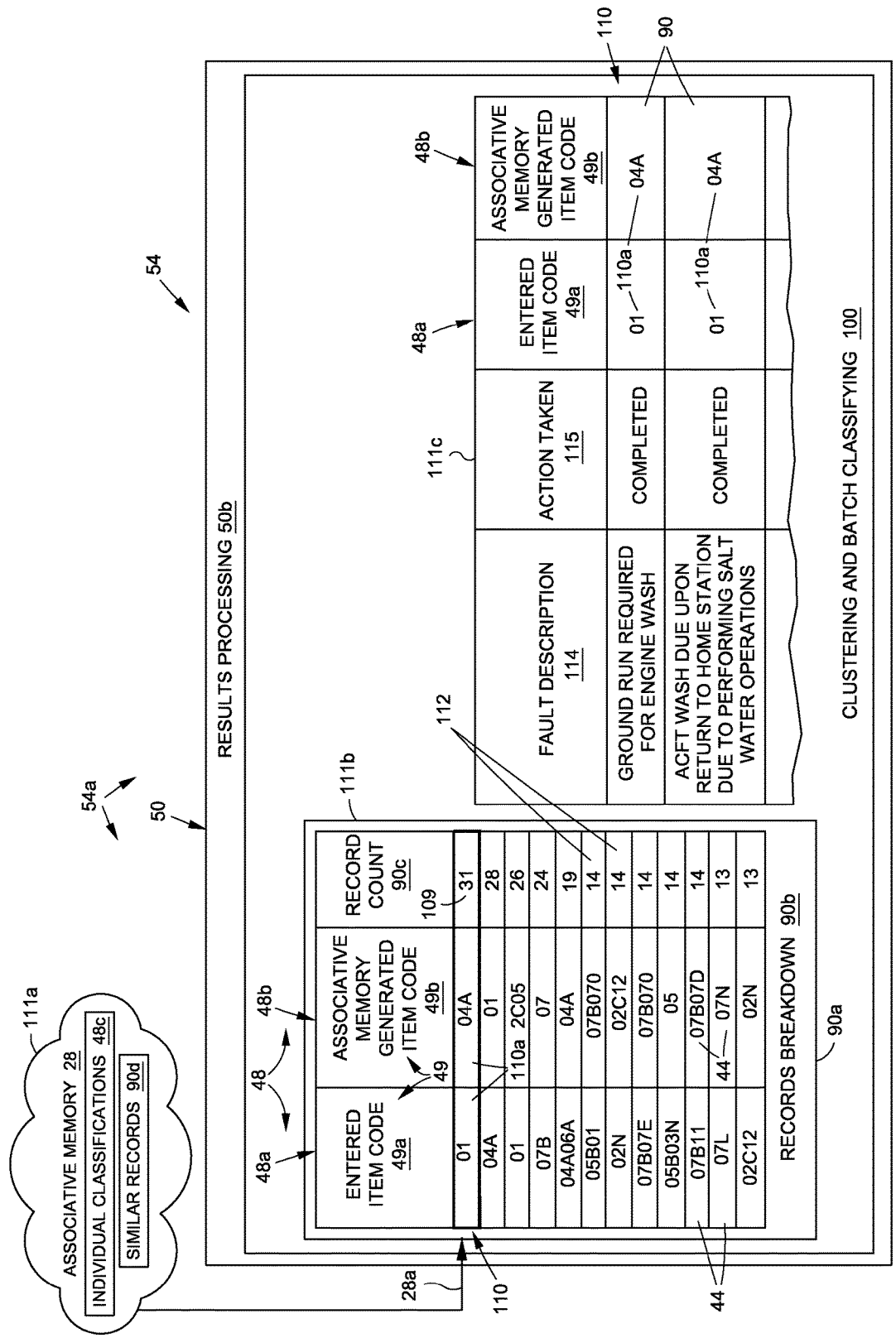
FIG. 4 is a diagrammatic representation of a schematic diagram showing an exemplary embodiment of a classification mismatch troubleshooting tool and process that may be included and used in one or more embodiments of the computer implemented data driven classification and troubleshooting system of the disclosure.

Referring now to FIG. 4, the computer implemented data driven classification and troubleshooting system 10 (see FIG. 1) may further comprise a classification mismatch troubleshooting tool 54 and process 54*a* for implementing the classification mismatch troubleshooting tool 54. FIG. 4 is a diagrammatic representation of a schematic diagram showing an exemplary embodiment of the classification mismatch troubleshooting tool 54 and process 54*a* that may be included and used in one or more embodiments of the computer implemented data driven classification and troubleshooting system 10 (see FIG. 1) of the disclosure.

The classification mismatch troubleshooting tool 54 (see FIG. 4) and process 54*a* (see FIG. 4) provide the capability to troubleshoot the associative memory 28 (see FIG. 4) and provide guidance to individual classifications 48*c* (see FIG. 4) within the associative memory 28 (see FIG. 4), which require additional work in order to improve the accuracy 12 (see FIG. 1) and performance 14 (see FIG. 1) of the associative memory 28 (see FIG. 4) and the system accuracy 12*a* (see FIGS. 1, 5A) overall for the computer implemented data driven classification and troubleshooting system 10 (see FIG. 1).

The classification mismatch troubleshooting tool 54 (see FIG. 4) and process 54*a* (see FIG. 4) may comprise a computer software program or code, or another suitable program or set of instructions. The classification mismatch troubleshooting tool 54 (see FIG. 4) and process 54*a* (see FIG. 4) may also comprise other suitable computer program instructions, such as embodied in computer software 82*c* (see FIG. 2) stored on the computer memory 70 (see FIG. 2) accessible to the one or more computer(s) 62 (see FIG. 2) or one or more the processor device(s) 66 (see FIG. 2). The classification mismatch troubleshooting tool 54 (see FIG. 4) and process 54*a* (see FIG. 4) may be used by an analyst, a user, or one or more separate automated systems, or devices, such as an automated computer program, system, device or apparatus or another suitable automated program or system.

The classification mismatch troubleshooting tool 54 (see FIG. 4) and process 54*a* (see FIG. 4) is preferably in communication with the interface application 22 (see FIG. 1) and is coupled to the associative memory 28 (see FIG. 1) of the associative memory software 24 (see FIG. 1). The process 54*a* (see FIG. 4) may be an automated process, may be a manual process, or a combination thereof. The classification mismatch troubleshooting tool 54 (see FIG. 4) and process 54*a* (see FIG. 4) is coupled to the associative memory 28 (see FIG. 4) and is configured to perform using the input 15 (see FIG. 1) into the associative memory 28 (see FIGS. 1, 4).

The classification mismatch troubleshooting tool 54 (see FIG. 4) and process 54*a* (see FIG. 4) is preferably used to diagnose mismatches 110*a* (see FIG. 4) between a classification 48 (see FIG. 4), such as an entered classification 48*a* (see FIG. 4) and a classification 48 (see FIG. 4), such as an associative memory generated classification 48*b* (see FIG. 4). As shown in FIG. 4, the process 54*a* comprises step 111*a* of capturing and identifying in the associative memory 28 one or more individual areas 28*c* (see FIG. 1), such as one or more individual classifications 48*c* requiring attention and additional data-related work. Step 111*a* (see FIG. 4) may be performed by a user, an analyst, or one or more separate automated systems, inputting an input query 15*a* (see FIG. 1) into the associative memory 28 (see FIG. 4), and the classification mismatch troubleshooting tool 54 (see FIG. 4) quickly identifies the one or more individual areas 28*c* (see FIG. 1), such as the individual classifications 48*c* (see FIG. 4), in the associative memory 28 (see FIG. 4), demarcated by high error counts 109 (see FIG. 4).

As further shown in FIG. 4, the associative memory output 28*a* generates results 50 with results processing 50*b*, and the classification mismatch troubleshooting tool 54 reports, via displays by the interface application 22 (see FIG. 1) and/or the application programming interface (API) 26 (see FIG. 1), the specific classifications 48 of the associative memory 28 requiring attention and additional data-related work, in the form of a records report 90*a*. The records report 90*a* (see FIG. 4) shows a records breakdown 90*b* (see FIG. 4) demarcated by high error counts 109 (see FIG. 4) in the classifications 48 (see FIG. 4), comparing an entered classification 48*a* (see FIG. 4), such as an entered item code 49*a* (see FIG. 4), to the associative memory generated classification 48*b* (see FIG. 4), such as an associative memory generated item code 49*b* (see FIG. 4), by values 44 (see FIG. 4) and quantity 112 (see FIG. 4) of corresponding record counts 90*c* (see FIG. 4).

The associative memory 28 (see FIG. 4) may alert the analyst, via the records report 90*a* (see FIG. 4), such that the analyst reviews the records breakdown 90*b* (see FIG. 4) and selects a classification comparison grouping 110 (see FIG. 4) for further investigation and investigates the records 90 (see FIG. 4). As shown in FIG. 4, the classification comparison grouping 110 selected has 31 (thirty-one) records 90. As shown in FIG. 4, the process 54*a* further comprises step 111*b* of reviewing the records report 90*a* comprising the records breakdown 90*b*, comparing the entered classification 48*a* to the associative memory generated classification 48*b* by values 44 and quantity 112 of corresponding record counts 90*c*, identifying a mismatch 110*a* with high error counts 109 in the classifications 48 between the entered classification 48*a* and the associative memory generated classification 48*b*, and selecting a classification comparison grouping 110 for further investigation.

As further shown in FIG. 4, the classification mismatch troubleshooting tool 54 and process 54*a* comprise clustering and batch classifying 100 for sorting the results 50 of the records 90 in descending order by record count 90*c*, or number of records 90, that fall into each classification comparison grouping 110 of the entered classification 48*a*, such as in the form of the entered item code 49*a*, and the associative memory generated classification 48*b*, such as in the form of the associative memory generated item code 49*b*.

As shown in FIG. 4, the classification comparison grouping 110 was investigated further by fault description 114 and action taken 115 narratives for each record 90. As shown in FIG. 4, the process 54*a* further comprises step 111*c* of using the classification mismatch troubleshooting tool 54 and process 54*a* to signal the associative memory 28 for review to correct associated associative memory generated classification 48*b* mismatch 110*a*.

Referring to FIG. 4, the above-discussed actions utilizing the following workflow were performed:

(1) The analyst observed the records breakdown 90*b* (see FIG. 4) broken down into mismatches 110*a* (see FIG. 4) between the entered classification 48*a* (see FIG. 4), such as in the form of the entered item code 49*a* (see FIG. 4), and the associative memory generated classification 48*b* (see FIG. 4), such as in the form of the associative memory generated item code 49*b* (see FIG. 4).

(2) The results 50 (see FIG. 4) were sorted in descending order by the record count 90*c* (see FIG. 4) or number of records 90 (see FIG. 4) that fell into each classification comparison grouping 110 (see FIG. 4).

(3) The analyst first focused attention on the thirty-one (31) records 90 (see FIG. 4) in the classification comparison grouping 110 (see FIG. 4) of "01" entered item code 49*a* (see FIG. 4) and "04A" associative memory generated item code 49*b* (see FIG. 4).

(4) The analyst noted the fault description 114 (see FIG. 4) and action taken 115 (see FIG. 4) narratives for each record 90 (see FIG. 4). Each of the 31 (thirty-one) records 90 (see FIG. 4) was subject to another analyst review for accuracy 12 (see FIG. 1) with the following possible findings and actions:

(a) The entered classification 48*a* (see FIG. 4), such as in the form of the entered item code 49*a* (see FIG. 4), is incorrect and may preferably be manually corrected in the applicable records 90 (see FIG. 4). The associative memory generated classification 48*b* (see FIG. 4), such as in the form of the associative memory generated item code 49*b* (see FIG. 4), is correct. Revising the entered classification 48*a* (see FIG. 4), such as in the form of the entered item code 49*a* (see FIG. 4), to match the associative memory generated classification 48*b* (see FIG. 4), such as in the form of the associative memory generated item code 49*b* (see FIG. 4) value may quickly reduce mismatches 110*a* (see FIG. 4) and high error counts 109 (see FIG. 4) and improve accuracy 12 (see FIG. 1) and performance 14 (see FIG. 1) of the associative memory 28 (see FIG. 4) and the computer implemented data driven classification and troubleshooting system 10 (see FIG. 1).

(b) The entered classification 48*a* (see FIG. 4), such as in the form of the entered item code 49*a* (see FIG. 4), is already correct. Other methods must be employed by the analyst to teach the associative memory 28 (see FIG. 4) to arrive at the correct answer for this classification 48 (see FIG. 4), such as in the form of item code 49 (see FIG. 4).

(c) Both the entered classification 48*a* (see FIG. 4), such as in the form of the entered item code 49*a* (see FIG. 4), and the associative memory generated classification 48*b* (see FIG. 4), such as in the form of the associative memory generated item code 49*b* (see FIG. 4), are incorrect. Both actions (a) and (b) above may be employed to improve the accuracy 12 (see FIG. 1) and performance 14 (see FIG. 1) of the associative memory 28 (see FIG. 4).

The classification mismatch troubleshooting tool 54 (see FIG. 4) and process 54*a* (see FIG. 4) provide a solution to find and correct factors within the associative memory generated classification 48*b* (see FIG. 4) of the records 90 (see FIG. 4), and other similar records 90*d* (see FIG. 4) that drive the accuracy 12 (see FIG. 1) and performance 14 (see FIG. 1) of the associative memory 28 (see FIG. 4).

The classification mismatch troubleshooting tool 54 (see FIG. 4) and process 54*a* (see FIG. 4) has the ability to address the system accuracy 12*a* (see FIG. 1) overall by easily and quickly identifying individual classifications 48*c* (see FIG. 4) in the associative memory 28 (see FIG. 4), demarcated by high error counts 109 (see FIG. 4), that require analyst intervention to address underlying problems 18 (see FIG. 1) relating to accuracy 12 (see FIG. 1). The classification mismatch troubleshooting tool 54 (see FIG. 4) and process 54*a* (see FIG. 4) also identify how many system records 90 (see FIG. 4) fall into a classification comparison grouping 110 (see FIG. 4) or error grouping, and provide the ability to target very specific combinations of classification 48 (see FIG. 4) mismatches 110*a* (see FIG. 4) for improvement to the associative memory 28 (see FIG. 4) and to the computer implemented data driven classification and troubleshooting system 10 (see FIG. 1).

Thus, where the at least one troubleshooting tool 51 (see FIG. 1) comprises the classification mismatch troubleshooting tool 54 (see FIG. 4), the one or more individual areas 28*c* (see FIG. 4) comprise individual classifications 48*c* (see FIG. 4) demarcated by high error counts 109 (see FIG. 4). The classification mismatch troubleshooting tool 54 (see FIG. 4) is preferably configured to report the one or more individual areas 28*c* (see FIG. 1) as a records report 90*a* (see FIG. 4) having a records breakdown 90*b* (see FIG. 4) demarcated by high error counts 109 (see FIG. 4) in the individual classifications 48*c* (see FIG. 4), comparing the entered classification 48*a* (see FIG. 4) to the associative memory generated classification 48*b*, by values 44 (see FIG. 4) and quantity 112 (see FIG. 4) of corresponding record counts 90*c* (see FIG. 4), configured to identify how many system records 90 (see FIG. 4) fall into the classification comparison grouping 110 (see FIG. 4), and configured to provide an ability to target combinations of mismatches 110*a* (see FIG. 4) between the entered classification 48*a* and the associative memory generated classification 48*b* (see FIG. 4).

The classification mismatch troubleshooting tool 54 (see FIG. 4) enables the computer implemented data driven classification and troubleshooting system 10 (see FIG. 1) to perform the one or more troubleshooting actions 20 (see FIG. 1). The one or more troubleshooting actions 20 (see FIG. 1) preferably comprise: (a) correcting the records 90 (see FIG. 4) where there is a mismatch 110*a* (see FIG. 4) between the entered classification 48*a* (see FIG. 4) and the associative memory generated classification 48*b* (see FIG. 4), and the entered classification 48*a* (see FIG. 4) is incorrect; (b) using an independent correction method for correcting the associative memory 28 (see FIG. 4), where there is a mismatch 110*a* (see FIG. 4) between the entered classification 48*a* (see FIG. 4) and the associative memory generated classification 48*b* (see FIG. 4), and the associative memory generated classification 48*b* (see FIG. 4) is incorrect; or (c) correcting the records 90 (see FIG. 4) where there is a mismatch 110*a* (see FIG. 4) between the entered classification 48*a* (see FIG. 4) and the associative memory generated classification 48*b* (see FIG. 4), and both the entered classification 48*a* (see FIG. 4) and the associative memory generated classification 48*b* (see FIG. 4) are incorrect.

Figure 5A:
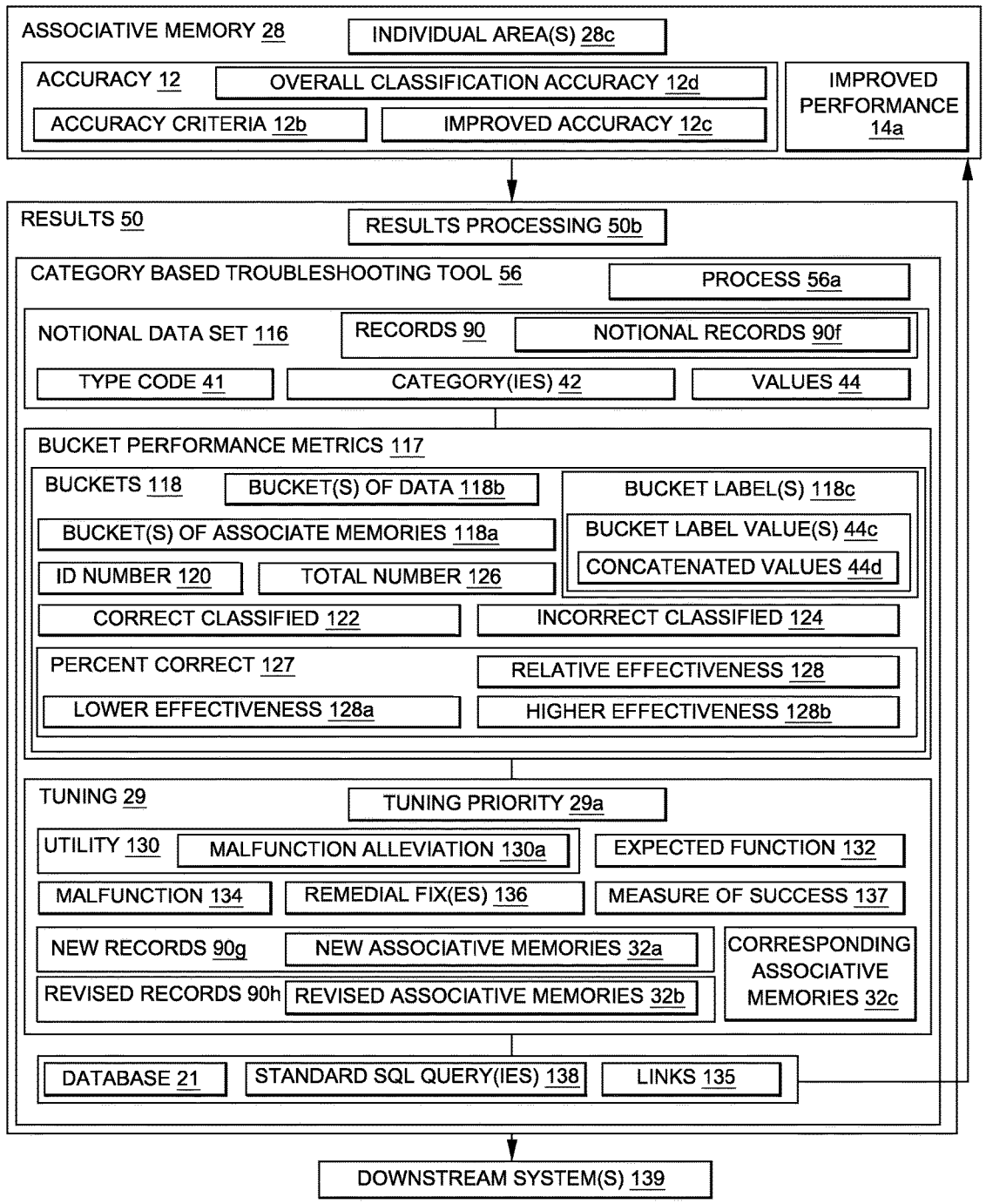
FIG. 5A is an illustration of a functional block diagram showing a category based troubleshooting tool and process that may be included and used in one or more embodiments of the computer implemented data driven classification and troubleshooting system of the disclosure.

Referring now to FIG. 5A, the computer implemented data driven classification and troubleshooting system 10 (see FIG. 1) may further comprise a category based troubleshooting tool 56 and process 56*a* for implementing the category based troubleshooting tool 56. FIG. 5A is an illustration of a functional block diagram showing a category based troubleshooting tool 56 and process 56*a* that may be included and used in one or more embodiments of the computer implemented data driven classification and troubleshooting system 10 (see FIG. 1) of the disclosure.

As shown in FIG. 5A, the category based troubleshooting tool 56 and process 56*a* provide for tuning 29 individual areas 28*c* of the associative memory 28 in order to increase its accuracy 12, including the system accuracy 12*a* (see FIG. 1), of results 50, and to identify where in the associative memory 28, data 16 (see FIG. 1) in the records 90 is not meeting certain accuracy criteria 12*b*. This information 88 (see FIG. 1) may be used to achieve improved accuracy 12*c* (see FIG. 5A) and improved performance 14*a* (see FIG. 5A) of the associative memory 28 (see FIG. 5A), thereby tuning 29 (see FIG. 5A) it.

The category based troubleshooting tool 56 (see FIG. 5A) and process 56*a* (see FIG. 5A) may comprise a computer software program or code, or another suitable program or set of instructions. The category based troubleshooting tool 56 (see FIG. 5A) and process 56*a* (see FIG. 5A) may also comprise other suitable computer program instructions, such as embodied in computer software 82*c* (see FIG. 2) stored on the computer memory 70 (see FIG. 2) and accessible to the one or more computer(s) 62 (see FIG. 2) or the one or more processor device(s) 66 (see FIG. 2). The category based troubleshooting tool 56 (see FIG. 5A) and process 56*a* (see FIG. 5A) may be used by an analyst, a user, or one or more separate automated systems, such as an automated computer program, system, device or apparatus, or may be automated via a suitable automated program or system.

The category based troubleshooting tool 56 (see FIG. 5A) and process 56*a* (see FIG. 5A) is preferably in communication with the interface application 22 (see FIG. 1) and is coupled to the associative memory 28 (see FIG. 1) of the associative memory software 24 (see FIG. 1). The process 56*a* (see FIG. 5A) may be an automated process, may be a manual process, or a combination thereof. The category based troubleshooting tool 56 (see FIG. 5A) and process 56*a* (see FIG. 5A) is coupled to the associative memory 28 (see FIG. 5A) and is configured to perform using the input 15 (see FIG. 1) into the associative memory 28 (see FIGS. 1, 5A).

The process 54*a* (see FIG. 5A) first comprises using the category based troubleshooting tool 56 (see FIG. 5A) to capture and identify in the associative memory 28 (see FIG. 5A) one or more individual area(s) 28*c* (see FIG. 5A) requiring attention and additional data-related work. The one or more individual area(s) 28*c* (see FIG. 5A) preferably comprise a plurality of specific categories 42 (see FIG. 5A) of the associative memory 28 (see FIG. 5A) that have been previously categorized or scored, such as in pre-work 17 (see FIG. 1), and that are formed into a notional data set 116 (see FIGS. 5A-5B), which, in turn, becomes one or more buckets 118 (see FIGS. 5A-5B).

Figure 5B:
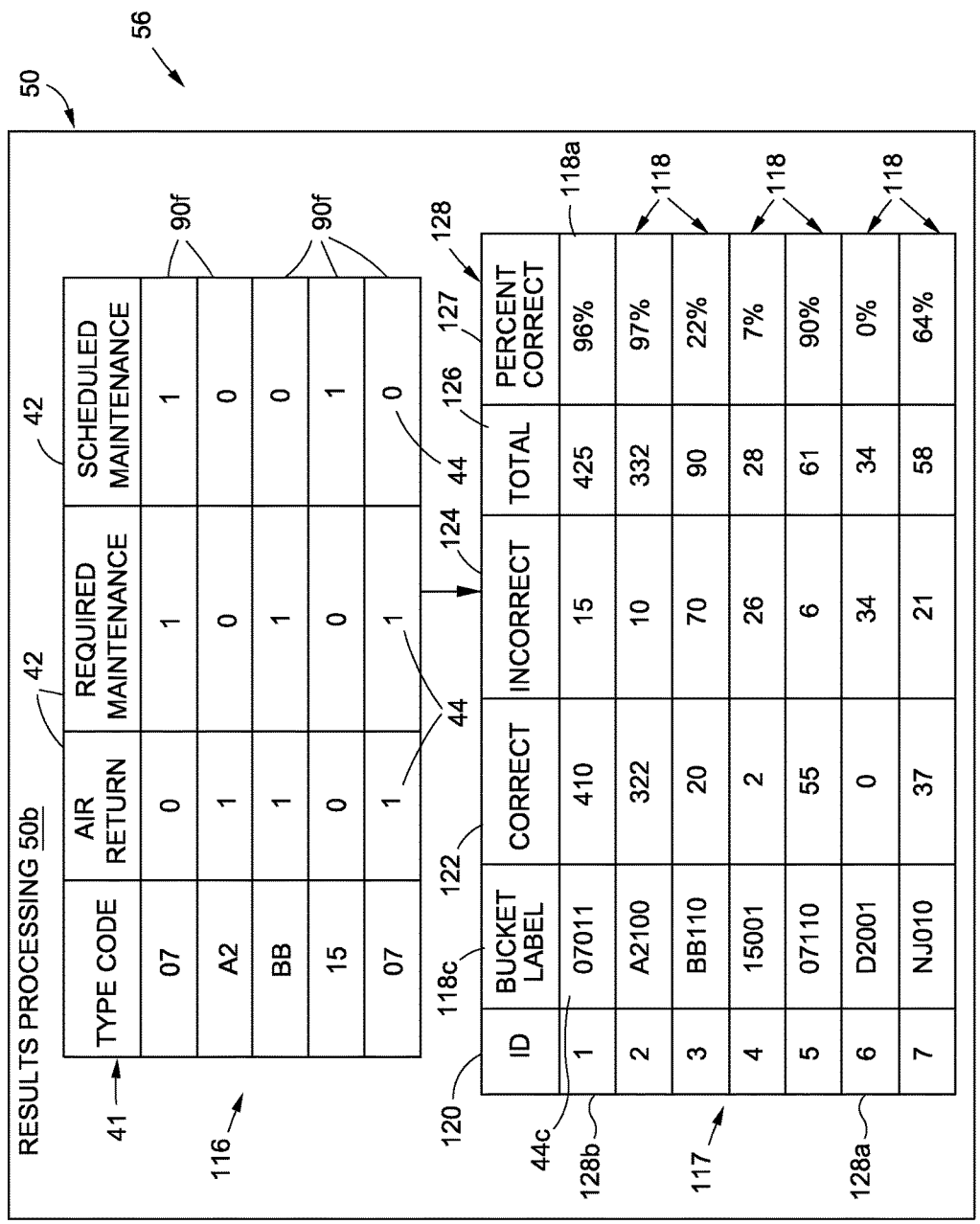
FIG. 5B shows an exemplary embodiment using the category based troubleshooting tool and process of FIG. 5A.

FIG. 5B shows an exemplary embodiment using the category based troubleshooting tool 56 and process 56*a* of FIG. 5A, where the associative memory 28 (see FIG. 5A) generates results 50 with results processing 50*b*, and the category based troubleshooting tool 56 (see FIG. 5A) and process 56*a* (see FIG. 5A), report, via displays by the interface application 22 (see FIG. 1) and/or the application programming interface (API) 26 (see FIG. 1), results 50 in the form of a notional data set 116. The notional data set 116 (see FIGS. 5A-5B) has preferably been categorized or scored and may be stored in the associative memory 28 (see FIG. 5A). As shown in FIG. 5B, the notional data set 116 includes notional records 90*f* having categories 42 for "AIR RETURN", "REQUIRED MAINTENANCE" and "SCHEDULED MAINTENANCE". As shown in FIGS. 5A-5B, each category 42 of the notional records 90f has values 44 for a given type code 41 line. Each of the notional records 90f (see FIGS. 5A-5B) becomes a bucket 118 (see FIGS. 5A-5B), as shown by a report in the form of a bucket performance metrics 117 (see FIGS. 5A-5B).

The category based troubleshooting tool 56 (see FIGS. 5A-5B) and process 56a (see FIG. 5A) generate buckets 118 (see FIGS. 5A-5B), such as bucket(s) of associative memories 118a (see FIG. 5A), or such as bucket(s) of data 118b (see FIG. 5A). As shown in FIG. 5A, the buckets 118 become available in a database 21 and are then able to be queried by one or more standard computer programming languages, such as standard SQL (Structured Query Language) query(ies) 138. The standard SQL query(ies) 138 (see FIG. 5A) then generate bucket label value(s) 44c (see FIG. 5A) that indicate problems 18 (see FIG. 1), such as data-related problems, in the associative memory 28 (see FIG. 5A) and provide links 135 (see FIG. 5A) to affected records 90 (see FIG. 5A) for investigation, such as by a user, an analyst, or one or more separate automated systems.

As shown in FIGS. 5A and 5B, the bucket performance metrics 117 display ID (identification) numbers 120, bucket label values 44c, correct classified 122 results 50 or categories 42, incorrect classified 124 results 50 or categories 42, total number 126 of records 90 in a bucket 118, and percent correct 127 of the records 90 in each bucket 118. The bucket label values 44c (see FIGS. 5A-5B) equate to concatenated values 44d (see FIG. 5A) of each notional record 90f (see FIGS. 5A-5B) shown in the notional data set 116 (see FIGS. 5A-5B). The values 44 (see FIGS. 5A-5B) in the notional data set 116 (see FIGS. 5A-5B) and the bucket label values 44c (see FIGS. 5A-5B) are derived from the associative memory 28 (see FIG. 5A) and correspond to results 50 (see FIGS. 5A-5B) where the associative memory 28 (see FIG. 5A) classified or scored a given bucket 118 (see FIGS. 5A-5B) with a correct classified 122 (see FIGS. 5A-5B) or an incorrect classified 124 (see FIGS. 5A-5B), respectively.

The bucket performance metrics 117 (see FIG. 5B) provide an analyst, user, or one or more separate automated systems with information, such as the following, with respect to tuning 29 (see FIG. 5A) the associative memory 28 (see FIG. 5A): (1) buckets 118 (see FIG. 5B) that are performing well or performing poorly in terms of the percent correct 127 (see FIG. 5B) result; (2) indications in the poorly-performing results where major problems 18 (see FIG. 1) likely exist (e.g., ID#6 (see FIG. 5B) and potentially ID#4 (see FIG. 5B)), and where non-major problem areas exist, but where attention is clearly required to improve performance (e.g., ID#3 (see FIG. 5B)); (3) where the analyst, user, or one or more separate automated systems should direct the memory-tuning efforts—down to order of tuning priority 29a (see FIG. 5A) because of the total number 126 (see FIG. 5B) involved—to make the best use of tuning 29 (see FIG. 5A) the associative memory 28 (see FIG. 5A) and troubleshooting work effort. For example, with the bucket performance metrics 117 (see FIG. 5B), the analyst, user, or one or more separate automated systems may decide to start tuning 29 (see FIG. 5A) with ID#4 (see FIG. 5B) because of the fewest total number 126 (see FIG. 5B) of records 90 (see FIG. 5B) involved, then move onto ID#6 (see FIG. 5B) because of major problems 18 (see FIG. 1) that appear to exist there and because of the relatively few total number 126 (see FIG. 5B) of records 90 (see FIG. 5B) involved.

The process 54a (see FIG. 5A) may further comprise establishing a relative effectiveness 128 (see FIGS. 5A-5B) for each of the categories 42 (see FIGS. 5A-5B) of individual areas 28c (see FIG. 5A) of the associative memory 28 (see FIG. 5A), and using the established relative effectiveness 128 (see FIG. 5A) to identify categories 42 (see FIG. 5A) or buckets 118 (see FIGS. 5A-5B) with lower effectiveness 128a (see FIGS. 5A-5B) for review and tuning 29 (see FIG. 5A) of corresponding associative memories 32c (see FIG. 5A) by reallocating revised records 90h (see FIG. 5A), such as revised associative memories 32b, and/or adding new records 90g (see FIG. 5A), such as new associative memories 32a, to the category 42 (see FIG. 5A). Categories 42 (see FIG. 5A) or buckets 118 (see FIG. 5B) with higher effectiveness 128b (see FIG. 5B) are preferably lower in the tuning priority 29a (see FIG. 5A).

The relative effectiveness 128 (see FIGS. 5A-5B) for each of the categories 42 (see FIGS. 5A-5B) or buckets 118 (see FIGS. 5A-5B) is preferably a reflection of utility 130 (see FIG. 5A) of the corresponding associative memories 32c (see FIG. 5A) of the category 42 (see FIGS. 5A-5B) of the associative memory 28 (see FIG. 5A). As shown in FIG. 5A, the utility 130 of the associative memory 28 may include an expected function 132 of the corresponding associative memories 32c corresponding to the category 42 of the associative memory 28. An example of a category 42 (see FIG. 5A) of the associative memory 28 (see FIG. 5A) may include a malfunction 134 (see FIG. 5A) of a system, and the corresponding associative memories 32c (see FIG. 5A) may comprise remedial fixes 136 (see FIG. 5A) for correcting the malfunction 134 (see FIG. 5A) of the system. The utility 130 (see FIG. 5A) of the corresponding associative memories 32c (see FIG. 5A) may include malfunction alleviation 130a (see FIG. 5A) of the system, and effectiveness of the associative memory 28 (see FIG. 5A) is preferably a measure of success 137 (see FIG. 5A) of the utility 130 (see FIG. 5A) of the corresponding associative memories 32c (see FIG. 5A).

Thus, where the at least one troubleshooting tool 51 (see FIG. 1) comprises the category based troubleshooting tool 56 (see FIGS. 5A-5B), the one or more individual areas 28c (see FIG. 5A) comprise the plurality of categories 42 (see FIGS. 5A-5B) and values 44 (see FIGS. 5A-5B) that have been previously categorized. The category based troubleshooting tool 56 (see FIGS. 5A-5B) is preferably configured to report the one or more individual areas 28c (see FIG. 5A) as a notional data set 116 (see FIGS. 5A-5B), configured to generate one or more buckets of data 118b (see FIGS. 5A-5B) from the notional data set 116 (see FIGS. 5A-5B), and configured to make the one or more buckets of data 118b (see FIGS. 5A-5B) available in a database 21 (see FIGS. 5A-5B) configured to be queried by standard SQL (Structured Query Language) queries 138 (see FIGS. 5A-5B).

The category based troubleshooting tool 56 (see FIGS. 5A-5B) enables the computer implemented data driven classification and troubleshooting system 10 (see FIG. 1) to perform the one or more troubleshooting actions 20 (see FIG. 1) comprising using the standard SQL query(ies) 138 (see FIGS. 5A-5B) to generate bucket label values 44c (see FIGS. 5A-5B) that indicate problems 18 (see FIG. 1) in the associative memory 28 (see FIG. 5A), and to provide links 135 (see FIG. 5A) to affected records 90 (see FIG. 5A) for investigation, and establishing a tuning priority 29a (see FIG. 5A) based on a total number 126 (see FIGS. 5A-5B) of records 90 (see FIGS. 5A-5B) in the one or more buckets of data 118b (see FIGS. 5A-5B).

The category based troubleshooting tool 56 (see FIGS. 5A-5B) and process 56a (see FIG. 5A) preferably solve the challenge of knowing in the associative memory 28 (see FIG. 5A) where to look to fix problems 18 (see FIG. 1) that may contribute to an underperforming system, where the associative memory 28 (see FIG. 5A) is used as its data source 16c (see FIG. 1). In addition, the category based troubleshooting tool 56 (see FIGS. 5A-5B) and process 56a (see FIG. 5A) provide improved preparation of data sets 16i (see FIG. 1) of free text data 16h (see FIG. 1) to generate similar matches to subsequently feed one or more downstream system(s) 139 (see FIG. 5A) with better information 88 (see FIG. 1). With the downstream systems 139 (see FIG. 5A) having better information 88 (see FIG. 1), improved maintenance and other technical data or industry decisions may be made.

Figure 6:
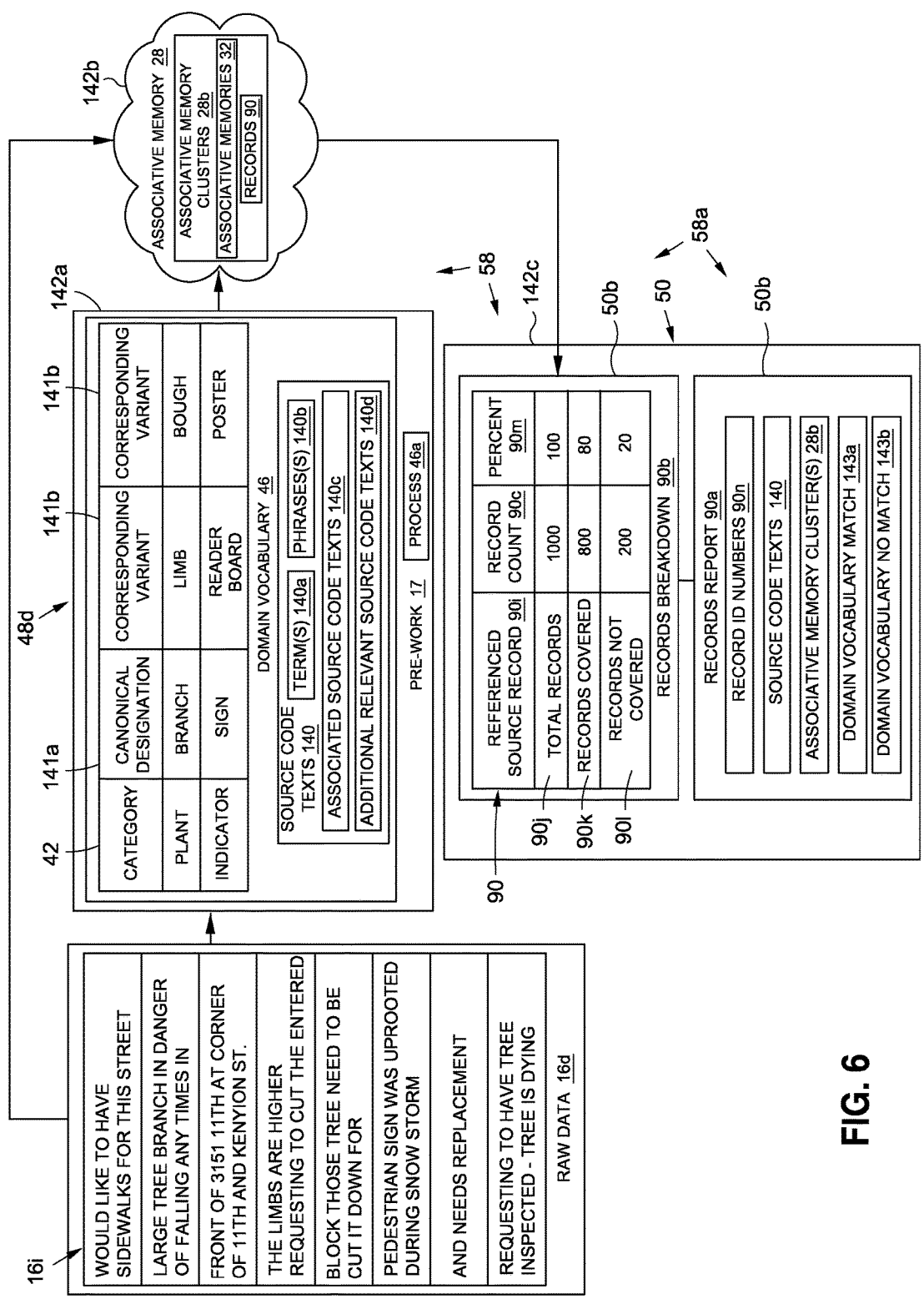
FIG. 6 is a diagrammatic representation of a schematic diagram showing an exemplary embodiment of a domain vocabulary troubleshooting tool and process that may be included and used in one or more embodiments of the computer implemented data driven classification and troubleshooting system of the disclosure.

Referring now to FIG. 6, the computer implemented data driven classification and troubleshooting system 10 (see FIG. 1) may further comprise a domain vocabulary troubleshooting tool 58 and process 58a for implementing the domain vocabulary troubleshooting tool 58. FIG. 6 is a diagrammatic representation of a schematic diagram showing an exemplary embodiment of the domain vocabulary troubleshooting tool 58 and process 58a that may be included and used in one or more embodiments of the computer implemented data driven classification and troubleshooting system 10 (see FIG. 1) of the disclosure.

The domain vocabulary troubleshooting tool 58 (see FIG. 6) and process 58a (see FIG. 6) analyze how much the associative memory 28 (see FIG. 6) is covered by one or more terms 140a (see FIG. 6) or phrases 140b (see FIG. 6), from a domain vocabulary 46 (see FIG. 6). Once the domain vocabulary 46 (see FIG. 6) is created, an analyst, user, or one or more separate automated systems or programs, may determine how much of the domain vocabulary 46 (see FIG. 6) applies to a given associative memory 28 (see FIG. 6). The domain vocabulary troubleshooting tool 58 (see FIG. 6) and process 58a (see FIG. 6) enable the analyst, user, or one or more separate automated systems or programs, to assess how many referenced source records 90i (see FIG. 6) contained in the associative memory 28 (see FIG. 6) have at least one of the terms 140a (see FIG. 6) or phrases 140b (see FIG. 6) of the domain vocabulary 46 (see FIG. 6) in the referenced source records 90i (see FIG. 6).

The domain vocabulary troubleshooting tool 58 (see FIG. 6) and process 58a (see FIG. 6) may comprise a computer software program or code, or another suitable program or set of instructions. The domain vocabulary troubleshooting tool 58 (see FIG. 6) and process 58a (see FIG. 6) may also comprise other suitable computer program instructions, such as embodied in computer software 82c (see FIG. 2) stored on the computer memory 70 (see FIG. 2) and accessible to the one or more computer(s) 62 (see FIG. 2) or the one or more processor device(s) 66 (see FIG. 2). The domain vocabulary troubleshooting tool 58 (see FIG. 6) and process 58a (see FIG. 6) may be used by an analyst, a user, or one or more separate automated systems, such as an automated computer program, system, device or apparatus, or may be automated via a suitable automated program or system.

The domain vocabulary troubleshooting tool 58 (see FIG. 6) and process 58a (see FIG. 6) is preferably in communication with the interface application 22 (see FIG. 1) and is coupled to the associative memory 28 (see FIG. 1) of the associative memory software 24 (see FIG. 1). The process 58a (see FIG. 6) may be an automated process, may be a manual process, or a combination thereof. The domain vocabulary troubleshooting tool 58 (see FIG. 6) and process 58a (see FIG. 6) is coupled to the associative memory 28 (see FIG. 6) and is configured to perform using the input 15 (see FIG. 1) into the associative memory 28 (see FIGS. 1, 6).

As shown in FIG. 6, the domain vocabulary 46 is preferably created from a data set 16i of raw data 16d, or other suitable data sources 16c (see FIG. 1), and may be developed in pre-work 17 using a domain vocabulary creation process 46a. As used herein, "domain vocabulary" means the collection of canonical designations 141a (see FIG. 6) and corresponding variants 141b (see FIG. 6) that are specific to a domain or given sphere of knowledge or activity and that have been generated from raw data 16d (see FIG. 6), free text data 16h (see FIG. 1), a data set 16i (see FIG. 6), or other suitable data sources 16c (see FIG. 1). As used herein, "canonical designation" means a term 140a (see FIG. 6) or a phrase 140b (see FIG. 6) in a data set 16i (see FIG. 6) for which many similar ways to identify the term 140a (see FIG. 6) or phrase 140b (see FIG. 6) exist. As used herein, "corresponding variants" mean the similar terms 140a (see FIG. 6) or phrases 140b (see FIG. 6) for a given canonical designation 141a (see FIG. 6). As shown in FIG. 6, the canonical designations 141a include "BRANCH" and "SIGN", and their respective variants 141b include "LIMB", "BOUGH", "READER BOARD" and "POSTER". The final representation of cleaned data is defined as the domain vocabulary 46 (see FIG. 6). The domain vocabulary 46 (see FIG. 6) may also be include categories 42 (see FIG. 6), e.g., "PLANT", "INDICATOR" of the canonical designations 141a (see FIG. 6) and corresponding variants 141b (see FIG. 6).

The process 58a (see FIG. 6) comprises step 142a of providing a domain vocabulary 46 (see FIG. 6) having a plurality of source code texts 140 (see FIG. 6) comprising one or more terms 140a (see FIG. 6) and/or one or more phrases 140b (see FIG. 6), and determining how much of the domain vocabulary 46 applies to the associative memory 28 (see FIG. 6).

As shown in FIG. 6, the domain vocabulary 46 is preferably input into the associative memory 28, which has one or more individual areas 28c (see FIG. 1), such as in the form of a plurality of associative memory clusters 28b, requiring attention and additional data-related work. Each associative memory cluster 28b (see FIG. 6) comprises associative memories 32 (see FIG. 6) or records 90 (see FIG. 6) that exist in the associative memory 28 (see FIG. 6), that are so similar to one another or share a concept that they group together in a cluster. The associative memories 32 (see FIG. 6) in each associative memory cluster 28b (see FIG. 6) are preferably clustered based on relevance to a plurality of associated source code texts 140a (see FIG. 6) from the domain vocabulary 46 (see FIG. 6).

As shown in FIG. 6, the process 58a further comprises step 142b of inputting the domain vocabulary 46 in the associative memory 28 having a plurality of associative memory clusters 28b to analyze the associative memory 28 for domain vocabulary 46 coverage, and to identify references of associated source code texts 140c in each associative memory cluster 28b. The references may comprise categories 42 (see FIG. 6) of corresponding received data 16a (see FIG. 1) in the associative memory cluster 28b (see FIG. 6) or similar records 90d (see FIG. 4).

As shown in FIG. 6, the associative memory 28 generates results 50 with results processing 50b, and the domain vocabulary troubleshooting tool 58 (see FIG. 6) and process 58a (see FIG. 6) report, via displays of the interface application 22 (see FIG. 1) and/or the application programming interface (API) 26 (see FIG. 1), results 50, such as in the form of a records breakdown 90*b* and a records report 90*a*. The domain vocabulary troubleshooting tool 58 (see FIG. 6) enables, via displays of the interface application 22 (see FIG. 1) and/or the application programming interface (API) 26 (see FIG. 1), viewing by an analyst, a user, or one or more separate systems, of the associative memories 32 (see FIG. 6) in each associative memory cluster 28*b* (see FIG. 6).

As shown in FIG. 6, the records breakdown 90*b* includes columns for referenced source record 90*i*, record count 90*c*, and percent 90*m* of records. As shown in FIG. 6, under referenced source record 90*i* are rows for total records 90*j*, records covered 90*k*, and records not covered 90*l*. The records covered 90*k* (see FIG. 6) identify referenced source records 90*i* (see FIG. 6) from the associative memory 28 (see FIG. 6), where there is at least one domain vocabulary match 143*a* (see FIG. 6) of a term 140*a* (see FIG. 6) or phrase 140*b* (see FIG. 6) from the domain vocabulary 46 (see FIG. 6) that occurred in the associative memory 28 (see FIG. 6), and correspondingly, which referenced source records 90*i* (see FIG. 6) had a domain vocabulary no match 143*b* (see FIG. 6) of a term 140*a* (see FIG. 6) or phrase 140*b* (see FIG. 6) from the domain vocabulary 46 (see FIG. 6) that occurred in the associative memory 28 (see FIG. 6). Determining the latter information enables an analyst, user, or one or more separate automated system or program, to know where to start the domain vocabulary 46 (see FIG. 6) improvement process.

As shown in FIG. 6, the records report 90*a* may categorize the records 90, such as the referenced source records 90*i*, into desired categories or columns, such as records ID numbers 90*n*, source code texts 140, associative memory clusters 28*b*, domain vocabulary match 143*a*, and domain vocabulary no match 143*b*, which may then be analyzed in the resultant records 90, such as the referenced source records 90*i*. The analyst, user, or one or more separate automated system or program, may choose another approach in which all of the source code text 140 (see FIG. 6) from the records 90 (see FIG. 6) are selected from the raw data 16*d* (see FIG. 6). The analyst, user, or one or more separate automated system or program, may then develop an additional set of entries, such as additional relevant source code texts 140*d* (see FIG. 6), in the domain vocabulary 46 (see FIG. 6) to expand the domain vocabulary 46 (see FIG. 6).

As shown in FIG. 6, the process 58*a* further comprises step 142*c* of using the domain vocabulary troubleshooting tool 58 to enable viewing of the associative memories 32 in each associative memory cluster 28*b*, to identify additional relevant source code texts 140*d*, to expand the domain vocabulary 46, and to enable an enhanced clustering of associative memories 32 based on the additional relevant source code texts 140*d*.

The domain vocabulary troubleshooting tool 58 (see FIG. 6) and process 58*a* (see FIG. 6) preferably solve the problem 18 (see FIG. 1) of determining how effective the precursor data vocabulary identification work was to match domain vocabulary 46 (see FIG. 6) terms 140*a* (see FIG. 6) and phrases 140*b* (see FIG. 6) present in the associative memory 28 (see FIG. 6). Adequately capturing the domain vocabulary 46 (see FIG. 6) may greatly improve the ability of query inputs 15*a* (see FIG. 1) to the associative memory 28 (see FIG. 6) to find all respective groupings of similar records 90*d* (see FIG. 4) that exist across the entire data set 16*i* (see FIG. 6) of the associative memory 28 (see FIG. 6). The associative memory 28 (see FIG. 6) utilizes the domain vocabulary 46 (see FIG. 6) terms 140*a* (see FIG. 6) or phrases 140*b* (see FIG. 6) present in each applicable record 90 (see FIG. 6) to create better plurality of associations 33 (see FIG. 1) between records 90 (see FIG. 6), where the same or similar domain vocabulary 46 (see FIG. 6) terms 140*a* (see FIG. 6) or phrases 140*b* (see FIG. 6) also exist.

Further, the domain vocabulary troubleshooting tool 58 (see FIG. 6) and process 58*a* (see FIG. 6) preferably provide for improved preparation of data sets 16*i* (see FIG. 6) of raw data 16*d* (see FIG. 6) or source code texts 140 (see FIG. 6) to generate similar matches to subsequently feed downstream systems 139 (see FIG. 5A) with better information 88 (see FIG. 1). The domain vocabulary troubleshooting tool 58 (see FIG. 6) and process 58*a* (see FIG. 6) may preferably be used by industries with associative memory-based approaches to manipulate their respective data sets 16*i* (see FIG. 6). Such industries may include, but are not limited to, the aerospace industry, the maintenance industry, the healthcare industry, the human resources industry, or another suitable industry.

Thus, where the at least one troubleshooting tool 51 (see FIG. 1) comprises a domain vocabulary troubleshooting tool 58 (see FIG. 6), the one or more individual areas 28*c* (see FIG. 1) comprise the plurality of associative memory clusters 28*b* (see FIG. 6) and the domain vocabulary 46 (see FIG. 6). The domain vocabulary troubleshooting tool 58 (see FIG. 6) is preferably configured to enable viewing of associative memories 32 (see FIG. 6) in each associative memory cluster 28*b* (see FIG. 6), configured to report referenced source records 90*i* (see FIG. 6) in the records breakdown 90*b* (see FIG. 6), configured to identify additional relevant source code texts 140*d* (see FIG. 6), configured to expand the domain vocabulary 46 (see FIG. 6), and configured to enable the enhanced clustering of associative memories 32 (see FIG. 6) based on the additional relevant source code texts 140*d* (see FIG. 6).

The domain vocabulary troubleshooting tool 58 (see FIG. 6) enables the computer implemented data driven classification and troubleshooting system 10 (see FIG. 1) to perform the one or more troubleshooting actions 20 (see FIG. 1). The one or more troubleshooting actions 20 (see FIG. 1) comprise identifying which referenced source records 90*i* (see FIG. 6) from the associative memory 28 (see FIG. 6) have at least one domain vocabulary match 143*a* (see FIG. 6) of a term 140*a* (see FIG. 6) or phrase 140*b* (see FIG. 6) from the domain vocabulary 46 (see FIG. 6) that occurred in the associative memory 28 (see FIG. 6), and which referenced source records 90*i* (see FIG. 6) have a domain vocabulary no match 143*b* (see FIG. 6) of the term 140*a* (see FIG. 6) or phrase 140*b* (see FIG. 6) from the domain vocabulary 46 (see FIG. 6) that occurred in the associative memory 28 (see FIG. 6).

Figure 7B:
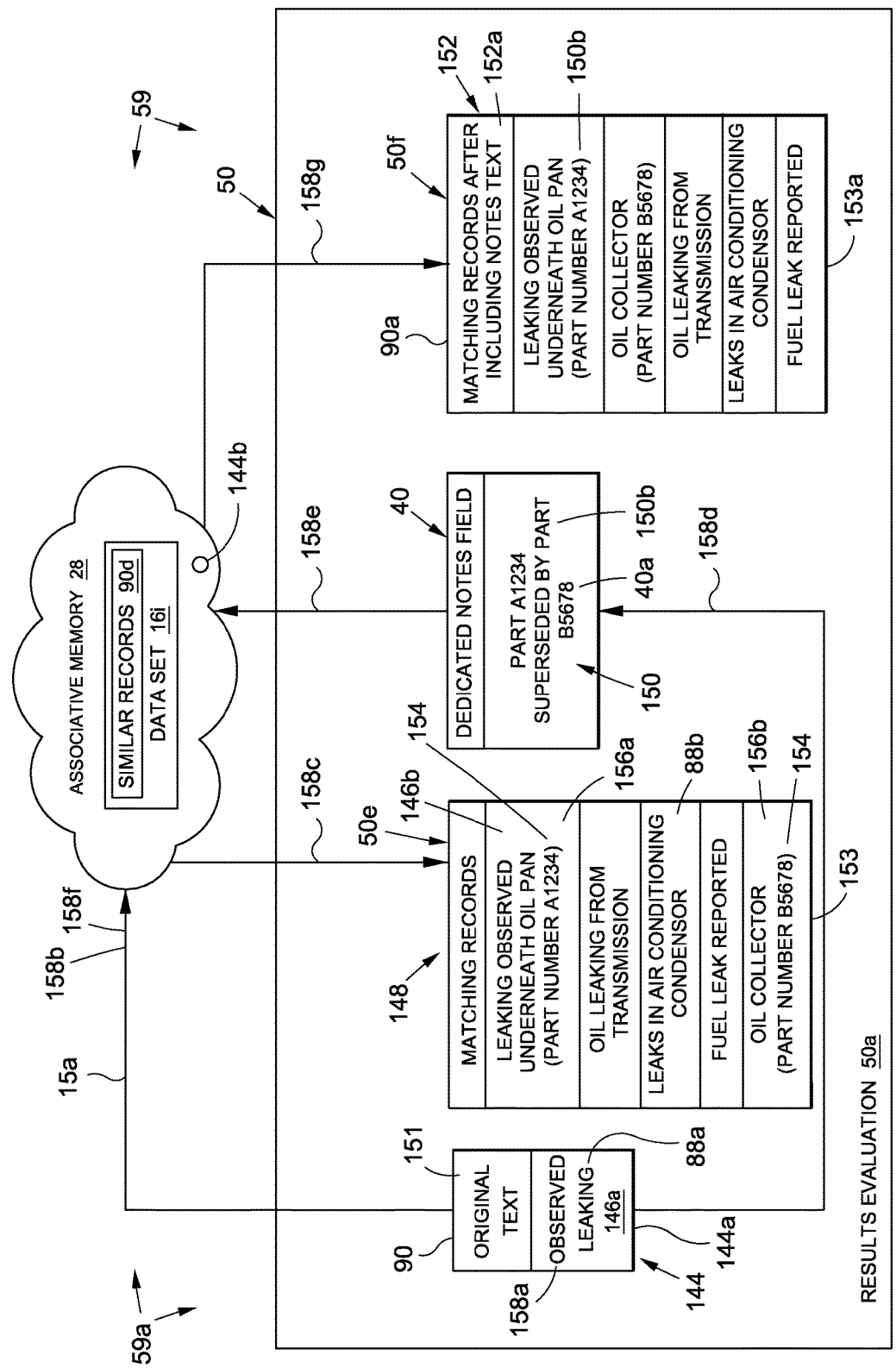
FIG. 7B is a diagrammatic representation of a schematic diagram showing another capability of the knowledge sharing and disambiguation tool and process of FIG. 7A.

Referring now to FIGS. 7A-7B, the computer implemented data driven classification and troubleshooting system 10 (see FIG. 1) may further comprise a knowledge sharing and disambiguation tool 59 and process 59*a* for implementing the knowledge sharing and disambiguation tool 59. FIG. 7A is a diagrammatic representation of a schematic diagram showing an exemplary embodiment of the knowledge sharing and disambiguation tool 59 and process 59*a* that may be included and used in one or more embodiments of the computer implemented data driven classification and troubleshooting system 10 (see FIG. 1) of the disclosure. FIG. 7B is a diagrammatic representation of a schematic diagram showing another capability of the knowledge sharing and disambiguation tool 59 and process 59*a* of FIG. 7A.

The knowledge sharing and disambiguation tool 59 (see FIGS. 7A-7B) and process 59*a* (see FIGS. 7A-7B) may comprise a computer software program or code, or another suitable program or set of instructions. The knowledge sharing and disambiguation tool 59 (see FIGS. 7A-7B) and process 59*a* (see FIGS. 7A-7B) may also comprise other suitable computer program instructions, such as embodied in computer software 82*c* (see FIG. 2) stored on the computer memory 70 (see FIG. 2) and accessible to the one or more computer(s) 62 (see FIG. 2) or the one or more processor device(s) 66 (see FIG. 2). The knowledge sharing and disambiguation tool 59 (see FIGS. 7A-7B) and process 59*a* (see FIGS. 7A-7B) may be used by an analyst, another user, or one or more separate automated systems, such as an automated computer program, system, device or apparatus, or may be automated via a suitable automated program or system.

The knowledge sharing and disambiguation tool 59 (see FIGS. 7A-7B) and process 59*a* (see FIGS. 7A-7B) is preferably in communication with the interface application 22 (see FIG. 1) and is coupled to the associative memory 28 (see FIG. 1) of the associative memory software 24 (see FIG. 1). The process 59*a* (see FIGS. 7A-7B) may be an automated process, may be a manual process, or a combination thereof. The knowledge sharing and disambiguation tool 59 (see FIGS. 7A-7B) and process 59*a* (see FIGS. 7A-7B) is coupled to the associative memory 28 (see FIGS. 7A-7B) and is configured to perform using the input 15 (see FIG. 1) into the associative memory 28 (see FIGS. 1, 7A-7B).

As shown in FIGS. 7A-7B, the process 59*a* for implementing the knowledge sharing and disambiguation tool 59 comprises step 158*a* of reviewing, such as by the analyst, a source record 144, such as a sparse source record 144*a*, that has minimal information 88*a* about a condition 146*a*, for example, a leak condition—"observed leaking".

As shown in FIGS. 7A-7B, the process 59*a* further comprises step 158*b* of making a query input 15*a* to the associative memory 28 using the minimal information 88*b* of the sparse source record 144*a*. Step 158*b* (see FIGS. 7A-7B) may be performed by input of an input query 15*a* (see FIG. 1) into the associative memory 28 (see FIG. 7A).

As shown in FIGS. 7A-7B, the process 59*a* further comprises step 158*c* of the associative memory 28 generating a set of matching records 148 for matching conditions 146*b*, such as leak conditions, for which, because of the sparse nature of the source record 144, such as sparse source record 144*a*, returned information 88*b* for the matching conditions 146*b*, may or may not be similar to the condition 146*a*. The source record 144 (see FIGS. 7A-7B), such as the sparse source record 144*a* (see FIGS. 7A-7B), does not contain enough information 88 (see FIGS. 7A-7B) to assess results similarity.

The one or more individual areas 28*c* (see FIG. 1) within the associative memory 28 (see FIG. 7A), requiring one or more troubleshooting actions 20 (see FIG. 1) to improve the accuracy 12 (see FIG. 1) of the one or more individual areas 28*c* (see FIG. 1) may comprise the source record 144 (see FIGS. 7A-7B), such as the sparse source record 144*a* (see FIGS. 7A-7B).

The associative memory 28 (see FIGS. 7A-7B) generates results 50 (see FIGS. 7A-7B) based upon the amount of detail present in the source record 144 (see FIGS. 7A-7B), such as the sparse source record 144*a* (see FIGS. 7A-7B). If the source record 144 (see FIGS. 7A-7B) is sparse, in that minimal information 88*a* (see FIGS. 7A-7B) is present to utilize for comparison, then (see FIGS. 7A-7B) inadequately correlated results 50*e* (see FIGS. 7A-7B) may be generated. The more information the source record 144 (see FIGS. 7A-7B), such as the sparse source record 144*a* (see FIGS. 7A-7B), has, the better correlated will be the results 50 (see FIGS. 7A-7B) returned by the associative memory 28 (see (see FIGS. 7A-7B).

As shown in FIGS. 7A-7B, the knowledge sharing and disambiguation tool 59 uses a dedicated notes field 40, which is a field 36 (see FIG. 1) in a record 90, such as source record 144. The dedicated notes field 40 (see FIGS. 7A-7B) is preferably configured to be filled with notes text 40*a* (see FIGS. 7A-7B) by an analyst, a user, one or more separate automated systems or programs, or another suitable user or operator or automated system or program with subject matter knowledge.

As shown in FIG. 7A, the process 59*a* further comprises step 158*d* of providing entered information 150, in the form of additional information 150*a*, into the dedicated notes field 40, about the source record 144, such as the sparse source record 144*a*. Preferably, the analyst with subject-matter knowledge about the source record 144 (see FIG. 7A), such as the sparse source record 144*a* (see FIG. 7A), provides the additional information 150*a* (e.g., "Valve cover gasket leaking oil, replaced valve cover gasket" (see FIG. 7A)). The additional information 150*a* (see FIG. 7A) added to the dedicated notes field 40 (see FIG. 7A) specifically addresses additional conditions 146*c* (see FIG. 7A), such as leak conditions associated with the valve cover gasket leaking condition.

As shown in FIG. 7A, the process 59*a* further comprises step 158*e* of storing in the associative memory 28, an enhanced source record 144*b* comprising the source record 144, such as the sparse source record 144*a*, with original text 151 enhanced with the notes text 40*a* of the entered information 150, in the form of additional information 150*a*, added to the dedicated notes field 40.

As shown in FIG. 7A, the process 59*a* further comprises step 158*f* of making a query input 15*a* to the associative memory 28 now using the enhanced source record 144*b* in the associative memory 28. The query input step 158*f* may happen simultaneously or substantially simultaneously, with the storing step 158*e*, or the query input step 158*f* may be performed at a later time after the storing step 158*e*.

As shown in FIG. 7A, the process 59*a* further comprises step 158*g*, where the associative memory 28 generates highly-correlated results 50*f* with results processing 50*b*, and the knowledge sharing and disambiguation tool 59 and process 59*a* report, via displays of the interface application 22 (see FIG. 1) and/or the application programming interface (API) 26 (see FIG. 1), the highly-correlated results 50*f* in the form of records report 90*a*. The highly-correlated results 50*f* (see FIG. 7A) are based on the enhanced source record 144*b* (see FIG. 7A) comprising the source record 144 (see FIG. 7A), such as the sparse source record 144*a* (see FIG. 7A), with original text 151 (see FIG. 7A) enhanced with the notes text 40*a* (see FIG. 7A) of the entered information 150 (see FIG. 7A), in the form of additional information 150*a* (see FIG. 7A), added to the dedicated notes field 40 (see FIG. 7A). The highly-correlated results 50*f* (see FIG. 7A) specifically address additional conditions 146*c* (see FIG. 7A) associated with the valve cover gasket leaking condition noted in the dedicated notes field 40 (see FIG. 7A). The highly-correlated results 50*f* (see FIG. 7A) comprise matching records after including notes text 152 (see FIG. 7A), such as in the form of a combination 152*a* (see FIG. 7A) of notes text 40*a* (see FIG. 7A) and original text 151 (see FIG. 7A).

FIG. 7B shows another capability of the knowledge sharing and disambiguation tool 59 and process 59*a* involving part numbers 154. As shown in FIG. 7B, step 158*c* of the process 59a comprises the associative memory 28 generating the set of matching records 148 for matching conditions 146b, such as leak conditions, with part numbers 154 (e.g., "Part A1234" and "Part B5678") in the returned information 88b from the associative memory 28 (see FIG. 7B).

As shown in FIG. 7B, step 158d of the process 59a comprises providing entered information 150, in the form of clarifying information 150b, to the dedicated notes field 40, about the source record 144 (see FIG. 7B), such as the sparse source record 144a (see FIG. 7B). Preferably, the analyst, such as an analyst with subject-matter knowledge about the source record 144 (see FIG. 7B), such as the sparse source record 144a (see FIG. 7B), provides the clarifying information 150b (see FIG. 7B) (e.g., "Part A1234 superseded by Part B5678" (see FIG. 7B)). The analyst knows that one part number 154 (see FIG. 7B) (e.g., "Part A1234"), has been superseded by another part number 154 (see FIG. 7B) (e.g., "Part B5678"), and indicates this in the dedicated notes field 40 (see FIG. 7B).

As shown in FIG. 7B, step 158g of the process 59a comprises the associative memory 28 generating highly-correlated results 50f with results processing 50b, and the knowledge sharing and disambiguation tool 59 and process 59a reporting, via displays of the interface application 22 (see FIG. 1) and/or the application programming interface (API) 26 (see FIG. 1), the highly-correlated results 50f in the form of records report 90a. The highly-correlated results 50f (see FIG. 7B) are based on the enhanced source record 144b (see FIG. 7B) comprising the source record 144 (see FIG. 7B), such as the sparse source record 144a (see FIG. 7B), with original text 151 (see FIG. 7B) enhanced with the notes text 40a (see FIG. 7B) of the entered information 150 (see FIG. 7B), in the form of clarifying information 150b (see FIG. 7B), added to the dedicated notes field 40 (see FIG. 7B).

In FIG. 7B, the text of the highly-correlated results 50f indicates that the new "Part Number B5678" is now known as an "oil collector" (it was previously known as an "oil pan" as "Part Number A1234"). As shown in FIG. 7B, because the dedicated notes field 40 fills in this missing knowledge, the associative memory 28 is able to associate the "oil pan" and "oil collector" records as being equivalent to each other, groups those respective records next to each other, and places those records at the top of the highly-correlated results 50f.

The knowledge sharing and disambiguation tool 59 (see FIGS. 7A-7B) and process 59a (see FIGS. 7A-7B) enable the analyst to identify a group of clustered information 153 (see FIGS. 7A-7B) using the dedicated notes field 40 (see FIGS. 7A-7B), wherein the dedicated notes field 40 (see FIGS. 7A-7B) provides the source records 144 (see FIGS. 7A-7B) utilized for assigning relevance between the information in the group of clustered information 153 (see FIGS. 7A-7B). The analyst can add source records 144 (see FIGS. 7A-7B) to the dedicated notes field 40 (see FIGS. 7A-7B), enabling a renewed focused cluster of related information 153a (see FIGS. 7A-7B) based on the source records 144 (see FIGS. 7A-7B) in the dedicated notes field 40 (see FIGS. 7A-7B). The renewed focused cluster of related information 153a (see FIGS. 7A-7B) may be provided to the analyst, enabling the analyst to identify the group of renewed focused cluster of related information 153a (see FIGS. 7A-7B) relevance to the source records 144 (see FIGS. 7A-7B) in the dedicated notes field 40 (see FIGS. 7A-7B).

Because the entered information 150 (see FIGS. 7A-7B) in the dedicated notes field 40 (see FIGS. 7A-7B) is stored and contained within the associative memory 28 (see FIG. 1), the analyst is able to utilize the knowledge sharing and disambiguation tool 59 (see FIGS. 7A-7B) and process 59a (see FIGS. 7A-7B) to disambiguate records 90 (see FIGS. 7A-7B), such as, where additional information 150a (see FIG. 7A) exists, provide the additional information 150a (see FIG. 7A) to the sparse source record 144a (see FIG. 7A) that enables the associative memory 28 (see FIG. 7A) to better identify similar records 90d (see FIG. 7A) within the associative memory 28 (see FIG. 7A), and to provide clarifying information 150b (see FIG. 7B) to match an older record 156a (see FIG. 7B) with a superseding record 156b (see FIG. 7B).

The knowledge sharing and disambiguation tool 59 (see FIGS. 7A-7B) and process 59a (see FIGS. 7A-7B) enable identification of information 88 (see FIG. 1) (by the analyst) that is relevant to the way in which a record 90 (see FIGS. 7A-7B) or groups of similar records 90d (see FIGS. 7A-7B) in the associative memory 28 (see FIGS. 7A-7B) were scored or classified. This enables relevant records to be scored in a consistent manner in order to ensure that downstream systems 139 (see FIG. 5A) using the scored data correspondingly have consistent information to utilize in downstream processes associated with the downstream systems 139 (see FIG. 5A).

The knowledge sharing and disambiguation tool 59 (see FIGS. 7A-7B) and process 59a (see FIGS. 7A-7B) are designed to be used in circumstances where not enough information is present in a given source record 144 (see FIGS. 7A-7B), such as the sparse source record 144a (see FIGS. 7A-7B), for the associative memory 28 (see FIGS. 7A-7B) to produce relevant and highly-correlated similarity matches from the rest of the records 90 (see FIGS. 7A-7B) in the data set 16i (see FIGS. 7A-7B).

The knowledge sharing and disambiguation tool 59 (see FIGS. 7A-7B) and process 59a (see FIGS. 7A-7B) provide a way to add information 88 (see FIG. 1) to the source record 144 (see FIGS. 7A-7B), such as the sparse source record 144a (see FIGS. 7A-7B), in order to provide the associative memory 28 (see FIGS. 7A-7B) the ability to identify similar records 90d (see FIGS. 7A-7B) from the associative memory's 28 (see FIGS. 7A-7B) data set 16i (see FIGS. 7A-7B). With the additional knowledge, the associative memory 28 (see FIGS. 7A-7B) preferably produces improved and a greater amount of similar results in the records the associative memory 28 (see FIGS. 7A-7B) returns.

Thus, where the at least one troubleshooting tool 51 (see FIG. 1) comprises the knowledge sharing and disambiguation tool 59 (see FIGS. 7A-7B), the one or more individual areas 28c (see FIG. 1) preferably comprise the sparse source record 144a (see FIGS. 7A-7B). The knowledge sharing and disambiguation tool 59 (see FIGS. 7A-7B) is preferably configured to report the records report 90a (see FIGS. 7A-7B) of highly-correlated results 50f (see FIGS. 7A-7B) based on the enhanced source record 144b (see FIGS. 7A-7B) comprising the sparse source record 144a (see FIGS. 7A-7B) with original text 151 (see FIGS. 7A-7B) enhanced with the notes text 40a (see FIGS. 7A-7B) of additional information 150a (see FIG. 7A) or clarifying information 150b (see FIG. 7B) added to the dedicated notes field 40 (see FIGS. 7A-7B) in the record 90 (see FIGS. 7A-7B).

The knowledge sharing and disambiguation tool 59 (see FIGS. 7A-7B) enables the computer implemented data driven classification and troubleshooting system 10 (see FIG. 1) to perform, the one or more troubleshooting actions 20 (see FIG. 1) comprising disambiguating the record 90 (see FIGS. 7A-7B) by providing the additional information 150*a* (see FIG. 7A) to the sparse source record 144*a* (see FIGS. 7A-7B) to enable the associative memory 28 (see FIGS. 7A-7B) to better identify similar records 90*d* (see FIGS. 7A-7B) within the associative memory 28 (see FIGS. 7A-7B), and to provide clarifying information 150*b* (see FIG. 7B) to match the older record 156*a* (see FIG. 7B) with the superseding record 156*b* (see FIG. 7B).

Figure 8:
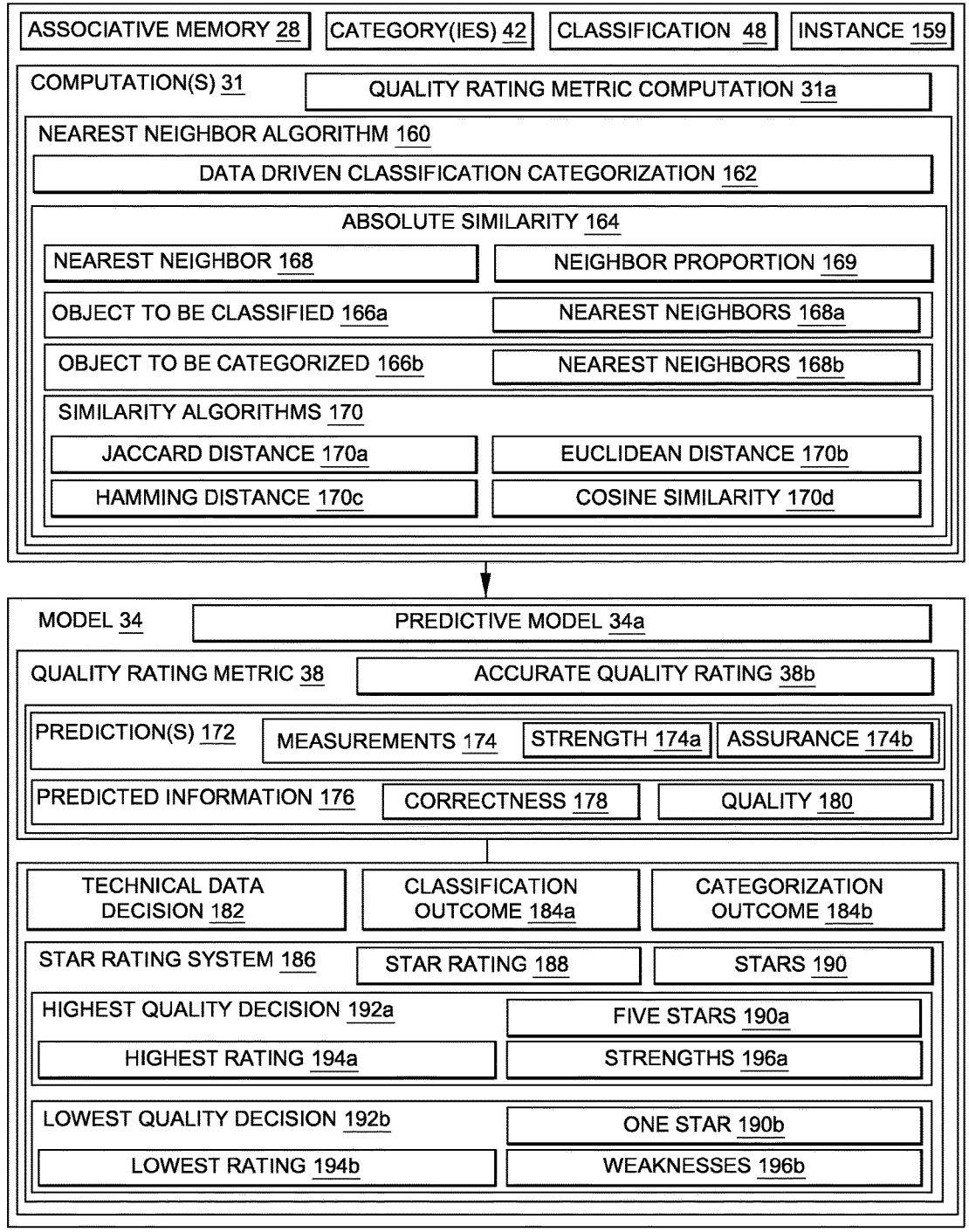
FIG. 8 is an illustration of a functional block diagram showing a quality rating metric and computing process that may be included and used in one or more embodiments of the computer implemented data driven classification and troubleshooting system of the disclosure.

Referring now to FIG. 8, the computer implemented data driven classification and troubleshooting system 10 (see FIG. 1) may further comprise a quality rating metric (QRM) 38 and a quality rating metric computation 31*a*. FIG. 8 is an illustration of a functional block diagram showing the quality rating metric 38 and quality rating metric computation 31*a* that may be included and used in one or more embodiments of the computer implemented data driven classification and troubleshooting system 10 (see FIG. 1) of the disclosure.

The quality rating metric 38 (see FIG. 8) and the quality rating metric computation 31*a* (see FIG. 8) may comprise a computer software program or code, or another suitable program or set of instructions. The quality rating metric 38 (see FIG. 8) and a quality rating metric computation 31*a* (see FIG. 8) may also comprise other suitable computer program instructions, such as embodied in computer software 82*c* (see FIG. 2) stored on the computer memory 70 (see FIG. 2) and accessible to the one or more computer(s) 62 (see FIG. 2) or the one or more processor device(s) 66 (see FIG. 2). The quality rating metric (QRM) 38 (see FIGS. 1, 8) and the quality rating metric (QRM) computation 31*a* (see FIGS. 1, 8) may be used by an analyst, a user, or one or more separate automated systems, such as an automated computer program, system, device or apparatus, or may be automated via a suitable automated program or system.

The quality rating metric (QRM) 38 (see FIG. 8) is preferably in communication with the interface application 22 (see FIG. 1) and is coupled to the associative memory 28 (see FIG. 1) of the associative memory software 24 (see FIG. 1). The quality rating metric (QRM) computation 31*a* (see FIG. 8) may be an automated process, may be a manual process, or a combination thereof. The quality rating metric (QRM) 38 (see FIG. 8) is coupled to the associative memory 28 (see FIG. 8) and is configured to perform using the input 15 (see FIG. 1) into the associative memory 28 (see FIGS. 1, 8).

The quality rating metric (QRM0 38 (see FIG. 8) and the quality rating metric (QRM) computation 31*a* (see FIG. 8) use the associative memory 28 (see FIG. 8) that uses a nearest neighbor algorithm 160 (see FIG. 8) to make a data driven classification categorization 162 (see FIG. 8). The quality rating metric 38 (see FIG. 8) is associated with correctness 178 (see FIG. 8) of prediction(s) 172 (see FIG. 8) by the model 34 (see FIG. 8), and in particular, is associated with measurements 174 (see FIG. 8) of a strength 174*a* (see FIG. 8) and an assurance 174*b* (see FIG. 8) that the prediction(s) 172 (see FIG. 8) is/are correct. An accurate quality rating 38*b* (see FIG. 8) determines whether predicted information 176 (see FIG. 8) is useful for technical data decisions 182 (see FIG. 8) or industry decisions.

The quality rating metric computation 31*a* (see FIG. 8) calculates a reliable and accurate quality rating 38*b* (see FIG. 8) of a classification outcome 184*a* (see FIG. 8) or a categorization outcome 184*b* (see FIG. 8). Each classification outcome 184*a* (see FIG. 8) or each categorization outcome 184*b* (see FIG. 8) preferably receives a star rating 188 (see FIG. 8) assigned where five (5) stars 190*a* (see FIG. 8) represents a highest quality decision 192*a* (see FIG. 8) with a highest rating 184*a* and greatest strengths 196*a* (see FIG. 8). In contrast, a star rating 188 (see FIG. 8) of one (1) star 190*b* (see FIG. 8) represents a lowest quality decision 192*b* (see FIG. 8) with a lowest rating 194*b* (see FIG. 8) and weaknesses 196*b* (see FIG. 8)

The quality rating metric computation 31*a* (see FIG. 8) computes an absolute similarity 164 (see FIG. 8) between an object to be classified 166*a* (see FIG. 8) and its nearest neighbors 168*a* (see FIG. 8), or an absolute similarity 164 (see FIG. 8) between an object to be categorized 166*b* (see FIG. 8) and its nearest neighbors 168*b* (see FIG. 8). To compute the absolute similarity 164 (see FIG. 8) one or more known similarity algorithms 170 (see FIG. 8) may be used, including, but not limited to, one or more of a group comprising Jaccard Distance 170*a* (see FIG. 8), Euclidean Distance 170*b* (see FIG. 8), Hamming Distance 170*c* (see FIG. 8), Cosine Similarity 170*d* (see FIG. 8), or another suitable similarity algorithm 170 (see FIG. 8), as long as the similarity value is from 0 (zero) to 1 (one). This provides a more reliable and accurate quality assessment of the classification 48 (see FIG. 8) or category 42 (see FIG. 8) (categorization).

A method to compute the quality rating metric 38 (see FIGS. 1, 8) for one or more predictions 172 of an associative memory 28 comprises using a nearest neighbor algorithm 160 (see FIG. 8), and making a data driven classification categorization 162 (see FIG. 8) of the associative memory 28 (see FIG. 8). The method further comprises calculating a quality rating metric 38 (see FIG. 8), assigning the calculated quality rating metric 38 (see FIG. 8) to the associative memory 28 (see FIG. 8), identifying a strength of correctness of a prediction 172 (see FIG. 8) associated with the associative memory 28 (see FIG. 8), and evaluating the prediction 172 of the associative memory 28 (see FIG. 8) with a technical data decision 182 (see FIG. 8) or industry decision using the assigned quality rating metric 38 (see FIG. 8).

As used herein, "classification", also referred to as "data classification" or "categorization", means the ability to identify which of a set of categories (or sub-populations) or group of objects (entity) a new observation or instance belongs to, and comparing it against a training data set containing instances or observations whose category membership is known or that contains preidentified characteristics. The preidentified characteristics or instances or observations whose category membership is known are used to train a model or a system, so the new observation or instance either identifies with one set or the other.

For example, with an email system, the computer implemented data driven classification and troubleshooting system 10 (see FIG. 1) may classify incoming email (i.e., a new observation) as either "retained" or "junk" email based on certain characteristics. The preidentified characteristics that make up each category (i.e., "retained" or "junk") are already known. For example, retained email typically comes from a recognized sender. Depending on the number of common matches, the computer implemented data driven classification and troubleshooting system 10 (see FIG. 1) will know where to place the incoming email. In the terminology of machine learning, a classification system is considered an example of supervised learning, i.e., learning where a training data set of correctly-identified observations is available.

As used herein, "instance" 159 (see FIG. 8) means single example of data 16 (see FIG. 1) or observation of data from which the model 34 (see FIG. 8) is learned or on which the model 34 (see FIG. 8) is used for prediction. The classification 48 (see FIG. 8) may be implemented by a classifier which may comprise an algorithm, a model 34 (see FIG. 1), or suitable instructions or functions that implement classification.

For calculating the nearest neighbor algorithm 160 (see FIG. 8), first, an instance 159 (see FIG. 8), or a new email needs to be assigned a classification 48 (see FIG. 8) or a category 42 (see FIG. 8). Based on the data 16 (see FIG. 1) contain in the instance 159 (see FIG. 8), or email, find similar entities, also referred to as neighbors. The model 34, such as the predictive model 34*a*, (or associative memory trained model) preferably performs this task. The neighbors found have already been assigned a classification 48 or a category 42 (junk or retain) by an expert. Based on the proportion of the categories of the neighbors, calculate the classification outcome 184*a* (see FIG. 8). For example, if there were 10 (ten) similar neighbors (emails) and 7 (seven) emails were junk emails and 3 (three) were retained, the classification outcome 184*a* (see FIG. 8) is determined to be "junk".

Next, the neighbor proportion 169 (see FIG. 8) of the classification 48 (see FIG. 8) may be calculated. For example, if there were 10 (ten) similar neighbors (emails) and 7 (seven) emails were junk emails and 3 (three) were retained, the neighbor proportion 169 (see FIG. 8) is 0.7. The absolute similarity 164 (see FIG. 8) between the new instance 159 (see FIG. 8) or email and the nearest neighbor may be calculated using a known similarity algorithms 170 (see FIG. 8) including, but not limited to, Jaccard Distance 170*a* (see FIG. 8), Euclidean Distance 170*b* (see FIG. 8), Hamming Distance 170*c* (see FIG. 8), and Cosine Similarity 170*d* (see FIG. 8), as long as the absolute similarity 164 (see FIG. 8) is between 0 to 1.

To calculate the quality rating metric 38 (see FIG. 8) the following formula may be used. (assume that the values are between 0 and 1)—the quality rating metric 38 (see FIG. 8) equals the neighbor proportion 169 (see FIG. 8) multiplied by the absolute similarity 164 (see FIG. 8). The quality rating metric 38 (see FIG. 8) may then be transformed and normalized into a star rating system 186.

As shown in FIG. 1, the computer implemented data driven classification and troubleshooting system 10 comprises the model 34, such as the predictive model 34*a* (see FIG. 8), that may be learned or trained using the associative memory software 24.

The quality rating metric 38 (see FIG. 8) and the quality rating metric computation 31*a* (see FIG. 8) makes a predictive model 34*a* (see FIG. 8) more efficient at cost savings and cost avoidance because it assures the correctness 178 (see FIG. 8) and quality 180 (see FIG. 8) of the information 88 (see FIG. 1), which may then be used to confidently make technical data decisions 182 (see FIG. 8) or industry decisions that may make or save money. The predicted information 176 (see FIG. 8) is only as effective as its quality and correctness.

In another embodiment there is provided a computer implemented data driven classification and troubleshooting system 10 (see FIG. 1) for troubleshooting an associative memory 28 (see FIG. 1). The computer implemented data driven classification and troubleshooting system 10 (see FIG. 1) comprises one or more computer(s) 62 (see FIG. 1) coupled to and enabling operation of an interface application 22 (see FIG. 1) and an associative memory software 24 (see FIG. 1) in communication with the interface application 22 (see FIG. 1), via an application programming interface (API) 26 (see FIG. 1). The interface application 22 (see FIG. 1) is enabled to receive data 16 (see FIG. 1). The associative memory software 24 (see FIG. 1) comprises an associative memory 28 (see FIG. 1) and a machine learning algorithm 30 (see FIG. 1).

The computer implemented data driven classification and troubleshooting system 10 (see FIG. 1) further comprises one or more individual area(s) 28*c* (see FIG. 1), within the associative memory 28 (see FIG. 1), requiring one or more troubleshooting actions 20 (see FIG. 1) to improve the accuracy 12 (see FIG. 1) of the one or more individual area(s) 28*c* (see FIG. 1). The computer implemented data driven classification and troubleshooting system 10 (see FIG. 1) further comprises a quality rating metric (QRM) 38 (see FIGS. 1, 8) that measures a strength 174*a* (see FIG. 8) and an assurance 174*b* (see FIG. 8) that one or more predictions 172 (see FIG. 8) of the associative memory 28 (see FIG. 1) are correct. The quality rating metric 38 (see FIG. 8) is equal to a neighbor proportion 169 (see FIG. 8) multiplied by an absolute similarity 164 (see FIG. 8) between an object to be classified 166*a* (see FIG. 8) and its nearest neighbors 168*a* (see FIG. 8), and is computed with a quality rating metric (QRM) computation 31*a* (see FIG. 8) using a nearest neighbor algorithm 160 (see FIG. 8) to make a data driven classification categorization 162 (see FIG. 8).

The computer implemented data driven classification and troubleshooting system 10 (see FIG. 1) further comprises a plurality of troubleshooting tools 51 (see FIG. 1) each enabled by the interface application 22 (see FIG. 1) and in communication with the associative memory 28 (see FIG. 1) via the application programming interface (API) 26 (see FIG. 1). The plurality of troubleshooting tools 51 (see FIG. 1) enable or perform the one or more troubleshooting actions 20 (see FIG. 1) and comprise: a rating and similarity based troubleshooting tool 52 (see FIG. 3) configured to report the one or more individual areas 28*c* (see FIG. 3) as a records report 90*a* (see FIG. 3) having a records breakdown 90*b* (see FIG. 3) by one or more QRM (quality rating metric) range values 94 (see FIG. 3), each having a corresponding accuracy percentage (%) 92 (see FIG. 3), and a corresponding record count 90*c* (see FIG. 3), and a correct record count 90*e* (see FIG. 3), configured to identify the one or more QRM (quality rating metric) range values 94 (see FIG. 3) including QRM range values 94 (see FIG. 3) corresponding to a below-threshold accuracy percentage (%) 92*a* (see FIG. 3), configured to identify one or more QRM (quality rating metric) range values 94 (see FIG. 3) to troubleshoot, and configured to provide through use of the associative memory 28 (see FIG. 3) an ability to recognize similar records 90*d* (see FIG. 3) to bulk edit collections of the similar records 90*d* (see FIG. 3).

The computer implemented data driven classification and troubleshooting system 10 (see FIG. 1) further comprises a classification mismatch troubleshooting tool 54 (see FIG. 4) configured to report the one or more individual areas 28*c* (see FIG. 4) as a records report 90*a* (see FIG. 4) having a records breakdown 90*b* (see FIG. 4) demarcated by high error counts 109 (see FIG. 4) in the individual classifications 48*c* (see FIG. 4), comparing an entered classification 48*a* (see FIG. 4), such as an entered item code 49*a* (see FIG. 4), to the associative memory generated classification 48*b* (see FIG. 4), such as the associative memory generated item code 49*b* (see FIG. 4), by values 44 (see FIG. 4) and quantity 112 (see FIG. 4) of corresponding record counts 90*c* (see FIG. 4), to identify how many system records 90 (see FIG. 4) fall into a classification comparison grouping 110 (see FIG. 4), and to provide an ability to target combinations of mismatches 110*a* (see FIG. 4) between the entered classification 48a (see FIG. 4) and the associative memory generated classification 48b (see FIG. 4).

The computer implemented data driven classification and troubleshooting system 10 (see FIG. 1) further comprises a category based troubleshooting tool 56 (see FIG. 5A) configured to report the one or more individual areas 28c (see FIG. 5A) as a notional data set 116 (see FIG. 5A), to generate one or more buckets of data 118b (see FIG. 5A) from the notional data set 116 (see FIG. 5A), and to make the one or more buckets of data 118b (see FIG. 5A) available in a database 21 (see FIG. 5A) configured to be queried by standard SQL (Structured Query Language) queries 138 (see FIG. 5A).

The computer implemented data driven classification and troubleshooting system 10 (see FIG. 1) further comprises a domain vocabulary troubleshooting tool 58 (see FIG. 6) configured to enable viewing of associative memories 32 (see FIG. 6) in one or more associative memory clusters 28b (see FIG. 6), to report referenced source records 90i (see FIG. 6) in a records breakdown 90b (see FIG. 6), to identify additional relevant source code texts 140d (see FIG. 6), to expand the domain vocabulary 46 (see FIG. 6), and to enable an enhanced clustering of associative memories 32 (see FIG. 6) based on the additional relevant source code texts 140d (see FIG. 6).

The computer implemented data driven classification and troubleshooting system 10 (see FIG. 1) further comprises a knowledge sharing and disambiguation tool 59 (see FIGS. 7A-7B) configured to report a records report 90a (see FIGS. 7A-7B) of highly-correlated results 50f (see FIGS. 7A-7B) based on an enhanced source record 144b (see FIGS. 7A-7B) comprising a source record 144 (see FIGS. 7A-7B), such as a sparse source record 144a (see FIGS. 7A-7B), with original text 151 (see FIGS. 7A-7B) enhanced with a notes text 40a (see FIGS. 7A-7B) of additional information 150a (see FIG. 7A) or clarifying information 150b (see FIG. 7B) added to a dedicated notes field 40 (see FIGS. 7A-7B) in a record 90 (see FIGS. 7A-7B).

Figure 9:
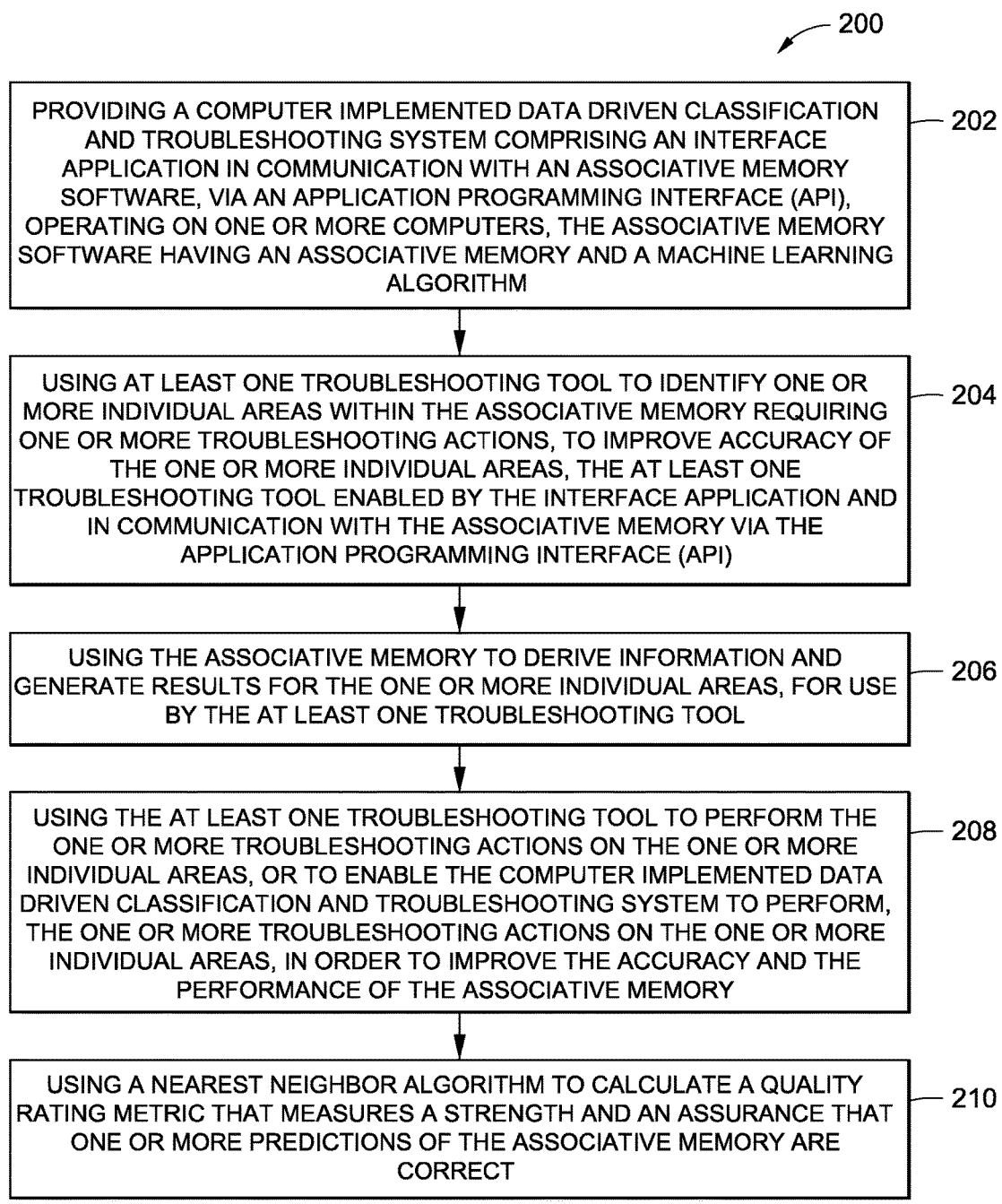
FIG. 9 is an illustration of a block flow diagram showing an exemplary embodiment of a method of the disclosure.

Referring to FIG. 9, in another embodiment, there is provided a method 200 for improving accuracy 12 (see FIG. 1) and performance 14 (see FIG. 1) of an associative memory 28 (see FIG. 1). FIG. 9 is an illustration of a block flow diagram showing an exemplary embodiment of the method 200 of the disclosure.

As shown in FIG. 9, the method 200 comprises step 202 of providing a computer implemented data driven classification and troubleshooting system 10 (see FIG. 1) comprising an interface application 22 (see FIG. 1) in communication with an associative memory software 24 (see FIG. 1), via an application programming interface (API) 26, operating on one or more computer(s) 62 (see FIG. 1). The associative memory software 24 (see FIG. 1) has an associative memory 28 (see FIG. 1) and a machine learning algorithm 30 (see FIG. 1).

As shown in FIG. 9, the method 200 further comprises step 204 of using at least one troubleshooting tool 51 (see FIG. 1) to identify one or more individual areas 28c (see FIG. 1) within the associative memory 28 (see FIG. 1), requiring one or more troubleshooting actions 20 (see FIG. 1), to improve accuracy 12 (see FIG. 1) of the one or more individual areas 28c (see FIG. 1). The at least one troubleshooting tool 51 (see FIG. 1) is enabled by the interface application 22 (see FIG. 1) and in communication with the associative memory 28 (see FIG. 1), via the application programming interface (API) 26 (see FIG. 1).

The step 204 (see FIG. 9) of using the at least one troubleshooting tool 51 (see FIG. 1) to identify the one or more individual areas 28c (see FIG. 1) comprises using the at least one troubleshooting tool 51 (see FIG. 1) to identify the one or more individual areas 28c (see FIG. 1) comprising at least one of a plurality of effects 98 (see FIG. 3) associated with a cause 99 (see FIG. 3); records 90 (see FIG. 3) with one or more QRM (quality rating metric) range values 94 (see FIG. 3), including QRM range values 94 (see FIG. 30 corresponding to records 90 (see FIG. 3) with a below-threshold accuracy percentage (%) 92a (see FIG. 3); individual classifications 48c (see FIG. 4) demarcated by high error counts 109 (see FIG. 4); a plurality of categories 42 (see FIG. 5A) and values 44 (see FIG. 5A) that have been previously categorized; a plurality of associative memory clusters 28b (see FIG. 6); a domain vocabulary 46 (see FIG. 6); and a sparse source record 144a (see FIG. 7A).

The step 204 (see FIG. 9) of using the at least one troubleshooting tool 51 (see FIG. 1) to identify one or more individual areas 28c (see FIG. 1) further comprises using a rating and similarity based troubleshooting tool 52 (see FIG. 3) to identify the plurality of effects 98 (see FIG. 3) associated with the cause 99 (see FIG. 3) and to identify records 90 (see FIG. 3) with the one or more QRM (quality rating metric) range values 94 (see FIG. 3), including QRM range values 94 (see FIG. 3) corresponding to records 90 (see FIG. 3) with the below-threshold accuracy percentage (%) 92a (see FIG. 3). The rating and similarity based troubleshooting tool 52 (see FIG. 3) reports a records breakdown 90b (see FIG. 3) by the one or more QRM range values 94 (see FIG. 3), each having a corresponding accuracy percentage (%) 92 (see FIG. 3) and a corresponding record count 90c (see FIG. 3), identifying the one or more QRM range values 94 (see FIG. 3), including QRM range values 94 (see FIG. 3) corresponding to the below-threshold accuracy percentage (%) 92a (see FIG. 3), identifying one or more QRM range values 94 (see FIG. 3) and records 90 (see FIG. 3) to troubleshoot, and providing through use of the associative memory 28 (see FIG. 3) an ability to recognize similar records 90d (see FIG. 3) to bulk edit collections of the similar records 90d (see FIG. 3).

The step 204 (see FIG. 9) of using the at least one troubleshooting tool 51 (see FIG. 1) to identify one or more individual areas 28c (see FIG. 1) further comprises using a classification mismatch troubleshooting tool 54 (see FIG. 4) to identify individual classifications 48c (see FIG. 4) demarcated by high error counts 109 (see FIG. 4). The classification mismatch troubleshooting tool 54 (see FIG. 4) reports a records breakdown 90b (see FIG. 4) demarcated by high error counts 109 (see FIG. 4) in the individual classifications 48c (see FIG. 4), comparing an entered classification 48a (see FIG. 4) to the associative memory generated classification 48b (see FIG. 4), by values 44 (see FIG. 4) and quantity 112 (see FIG. 4) of corresponding record counts 90c (see FIG. 4), identifying how many system records 90 (see FIG. 4) fall into a classification comparison grouping 110 (see FIG. 4), and providing an ability to target combinations of mismatches 110a (see FIG. 4) between the entered classification 48a (see FIG. 4) and the associative memory generated classification 48b (see FIG. 4).

The step 204 (see FIG. 9) of using the at least one troubleshooting tool 51 (see FIG. 1) to identify one or more individual areas 28c (see FIG. 1) further comprises using a category based troubleshooting tool 56 (see FIGS. 5A-5B) to report a plurality of categories 42 (see FIGS. 5A-5B) and values 44 (see FIGS. 5A-5B) that have been previously categorized, as a notional data set 116 (see FIGS. 5A-5B), to generate one or more buckets of data 118b (see FIGS. 5A-5B) from the notional data set 116 (see FIGS. 5A-5B), and to make the one or more bucket(s) of data 118*b* (see FIGS. 5A-5B) available in a database 21 (see FIG. 5A) configured to be queried by standard SQL (Structured Query Language) queries 138 (see FIG. 5A).

The step 204 (see FIG. 9) of using the at least one troubleshooting tool 51 (see FIG. 1) to identify one or more individual areas 28*c* (see FIG. 1) comprises using a domain vocabulary troubleshooting tool 58 (see FIG. 6) enabling viewing of associative memories 32 (see FIG. 6) in a plurality of associative memory clusters 28*b* (see FIG. 6), to report referenced source records 90*i* (see FIG. 6) in a records breakdown 90*b* (see FIG. 6), identifying additional relevant source code texts 140*d* (see FIG. 6), expanding a domain vocabulary 46 (see FIG. 6), and enabling an enhanced clustering of associative memories 32 (see FIG. 6) based on the additional relevant source code texts 140*d* (see FIG. 6).

The step 204 (see FIG. 9) of using the at least one troubleshooting tool 51 (see FIG. 1) to identify one or more individual areas 28*c* (see FIG. 1) comprises using a knowledge sharing and disambiguation tool 59 (see FIG. 7A) to report a records report 90*a* (see FIG. 3) of highly-correlated results 50*f* (see FIG. 7A) based on an enhanced source record 144*b* (see FIG. 7A) comprising a source record 144 (see FIG. 7A), such as a sparse source record 144*a* (see FIG. 7A), with original text 151 (see FIG. 7A) enhanced with a notes text 40*a* (see FIG. 7A) of additional information 150*a* (see FIG. 7A) or clarifying information 150*b* (see FIG. 7B) added to a dedicated notes field 40 (see FIG. 7A) in a record 90 (see FIG. 7A).

As shown in FIG. 9, the method 200 further comprises step 206 of using the associative memory 28 (see FIG. 1) to derive information 88 (see FIG. 1) and generate results 50 (see FIG. 1) for the one or more individual area(s) 28*c* (see FIG. 1), for use by the at least one troubleshooting tool 51 (see FIG. 1).

As shown in FIG. 9, the method 200 further comprises step 208 of using the at least one troubleshooting tool 51 (see FIG. 1) to perform the one or more troubleshooting actions 20 (see FIG. 1) on the one or more individual area(s) 28*c* (see FIG. 1), or enabling the computer implemented data driven classification and troubleshooting system 10 (see FIG. 1) to perform the one or more troubleshooting actions 20 (see FIG. 1) on the one or more individual area(s) 28 (see FIG. 1), in order to improve the accuracy 12 (see FIG. 1) and the performance 14 (see FIG. 1) of the associative memory 28 (see FIG. 1).

The step 208 (see FIG. 9) of using the at least one troubleshooting tool 51 (see FIG. 1) to perform the one or more troubleshooting actions 20 (see FIG. 1) further comprises enabling the computer implemented data driven classification and troubleshooting system 10 (see FIG. 1) to perform the one or more troubleshooting actions 20 (see FIG. 1) comprising changing mismatched values 44*b* (see FIG. 3) to matched values 44*a* (see FIG. 3) in the records 90 (see FIG. 3) and updating the associative memory 28 (see FIG. 3) with updated results 50*d* (see FIG. 3) of the records 90 (see FIG. 3) that are changed.

The step 208 (see FIG. 9) of using the at least one troubleshooting tool 51 (see FIG. 1) to perform the one or more troubleshooting actions 20 (see FIG. 1) further comprises enabling the computer implemented data driven classification and troubleshooting system 10 (see FIG. 1) to perform the one or more troubleshooting actions 20 (see FIG. 1) comprising manually correcting the records 90 (see FIG. 1) where there is a mismatch 110*a* (see FIG. 4) between the entered classification 48*a* (see FIG. 4) and the associative memory generated classification 48*b* (see FIG. 4), and the entered classification 48*a* (see FIG. 4) is incorrect, and manually correcting the records 90 (see FIG. 4) where there is a mismatch 110*a* (see FIG. 4) between the entered classification 48*a* (see FIG. 4) and the associative memory generated classification 48*b* (see FIG. 4), and both the entered classification 48*a* (see FIG. 4) and the associative memory generated classification 48*b* (see FIG. 4) are incorrect.

The step 208 (see FIG. 9) of using the at least one troubleshooting tool 51 (see FIG. 1) to perform the one or more troubleshooting actions 20 (see FIG. 1) comprises enabling the computer implemented data driven classification and troubleshooting system 10 (see FIG. 1) to perform the one or more troubleshooting actions 20 (see FIG. 1) comprising using the standard SQL query(ies) 138 (see FIG. 5A) to generate bucket label values 44*c* (see FIG. 5B) that indicate problems 18 (see FIG. 1) in the associative memory 28 (see FIG. 1), and to provide links 135 (see FIG. 5A) to affected records 90 (see FIG. 5A) for investigation, and establishing a tuning priority 29*a* (see FIG. 5A) based on total number 126 (see FIG. 5A) of records 90 (see FIG. 5A) in the one or more buckets of data 118*b* (see FIG. 5A).

The step 208 (see FIG. 9) of using the at least one troubleshooting tool 51 (see FIG. 1) to perform the one or more troubleshooting actions 20 (see FIG. 1) comprises enabling the computer implemented data driven classification and troubleshooting system 10 (see FIG. 1) to perform the one or more troubleshooting actions 20 (see FIG. 1) comprising identifying which referenced source records 90*i* (see FIG. 6) from the associative memory 28 (see FIG. 6) had at least one domain vocabulary match 143*a* (see FIG. 6) of a term 140*a* (see FIG. 6) or phrase 140*b* (see FIG. 6) from the domain vocabulary 46 (see FIG. 6) that occurred in the associative memory 28 (see FIG. 6), and which referenced source records 90*i* (see FIG. 6) had a domain vocabulary no match 143*b* (see FIG. 6) of the term 140*a* (see FIG. 6) or phrase 140*b* (see FIG. 6) from the domain vocabulary 46 (see FIG. 6) that occurred in the associative memory 28 (see FIG. 6).

The step 208 (see FIG. 9) of using the at least one troubleshooting tool 51 (see FIG. 1) to perform the one or more troubleshooting actions 20 (see FIG. 1) comprises enabling the computer implemented data driven classification and troubleshooting system 10 (see FIG. 1) to perform the one or more troubleshooting actions 20 (see FIG. 1) comprising disambiguating the record 90 (see FIG. 7A) by providing the additional information 150*a* (see FIG. 7A) to the sparse source record 144*a* (see FIG. 7A) to enable the associative memory 28 (see FIG. 7A) to better identify similar records 90*d* (see FIG. 7A) within the associative memory 28 (see FIG. 7A), and providing clarifying information 150*b* (see FIG. 7B) to match an older record 156*a* (see FIG. 7B) with a superseding record 156*b* (see FIG. 7B).

As shown in FIG. 9, the method 200 further comprises step 210 of using a nearest neighbor algorithm 160 (see FIG. 8) to calculate a quality rating metric (QRM) 38 (see FIG. 8) that measures a strength 174*a* (see FIG. 8) and an assurance 174*b* (see FIG. 8) that one or more predictions 172 (see FIG. 8) of the associative memory 28 (see FIG. 8) are correct.

The step 210 (see FIG. 9) of using the nearest neighbor algorithm 160 (see FIG. 8) to calculate the quality rating metric 38 (see FIG. 8) further comprises making a data driven classification categorization 162 (see FIG. 8) of the associative memory 28 (see FIG. 8). The data driven classification categorization 162 (see FIG. 8) is further based on an absolute similarity 164 (see FIG. 8) between the associative memory 28 (see FIG. 8) and its nearest neighbors 168 (see FIG. 8).

The step 210 (see FIG. 9) of using the nearest neighbor algorithm 160 (see FIG. 8) to calculate the quality rating metric 38 (see FIG. 8) further comprises computing the absolute similarity 164 (see FIG. 8) using one or more similarity algorithms 170 (see FIG. 8) selected from a group comprising Jaccard Distance 170a (see FIG. 8), Euclidean Distance 170b (see FIG. 8), Hamming Distance 170c (see FIG. 8), Cosine Similarity 170d (see FIG. 8), or another suitable similarity algorithm 170 (see FIG. 8).

Figure 10:
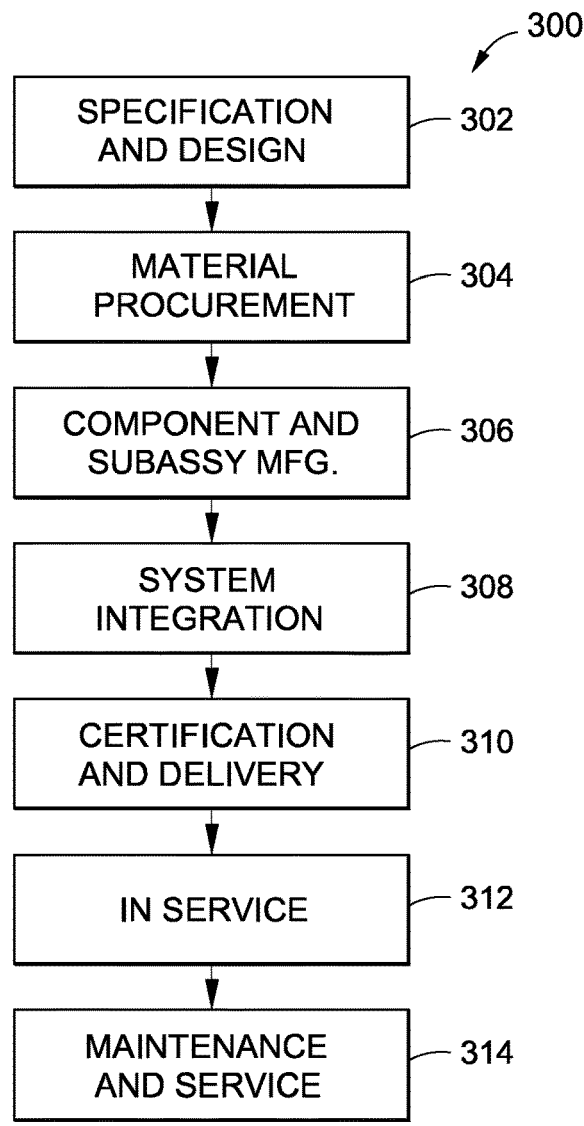
FIG. 10 a flow diagram of an aircraft manufacturing and service method; and, FIG. 11 is an illustration of a block diagram of an aircraft.
Figure 11:
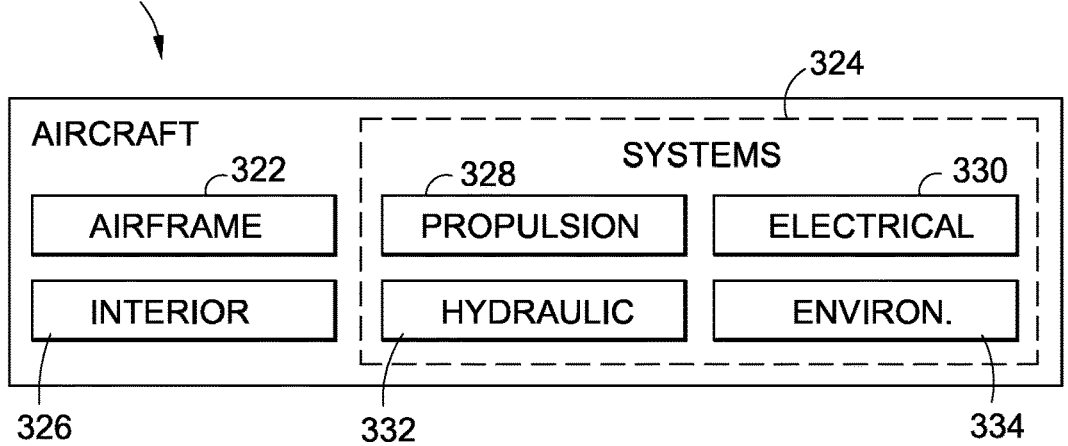

FIG. 10 is an illustration of a flow diagram of an aircraft manufacturing and service method 300. FIG. 11 is an illustration of a block diagram of an aircraft 320. Referring to FIGS. 10-11, embodiments of the disclosure may be described in the context of the aircraft manufacturing and service method 300, as shown in FIG. 10, and the aircraft 320, as shown in FIG. 11.

During pre-production, exemplary aircraft manufacturing and service method 300 may include specification and design 302 of the aircraft 320 and material procurement 304. During manufacturing, component and subassembly manufacturing 306 and system integration 308 of the aircraft 320 takes place. Thereafter, the aircraft 320 may go through certification and delivery 310 in order to be placed in service 312. While in service 312 by a customer, the aircraft 320 may be scheduled for routine maintenance and service 314 (which may also include modification, reconfiguration, refurbishment, and other suitable services).

Each of the processes of exemplary aircraft manufacturing and service method 300 may be performed or carried out by a system integrator, a third party, and/or an operator (e.g., a customer). For the purposes of this description, a system integrator may include, without limitation, any number of aircraft manufacturers and major-system subcontractors. A third party may include, without limitation, any number of vendors, subcontractors, and supplier. An operator may include, without limitation, an airline, leasing company, military entity, service organization, and other suitable operators.

As shown in FIG. 11, the aircraft 320 produced by exemplary aircraft manufacturing and service exemplary method 300 may include an airframe 322 with a plurality of systems 324 and an interior 326. Examples of the plurality of systems 324 may include one or more of a propulsion system 328, an electrical system 330, a hydraulic system 332, and an environmental system 334. Any number of other systems may be included. Although an aerospace example is shown, the principles of the disclosure may be applied to other industries, such as the automotive industry, the trucking industry, the watercraft industry such as for ships and submarines, the warehouse industry, and other suitable industries.

Methods and systems embodied herein may be employed during any one or more of the stages of the exemplary aircraft manufacturing and service method 300. For example, components or subassemblies corresponding to component and subassembly manufacturing 306 may be fabricated or manufactured in a manner similar to components or subassemblies produced while the aircraft 320 is in service 312. Also, one or more apparatus embodiments, method embodiments, or a combination thereof, may be utilized during component and subassembly manufacturing 306 and system integration 308, for example, by substantially expediting assembly of or reducing the cost of the aircraft 320. Similarly, one or more of apparatus embodiments, method embodiments, or a combination thereof, may be utilized while the aircraft 320 is in service 312, for example and without limitation, to maintenance and service 314.

Disclosed embodiments of the interactive, computer implemented data driven classification and troubleshooting system 10 (see FIG. 1) and method 200 (see FIG. 9) for improving accuracy 12 (see FIG. 1) and performance 14 (see FIG. 1) of the associative memory 28 (see FIG. 1) provide an efficient and low cost system and method providing useful insight to enable and guide analysts, users, or other system-support personnel, or one or more separate automated systems or programs, to easily and quickly identify individual area(s) 28c (see FIG. 1) within the associative memory 28 (see FIG. 1) of text based data sets, such as records 90 (see FIG. 1), requiring accuracy-related attention, in order to improve the accuracy 12 (see FIG. 1) of such text based data sets, and in turn, to improve the accuracy 12 (see FIG. 1) of the associative memory 28 (see FIG. 1). The computer implemented data driven classification and troubleshooting system 10 (see FIG. 1) and method 200 (see FIG. 9) include a rating and similarity based troubleshooting tool 52 (see FIG. 3) and process 52a (see FIG. 3) having the ability to address system accuracy 12a (see FIG. 1) overall by easily and quickly identifying individual areas 28c (see FIG. 3) in the associative memory 28 (see FIG. 3), demarcated by accuracy percentages (%) 92 (see FIG. 3), that require analyst, user, or one or more separate automated system intervention to address underlying problems 18 (see FIG. 1) relating to accuracy 12 (see FIG. 1). The rating and similarity based troubleshooting tool 52 (see FIG. 3) and process 52a (see FIG. 3) further identify one or more QRM range values 94 (see FIG. 3) to troubleshoot, and provide the ability through the utilization of the associative memory 28 (see FIG. 3) to recognize similar records 90d (see FIG. 3) to bulk edit collections of such similar records 90d (see FIG. 3).

In addition, disclosed embodiments of the computer implemented data driven classification and troubleshooting system 10 (see FIG. 1) and method 200 (see FIG. 9) provide a classification mismatch troubleshooting tool 54 (see FIG. 4) and process 54a (see FIG. 4) that provide an efficient and low cost system and method that does not simply report overall classification error rates, and that provide useful insight to enable and guide analysts, or other system-support personnel, to easily and quickly identify individual classifications 48c (see FIG. 4) within the associative memory 28 (see FIG. 4) requiring accuracy-related attention, in order to improve the accuracy 12 (see FIG. 1) of such individual classifications 48c (see FIG. 4), and in turn, to improve the accuracy 12 (see FIG. 1) of the associative memory 28 (see FIG. 4). The classification mismatch troubleshooting tool 54 (see FIG. 4) and process 54a (see FIG. 4) provide an analyst, user or one or more separate automated systems or programs with a solution to find and correct factors within the associative memory generated classification 48b (see FIG. 4) of the records 90 (see FIG. 4), and other similar records 90d (see FIG. 4) that drive the accuracy 12 (see FIG. 1) and performance 14 (see FIG. 1) of the associative memory 28 (see FIG. 4). Moreover, the classification mismatch troubleshooting tool 54 (see FIG. 4) and process 54a (see FIG. 4) identify how many system records 90 (see FIG. 4) fall into a classification comparison grouping 110 (see FIG. 4) or error grouping, and provide the analyst, user or one or more separate automated systems or programs with the ability to target very specific combinations of classification 48 (see FIG. 4) mismatches 110a (see FIG. 4) for improvement to the associative memory 28 (see FIG. 4) and to the computer implemented data driven classification and troubleshooting system 10 (see FIG. 1).

Moreover, disclosed embodiments of the computer implemented data driven classification and troubleshooting system 10 (see FIG. 1) and method 200 (see FIG. 9) provide a category based troubleshooting tool 56 (see FIGS. 5A-5B) and process 56a (see FIG. 5A) that preferably solves the challenge of knowing in the associative memory 28 (see FIG. 5A) where to look to fix problems 18 (see FIG. 1) that may contribute to an underperforming system where the associative memory 28 (see FIGS. 1, 5A) is used as its data source 16c (see FIG. 1). The category based troubleshooting tool 56 (see FIGS. 5A-5B) and process 56a (see FIG. 5A) provide a system-level view of the associative memory 28 (see FIG. 5A) to pinpoint root causes for poor matches or mismatches of data 16 (see FIG. 1), and that provide a means for data 16 (see FIG. 1) from the associative memory 28 (see FIG. 5A) to be queried by common computer programming languages, such as standard SQL (Structured Query Language) query(ies) 138 (see FIG. 5A).

In addition, the category based troubleshooting tool 56 (see FIGS. 5A-5B) and process 56a (see FIG. 5A) provide improved preparation of data sets 16i (see FIG. 1) of free text data 16h (see FIG. 1) to generate similar matches to subsequently feed downstream systems 139 (see FIG. 5A) with better information 88 (see FIG. 1). With the downstream systems 139 (see FIG. 5A), improved maintenance and other technical data and industry decisions may be made. Better decisions may result in reduced labor and support costs, avoidance of expensive repairs or related maintenance-support actions, which, in turn, enables avoidance of the corresponding costs associated with these types of actions.

Further, disclosed embodiments of the computer implemented data driven classification and troubleshooting system 10 (see FIG. 1) and method 200 (see FIG. 9) provide a domain vocabulary troubleshooting tool 58 (see FIG. 6) and process 58a (see FIG. 6) to enable viewing of the associative memories 32 (see FIG. 6) in each associative memory cluster 28b (see FIG. 6), to identify additional relevant source code texts 140d (see FIG. 6), to expand the domain vocabulary 46 (see FIG. 6), and to enable an enhanced clustering of associative memories 32 (see FIG. 6) based on the additional relevant source code texts 140d (see FIG. 6). The domain vocabulary troubleshooting tool 58 (see FIG. 6) and process 58a (see FIG. 6) preferably solve the problem 18 (see FIG. 1) of determining how effective the precursor data vocabulary identification work was to match domain vocabulary 46 (see FIG. 6) terms 140a (see FIG. 6) and phrases 140b (see FIG. 6) present in the associative memory 28 (see FIG. 6). Adequately capturing the domain vocabulary 46 (see FIG. 6) may greatly improve the ability of query inputs 15a (see FIG. 1) into the associative memory 28 (see FIG. 6) to find all respective groupings of similar records 90d (see FIG. 4) that exist across the entire data set 16i (see FIG. 6) of the associative memory 28 (see FIG. 6). The associative memory 28 (see FIG. 6) utilizes the domain vocabulary 46 (see FIG. 6) terms 140a (see FIG. 6) or phrases 140b (see FIG. 6) present in each applicable record 90 (see FIG. 6) to create better plurality of associations 33 (see FIG. 1) between records 90 (see FIG. 6), where the same or similar domain vocabulary 46 (see FIG. 6) terms 140a (see FIG. 6) or phrases 140b (see FIG. 6) also exist.

The domain vocabulary troubleshooting tool 58 (see FIG. 6) and process 58a (see FIG. 6) preferably provides for improved preparation of data sets 16i (see FIG. 6) of raw data 16d (see FIG. 6) or source code texts 140 (see FIG. 6) sets to generate similar matches to subsequently feed downstream systems 139 (see FIG. 5A) with better information 88 (see FIG. 1). With the downstream systems 139 (see FIG. 5A), improved maintenance and other technical data and industry decisions may be made. With better decisions come benefits, such as reduced labor and support costs, avoidance of expensive repairs or related maintenance-support actions, which, in turn, enable avoidance of the corresponding costs associated with these types of actions.

Further, disclosed embodiments of the computer implemented data driven classification and troubleshooting system 10 (see FIG. 1) and method 200 (see FIG. 9) provide a knowledge sharing and disambiguation tool 59 (see FIGS. 7A-7B) and process 59a (see FIGS. 7A-7B) to disambiguate records 90 (see FIGS. 7A-7B), such as, where additional information 150a (see FIG. 7A) exists, to provide additional information 150a (see FIG. 7A) to a sparse source record 144a (see FIG. 7A) that enables the associative memory 28 (see FIG. 7A) to better identify similar records 90d (see FIG. 7A) within the associative memory 28 (see FIG. 7A), and to provide clarifying information 150b (see FIG. 7B) to match an older record 156a (see FIG. 7B) with a superseding record 156b (see FIG. 7B). The knowledge sharing and disambiguation tool 59 (see FIGS. 7A-7B) and process 59a (see FIGS. 7A-7B) enable the analyst or user or automated system to identify information 88 (see FIG. 1) that is relevant to the way in which a record 90 (see FIGS. 7A-7B) or groups of similar records 90d (see FIGS. 7A-7B) in the associative memory 28 (see FIGS. 7A-7B) were scored or classified. This enables relevant records 90 (see FIG. 7A) to be scored in a consistent manner in order to ensure that downstream systems 139 (see FIG. 5A) using the scored data correspondingly have consistent information to utilize in downstream processes associated with the downstream systems 139 (see FIG. 5A).

In addition, disclosed embodiments of the computer implemented data driven classification and troubleshooting system 10 (see FIG. 1) and method 200 (see FIG. 9) provide a quality rating metric (QRM) 38 (see FIG. 8) and a quality rating metric (QRM) computation 31a (see FIG. 8) that make a predictive model 34a (see FIG. 8) more efficient at cost savings and cost avoidance because it assures the correctness 178 (see FIG. 8) and quality 180 (see FIG. 8) of the information 88 (see FIG. 1), which may then be used to confidently make technical data decisions 182 (see FIG. 8) or industry decisions that may make or save money. The predicted information 176 (see FIG. 8) is only as effective as its quality and correctness. Moreover, the associative memory 28 (see FIG. 8) uses a nearest neighbor algorithm 160 (see FIG. 8) that calculates the quality rating metric (QRM) 38 (see FIG. 8) based on the absolute similarity 164 (see FIG. 8) between an object to be classified 166a (see FIG. 8) and its nearest neighbors 168a (see FIG. 8), and/or between an object to be categorized 166b (see FIG. 8) and its nearest neighbors 168b (see FIG. 8).

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation. Any claimed embodiment of the disclosure does not necessarily include all of the embodiments of the disclosure.

What is claimed is:

1. A computer implemented data driven classification and troubleshooting system comprising:
   a computer system comprising a computer having a processor device, an operating system, and storage devices comprising a computer memory and a persistent storage;
   an interface application coupled to the computer system and executed by the processor device of the computer to receive data;
   an associative memory software coupled to the computer system and executed by the processor device of the computer, the associative memory software in communication with the interface application, via an application programming interface (API), the associative memory software comprising a machine learning algorithm and comprising an associative memory enabled to store a plurality of associative memories and to identify a plurality of associations in or across received data;
   one or more individual areas, within the associative memory, requiring one or more troubleshooting actions to improve accuracy of the one or more individual areas, the one or more individual areas comprising at least a plurality of associative memory clusters and a domain vocabulary;
   at least one troubleshooting tool executed by the processor device of the computer and stored by the computer in the storage devices, the at least one troubleshooting tool in communication with the associative memory, via the application programming interface (API), the interface application enabling the at least one troubleshooting tool, and the at least one troubleshooting tool enabling or performing the one or more troubleshooting actions, the at least one troubleshooting tool comprising a domain vocabulary troubleshooting tool enabling viewing of associative memories in each associative memory cluster, reporting referenced source records in a records breakdown, identifying additional relevant source code texts, expanding the domain vocabulary, and enabling an enhanced clustering of associative memories based on the additional relevant source code texts; and
   a quality rating metric (QRM) that measures a strength and an assurance that one or more predictions of the associative memory are correct,
   wherein the at least one troubleshooting tool performing the one or more troubleshooting actions on the one or more individual areas results in improving the accuracy and the performance of the associative memory.

2. The system of claim 1 wherein the one or more individual areas comprise at least one of a plurality of effects associated with a cause; one or more QRM (quality rating metric) range values including QRM range values corresponding to records with a below-threshold accuracy percentage (%); individual classifications demarcated by high error counts; a plurality of categories and values that have been previously categorized; a plurality of associative memory clusters; a domain vocabulary; and a sparse source record.

3. The system of claim 2 wherein the one or more individual areas comprise the at least one of the plurality of effects associated with the cause and the one or more QRM (quality rating metric) range values including QRM range values corresponding to records with the below-threshold accuracy percentage (%), and the at least one troubleshooting tool comprises a rating and similarity based troubleshooting tool reporting the one or more individual areas as a records report having a records breakdown by the one or more QRM (quality rating metric) range values each having a corresponding accuracy percentage (%) and a corresponding record count, identifying the one or more QRM (quality rating metric) range values including QRM range values corresponding to the below-threshold accuracy percentage (%), identifying one or more QRM (quality rating metric) range values to troubleshoot, and providing through use of the associative memory an ability to recognize similar records to bulk edit collections of the similar records.

4. The system of claim 3 wherein the rating and similarity based troubleshooting tool enables the computer implemented data driven classification and troubleshooting system to perform the one or more troubleshooting actions comprising changing mismatched values to matched values in the records and updating the associative memory with updated results of the records that are changed.

5. The system of claim 2 wherein the one or more individual areas comprise individual classifications demarcated by high error counts, and the at least one troubleshooting tool comprises a classification mismatch troubleshooting tool reporting the one or more individual areas as a records report having a records breakdown demarcated by high error counts in the individual classifications, comparing an entered classification to the associative memory generated classification, by values and quantity of corresponding record counts, identifying how many system records fall into a classification comparison grouping, and providing an ability to target combinations of mismatches between the entered classification and the associative memory generated classification.

6. The system of claim 5 wherein the classification mismatch troubleshooting tool enables the computer implemented data driven classification and troubleshooting system to perform the one or more troubleshooting actions comprising: (a) correcting the records where there is a mismatch between the entered classification and the associative memory generated classification, and the entered classification is incorrect; (b) using an independent correction method for correcting the associative memory, where there is a mismatch between the entered classification and the associative memory generated classification, and the associative memory generated classification is incorrect; or (c) correcting the records where there is a mismatch between the entered classification and the associative memory generated classification, and both the entered classification and the associative memory generated classification are incorrect.

7. The system of claim 2 wherein the one or more individual areas comprise the plurality of categories and values that have been previously categorized, and the at least one troubleshooting tool comprises a category based troubleshooting tool reporting the one or more individual areas as a notional data set, generating one or more buckets of data from the notional data set, and making the one or more buckets of data available in a database queried by standard SQL (Structured Query Language) queries.

8. The system of claim 7 wherein the category based troubleshooting tool enables the computer implemented data driven classification and troubleshooting system to perform the one or more troubleshooting actions comprising using the standard SQL query(ies) to generate bucket label values that indicate problems in the associative memory, and to provide links to affected records for investigation, and establishing a tuning priority based on a total number of records in the one or more buckets of data.

9. The system of claim 1 wherein the domain vocabulary troubleshooting tool provides improved preparation of data sets of raw data, to generate similar matches, and to feed downstream systems with improved information.

10. The system of claim 1 wherein the domain vocabulary troubleshooting tool enables the computer implemented data driven classification and troubleshooting system to perform the one or more troubleshooting actions comprising identifying which referenced source records from the associative memory have at least one domain vocabulary match of a term or phrase from the domain vocabulary that occurred in the associative memory, and which referenced source records have a domain vocabulary no match of the term or phrase from the domain vocabulary that occurred in the associative memory.

11. The system of claim 2 wherein the one or more individual areas comprise the sparse source record, and the at least one troubleshooting tool comprises a knowledge sharing and disambiguation tool reporting a records report of highly-correlated results based on an enhanced source record comprising the sparse source record with original text enhanced with a notes text of additional information or clarifying information added to a dedicated notes field in a record.

12. The system of claim 11 wherein the knowledge sharing and disambiguation tool enables the computer implemented data driven classification and troubleshooting system to perform the one or more troubleshooting actions comprising disambiguating the record by providing the additional information to the sparse source record to enable the associative memory to better identify similar records within the associative memory, and providing clarifying information to match an older record with a superseding record.

13. The system of claim 1 wherein the quality rating metric (QRM) is equal to a neighbor proportion multiplied by an absolute similarity between an object to be classified and its nearest neighbors, and wherein the quality rating metric (QRM) is computed with a quality rating metric computation using a nearest neighbor algorithm to make a data driven classification categorization.

14. The system of claim 13 wherein the absolute similarity is computed using one or more similarity algorithms selected from a group comprising Jaccard Distance, Euclidean Distance, Hamming Distance, and Cosine Similarity.

15. The system of claim 1, wherein the at least one troubleshooting tool comprises a rating and similarity based troubleshooting tool reporting the one or more individual areas as a records report having a records breakdown by one or more QRM (quality rating metric) range values each having a corresponding accuracy percentage (%) and a corresponding record count, identifying the one or more QRM (quality rating metric) range values including QRM range values corresponding to a below-threshold accuracy percentage (%), and performing one or more troubleshooting actions comprising changing mismatched values to matched values and updating the associative memory with updated results of updated records that are changed, and the associative memory software generating an output of the updated records, including changes, to provide an improved accuracy of the updated records.

16. The system of claim 1 further comprising a model that is trained using the associative memory software, the model categorizing one or more fields of the data received.

17. A computer implemented data driven classification and troubleshooting system comprising:

a computer system comprising a computer having a processor device, an operating system, and storage devices comprising a computer memory and a persistent storage;

an interface application coupled to the computer system and executed by the processor device of the computer to receive data;

an associative memory software coupled to the computer system and executed by the processor device of the computer, the associative memory software in communication with the interface application via an application programming interface (API), the associative memory software comprising a machine learning algorithm and comprising an associative memory enabled to store a plurality of associative memories and to identify a plurality of associations in or across received data;

one or more individual areas, within the associative memory, requiring one or more troubleshooting actions to improve the accuracy of the one or more individual areas;

a quality rating metric (QRM) that measures a strength and an assurance that one or more predictions of the associative memory are correct, wherein the quality rating metric is equal to a neighbor proportion multiplied by an absolute similarity between an object to be classified and its nearest neighbors, and is computed with a quality rating metric computation using a nearest neighbor algorithm to make a data driven classification categorization; and a plurality of troubleshooting tools each enabled by the interface application and in communication with the associative memory, via the application programming interface (API), and each executed by the processor device of the computer and stored by the computer in the storage devices, the plurality of troubleshooting tools enabling or performing the one or more troubleshooting actions and comprising:

a rating and similarity based troubleshooting tool reporting the one or more individual areas as a records report having a records breakdown by one or more QRM (quality rating metric) range values each having a corresponding accuracy percentage (%) and a corresponding record count, identifying the one or more QRM (quality rating metric) range values including QRM range values corresponding to a below-threshold accuracy percentage (%), identifying one or more QRM (quality rating metric) range values to troubleshoot, and providing through use of the associative memory an ability to recognize similar records to bulk edit collections of the similar records;

a classification mismatch troubleshooting tool reporting the one or more individual areas as a records report having a records breakdown demarcated by high error counts in the individual classifications, comparing an entered classification to the associative memory generated classification, by values and quantity of corresponding record counts, identifying how many system records fall into a classification comparison grouping, and providing an ability to target combinations of mismatches between the entered classification and the associative memory generated classification;

a category based troubleshooting tool reporting the one or more individual areas as a notional data set, generating one or more buckets of data from the notional data set, and making the one or more buckets of data available in a database queried by standard SQL (Structured Query Language) queries;

a domain vocabulary troubleshooting tool enabling viewing of associative memories in an associative memory cluster, reporting referenced source records in a records breakdown, identifying additional relevant source code texts, expanding a domain vocabulary, and enabling an enhanced clustering of associative memories based on the additional relevant source code texts; and a knowledge sharing and disambiguation tool reporting a records report of highly-correlated results based on an enhanced source record comprising a sparse source record with original text enhanced with a notes text of additional information or clarifying information added to a dedicated notes field in a record.

18. A method for improving accuracy and performance of an associative memory, the method comprising the steps of:

providing a computer system comprising one or more computers, each of the one or more computers having a processing device, an operating system, and storage devices comprising a computer memory and a persistent storage;

providing a computer implemented data driven classification and troubleshooting system comprising an interface application in communication with an associative memory software, via an application programming interface (API), operating on the one or more computers enabling operation of the interface application and the associative memory software, the associative memory software comprising a machine learning algorithm and comprising an associative memory enabled to store a plurality of associative memories and to identify a plurality of associations in or across received data;

using at least one troubleshooting tool to identify one or more individual areas within the associative memory requiring one or more troubleshooting actions, to improve accuracy of the one or more individual areas, the interface application enabling the at least one troubleshooting tool, and the at least one troubleshooting tool in communication with the associative memory, via the application programming interface (API), and the at least one troubleshooting tool comprising a domain vocabulary troubleshooting tool enabling viewing of associative memories in a plurality of associative memory clusters, reporting referenced source records in a records breakdown, identifying additional relevant source code texts, expanding a domain vocabulary, and enabling an enhanced clustering of associative memories based on the additional relevant source code texts;

using the associative memory to derive information and generate results for the one or more individual areas, for use by the at least one troubleshooting tool;

using the at least one troubleshooting tool to perform the one or more troubleshooting actions on the one or more individual areas, or to enable the computer implemented data driven classification and troubleshooting system to perform the one or more troubleshooting actions on the one or more individual areas, in order to improve the accuracy and the performance of the associative memory; and using a nearest neighbor algorithm to calculate a quality rating metric that measures a strength and an assurance that one or more predictions of the associative memory are correct.

19. The method of claim 18 wherein the step of using the at least one troubleshooting tool to identify the one or more individual areas comprises using the at least one troubleshooting tool to identify the one or more individual areas comprising at least one of a plurality of effects associated with a cause; one or more QRM (quality rating metric) range values including QRM range values corresponding to records with a below-threshold accuracy percentage (%); individual classifications demarcated by high error counts; a plurality of categories and values that have been previously categorized; a plurality of associative memory clusters; a domain vocabulary; and a sparse source record.

20. The method of claim 19 wherein the step of using the at least one troubleshooting tool to identify one or more individual areas further comprises using a rating and similarity based troubleshooting tool to identify the plurality of effects associated with the cause and to identify the one or more QRM (quality rating metric) range values including QRM range values corresponding to records with the below-threshold accuracy percentage (%), the rating and similarity based troubleshooting tool reporting a records breakdown by the one or more QRM (quality rating metric) range values each having a corresponding accuracy percentage (%) and a corresponding record count, identifying the one or more QRM (quality rating metric) range values including QRM range values corresponding to the below-threshold accuracy percentage (%), identifying one or more QRM (quality rating metric) range values to troubleshoot, and providing through use of the associative memory an ability to recognize similar records to bulk edit collections of the similar records.

21. The method of claim 20 wherein the step of using the at least one troubleshooting tool to perform the one or more troubleshooting actions further comprises enabling the computer implemented data driven classification and troubleshooting system to perform the one or more troubleshooting actions comprising changing mismatched values to matched values in the records and updating the associative memory with updated results of the records that are changed.

22. The method of claim 18 wherein the step of using the at least one troubleshooting tool to identify one or more individual areas comprises using a classification mismatch troubleshooting tool to identify individual classifications demarcated by high error counts, the classification mismatch troubleshooting tool reporting a records breakdown demarcated by high error counts in the individual classifications, comparing an entered classification to the associative memory generated classification, by values and quantity of corresponding record counts, identifying how many system records fall into a classification comparison grouping, and providing an ability to target combinations of mismatches between the entered classification and the associative memory generated classification.

23. The method of claim 22 wherein the step of using the at least one troubleshooting tool to perform the one or more troubleshooting actions comprises enabling the computer implemented data driven classification and troubleshooting system to perform the one or more troubleshooting actions comprising: (a) correcting the records where there is a mismatch between the entered classification and the associative memory generated classification, and the entered classification is incorrect; (b) using an independent correction method for correcting the associative memory, where there is a mismatch between the entered classification and the associative memory generated classification, and the associative memory generated classification is incorrect; or (c) correcting the records where there is a mismatch between the entered classification and the associative memory generated classification, and both the entered classification and the associative memory generated classification are incorrect.

24. The method of claim 18 wherein the step of using the at least one troubleshooting tool to identify one or more individual areas comprises using a category based troubleshooting tool to report a plurality of categories and values that have been previously categorized, as a notional data set, to generate one or more buckets of data from the notional data set, and to make the one or more buckets of data available in a database configured to be queried by standard SQL (Structured Query Language) queries.

25. The method of claim 24 wherein the step of using the at least one troubleshooting tool to perform the one or more troubleshooting actions comprises enabling the computer implemented data driven classification and troubleshooting system to perform the one or more troubleshooting actions comprising using the standard SQL query(ies) to generate bucket label values that indicate problems in the associative memory, and to provide links to affected records for investigation, and establishing a tuning priority based on total number of records in the one or more buckets of data.

26. The method of claim 18 wherein the step of using the at least one troubleshooting tool to identify one or more individual areas comprises using the domain vocabulary troubleshooting tool to provide improved preparation of data sets of raw data, to generate similar matches, and to feed downstream systems with improved information.

27. The method of claim 26 wherein the step of using the at least one troubleshooting tool to perform the one or more troubleshooting actions comprises enabling the computer implemented data driven classification and troubleshooting system to perform the one or more troubleshooting actions comprising identifying which referenced source records from the associative memory have at least one domain vocabulary match of a term or phrase from the domain vocabulary that occurred in the associative memory, and which referenced source records have a domain vocabulary no match of the term or phrase from the domain vocabulary that occurred in the associative memory.

28. The method of claim 18 wherein the step of using the at least one troubleshooting tool to identify one or more individual areas comprises using a knowledge sharing and disambiguation tool to report a records report of highly-correlated results based on an enhanced source record comprising a sparse source record with original text enhanced with a notes text of additional information or clarifying information added to a dedicated notes field in a record.

29. The method of claim 28 wherein the step of using the at least one troubleshooting tool to perform the one or more troubleshooting actions comprises enabling the computer implemented data driven classification and troubleshooting system to perform the one or more troubleshooting actions comprising disambiguating the record by providing the additional information to the sparse source record to enable the associative memory to better identify similar records within the associative memory, and providing clarifying information to match an older record with a superseding record.

30. The method of claim 18 wherein the step of using the nearest neighbor algorithm to calculate the quality rating metric comprises making a data driven classification categorization of the associative memory, wherein the data driven classification categorization is further based on an absolute similarity between an object to be classified and its nearest neighbors.

31. The method of claim 30 wherein the step of using the nearest neighbor algorithm to calculate the quality rating metric (QRM) comprises computing the absolute similarity using one or more similarity algorithms selected from a group comprising Jaccard Distance, Euclidean Distance, Hamming Distance, and Cosine Similarity.

* * * * *